(12) United States Patent
Zhang et al.

(10) Patent No.: US 7,491,422 B2
(45) Date of Patent: Feb. 17, 2009

(54) DIRECT-WRITE NANOLITHOGRAPHY METHOD OF TRANSPORTING INK WITH AN ELASTOMERIC POLYMER COATED NANOSCOPIC TIP TO FORM A STRUCTURE HAVING INTERNAL HOLLOWS ON A SUBSTRATE

(75) Inventors: Hua Zhang, Evanston, IL (US); Robert Elghanian, Wilmette, IL (US); Linette Demers, Evanston, IL (US); Nabil Amro, Chicago, IL (US); Sandeep Disawal, Chicago, IL (US); Sylvain Cruchon-Dupeyrat, Chicago, IL (US)

(73) Assignee: Nanoink, Inc., Chicago, IL (US)

( * ) Notice: Subject to any disclaimer, the term of this patent is extended or adjusted under 35 U.S.C. 154(b) by 0 days.

(21) Appl. No.: 11/056,391

(22) Filed: Feb. 14, 2005

(65) Prior Publication Data

US 2005/0255237 A1 Nov. 17, 2005

Related U.S. Application Data

(63) Continuation-in-part of application No. 10/689,547, filed on Oct. 21, 2003, and a continuation-in-part of application No. 10/647,430, filed on Aug. 26, 2003, now Pat. No. 7,005,378.

(60) Provisional application No. 60/547,091, filed on Feb. 25, 2004, provisional application No. 60/544,260, filed on Feb. 13, 2004, provisional application No. 60/419,781, filed on Oct. 21, 2002.

(51) Int. Cl.
*B05D 5/00* (2006.01)
*B05D 1/28* (2006.01)
*B82B 1/00* (2006.01)
*G01N 33/00* (2006.01)
*G03F 1/00* (2006.01)

(52) U.S. Cl. .............. 427/256; 977/857; 977/863; 977/879; 250/307; 430/5

(58) Field of Classification Search ............... 427/256
See application file for complete search history.

(56) References Cited

U.S. PATENT DOCUMENTS 5,172,131 A * 12/1992 Crystal et al. ............... 347/217

(Continued)

OTHER PUBLICATIONS

Genolet, G., et al., "Soft, entirely photoplastic probes for scanning force microscopy", Rev. Sci. Instrum., vol. 70, No. 3, pp. 2398-2401 (1999).

(Continued)

*Primary Examiner*—Mark F. Huff
*Assistant Examiner*—John Ruggles
(74) *Attorney, Agent, or Firm*—Foley & Lardner LLP

(57) ABSTRACT

A novel method of transporting ink to a substrate with dip-pen nanolithographic (DPN) stamp tips coated with polymer (e.g., polydimethylsiloxane (PDMS), etc.). This kind of tip adsorbs chemicals ("inks") easily and is used to generate DPN nanopatterns that are imaged with the same tip after a DPN process. This method builds a bridge between microcontact printing (µCP) and DPN, making it possible for one to easily generate smaller structures of any molecules that have been patterned by the µCP technique. The easy tip-coating and writing process enriches the state-of-the-art DPN technique. The sub-100 nm DPN resolution obtained by using this kind of novel tip is comparable to that with a conventional $Si_3N_4$ probe tip. Importantly, the unique stamp tip was able to transfer solvent (e.g., liquid "ink") onto a substrate, resulting in fabrication of hollow nanostructures with only one DPN holding/writing step. Inks comprising metals and sol-gel materials are noted, as well as applications in photomask repair, enhancement, and fabrication.

23 Claims, 47 Drawing Sheets
(44 of 47 Drawing Sheet(s) Filed in Color)

U.S. PATENT DOCUMENTS

| | | | | |
|---|---|---|---|---|
| 5,268,396 | A | * | 12/1993 | Lai .............................. 522/28 |
| 5,411,795 | A | * | 5/1995 | Silverman ................... 442/231 |
| 6,229,609 | B1 | * | 5/2001 | Muramatsu et al. ......... 356/601 |
| 6,635,311 | B1 | * | 10/2003 | Mirkin et al. ............... 427/256 |
| 2004/0127025 | A1 | | 7/2004 | Crocker, Jr. et al. |
| 2004/0175631 | A1 | * | 9/2004 | Crocker et al. ................. 430/5 |
| 2005/0235869 | A1 | | 10/2005 | Cruchon-Dupeyrat et al. |

OTHER PUBLICATIONS

Pechmann, R., et al, "The Novolever: A new cantilever for scanning force microscopy microfabricated from polymeric materials", Rev. Sci. Instrum., vol. 65, No. 12, pp. 3702-3706 (1994).

* cited by examiner

DPN of MHA with a PDMS DPN Stamp Tip

10 μm

Writing Speed: 0.4, 0.6, 1.0, 1.5 μm/s

Diffusion Coefficient: 0.47 μm²/s

DIRECT-WRITE NANOLITHOGRAPHY
METHOD OF TRANSPORTING INK WITH AN
ELASTOMERIC POLYMER COATED
NANOSCOPIC TIP TO FORM A STRUCTURE
HAVING INTERNAL HOLLOWS ON A
SUBSTRATE

DESCRIPTION OF RELATED PATENT APPLICATIONS

This application claims priority to (i) provisional patent application Ser. No. 60/544,260 filed Feb. 13, 2004 ("Direct-Write Nanolithography with Stamp Tips: Fabrication and Applications"); (ii) provisional patent application Ser. No. 60/547,091 filed Feb. 25, 2004 ("Methods for Patterning Conductive Material"); (iii) as a continuation-in-part application to regular patent application Ser. No. 10/689,547 filed Oct. 21, 2003, published as 2004/0175631 on Sep. 9, 2004, ("Nanometer-scale Engineered Structures . . . "), which claims priority to provisional application Ser. No. 60/419,781 filed Oct. 21, 2002; and (iv) as a continuation-in part application to regular patent application Ser. No. 10/647,430 filed Aug. 26, 2003 now U.S. Pat. No. 7,005,378 issued Feb. 28, 2006 ("Process for Fabricating Conductive Patterns Using Nanolithography as a Patterning Tool"); wherein all of these priority applications are hereby incorporated by reference in their entirety and relied upon.

BACKGROUND

Small-scale fabrication, including microfabrication and nanofabrication, has many important applications ranging from biotechnology to molecular electronics. Direct-write lithographic methods are an important component for microfabrication and nanofabrication. In many instances, a small-scale tip can be used to transfer a substance from the tip to the substrate to form small-scale structures on the substrate including nanostructures. These tips can be connected to or integrated with larger probes or cantilevers which may be connected to or integrated with feedback and positioning mechanisms. Despite important advances in these methods, improved methods are needed. In particular, methods are needed which can be used to solve commercial problems. For example, methods are needed which are versatile and reproducible. More versatile and more robust tips are needed in view of the myriad of applications. Examples of important applications include photomask repair and flat panel display fabrication. Examples of important materials for transfer from the tip to the substrate including metallic materials (or metal-containing materials) and sol-gel type materials.

SUMMARY

The present invention provides a variety of different embodiments which are summarized in this non-limiting summary section. The different embodiments are described more fully in the following detailed description section and the drawings.

In one embodiment, the invention provides a method of direct-write nanolithography comprising: transporting an ink from a polymer-coated tip to a substrate to form a structure on the substrate.

In one embodiment, the invention provides a method of micro- or nano-fabrication comprising: printing an ink from a polymer-coated tip to a substrate to form a structure on the substrate, wherein the tip is scanned by a position system which provides scanning feedback.

In another embodiment, the invention provides a method of improving the direct-write nanolithographic printing of ink from a tip to a substrate comprising the step of modifying the tip with a polymeric agent.

In another embodiment, the invention provides a method of transferring material to a substrate to form a structure, comprising: providing a substrate; providing an elastomeric tip having a material to be transferred to the substrate coated thereon and having a reflective layer arranged on a back side of the tip; bringing the elastomeric tip into sufficient proximity to the substrate to transfer the material to the substrate from the tip to the substrate; and transferring material to the substrate to form the structure.

Also provided in another embodiment is a method for forming an elastomeric tip comprising: a. providing a scanning probe microscope tip; b. providing an elastomer precursor;

c. bringing the scanning probe microscope tip into contact with the elastomer precursor; d. withdrawing the scanning probe microscope tip from the composition elastomer precursor; e. optionally repeating the c and d; f. optionally curing the tip at elevated temperature; thereby forming an elastomeric tip.

Another embodiment is a printing method with use of a soft lithography stamp material as a tip comprising: printing an ink from a polymer-coated tip to a substrate to form a structure on the substrate.

Still another embodiment is a nanolithographic tip for ink delivery comprising a tip to be modified, wherein the tip to be modified is non-covalently modified with a polymeric agent which increases the loading of ink on the tip.

Another embodiment is a probe for nanolithography having a tip for transfer of material from the tip to a substrate comprising: a probe comprising a tip, wherein the probe is a non-polymeric probe and the tip has a polymeric tip surface. Also provided is: a pen array comprising a plurality of such probes according to this embodiment; a nanolithographic instrument comprising at least one such probe according to this embodiment; an atomic force microscope tip which comprises a surface coating of polymer, wherein if desired the polymer is a hydrophobic elastomer.

In one embodiment, the invention provides a method of direct-write nanolithography comprising transporting an ink from a polymer-coated tip (can be called "stamp tip" by analogy to soft lithography) to a substrate to form a structure on the substrate.

In one embodiment, the invention provides a polymer tip which can be used to deposit microstructures or nanostructures, wherein material on the tip such as an ink material or patterning compound is transferred to a substrate by moving the tip close enough to the substrate to effect transfer. In one embodiment, the polymer tip is substantially completely made of polymer. In another embodiment, a pre-existing non-polymer tip is coated or covered with the polymer. The polymer tip can function as a reservoir for the ink or patterning compound. The polymer tip can soak up and store the ink or patterning compound, and the ink or patterning compound can soak into the tip, penetrating below the surface of the polymer tip. The polymer tip can comprise surface materials which are used in soft lithography, such as microcontact printing. The polymer tip can be hollow or non-hollow. Synthetic polymers can be used which can have, for example, average molecular weights of about 500 to about 5,000,000 before crosslinking if crosslinking is carried out.

In one preferred embodiment, the invention provides an elastomer tip which can be used to deposit microstructures or nanostructures, wherein material on the tip such as an ink material or patterning compound is transferred to a substrate by moving the tip close enough to the substrate to effect transfer. In one embodiment, the elastomer tip is substantially completely made of elastomer. In another embodiment, a pre-existing non-elastomeric tip is coated or covered with the elastomer. The elastomer tip can function as a reservoir for the ink or patterning compound. The elastomer tip can soak up and store the ink or patterning compound, and the ink or patterning compound can soak into the tip, penetrating below the surface of the elastomer tip. The elastomer tip can comprise surface materials which are used in soft lithography such as microcontact printing. The tip can be hollow or non-hollow.

In one embodiment, the present invention provides a modified scanning probe microscope tip, wherein the tip is a non-elastomeric material but is modified to be covered or coated with an elastomeric material. The tip can be, for example, the type of tips which can be used for atomic force microscopy. The elastomeric material can be coated onto the tip as a precursor composition and cured to form the final elastomer. The elastomer material can reduce the ability of the tip to be used for image analysis but, preferably, the tip can still be used for image analysis albeit at lower resolution.

The present invention also provides for embodiments wherein the elastomer tip is the entire tip. In other words, in this embodiment, a preexisting tip is not coated or covered with the elastomer but all or essentially the entire tip is the elastomer material.

The invention also includes all articles and devices which can be used to hold the elastomeric tip and provide information feedback to the instrument controlling the tip, such as a scanning probe or a cantilever. The tip is preferably part of a hybrid structure wherein non-elastomeric parts are part of the structure. For example, non-elastomeric reflective materials can be used to provide information feedback and non-elastomeric materials can be used to construct a cantilever. The tip can be part of a larger pen structure which clips into a larger instrument for nanofabrication or printing. Multiple tips can be operated together in multi-pen printing and fabrication. The tips can be operated separately from each other and pattern different materials.

In another embodiment, the invention provides a method of patterning an ink with use of one or more of the elastomer tips. The ink can be disposed at the end of the tip or can flow through the tip to the tip end. The tip is moved in relation to the substrate surface. Either the tip can move and the substrate can stay stationary or the substrate can move and the tip can stay stationary. As the tip and substrate approach each other, the material can be transported from the tip to the substrate. The tip can be held stationary or can move, forming a linear or curvilinear pattern.

The invention also provides a method of transferring material to a substrate to form a structure, comprising: providing a substrate; providing an elastomeric tip having a material to be transferred to the substrate coated thereon and having a reflective layer arranged on a back side of the tip; bringing the elastomeric tip into sufficient proximity to the substrate to transfer molecules of the material to be transferred to the substrate from the tip to the substrate to form the structure.

The invention further comprises nanostructures and microstructures fabricated by the transporting of material from the elastomer tip to the substrate.

The transported materials can be materials which are transported by microcontact printing or direct-write nanolithography with tips such as, for example, Dip Pen Nanolithography™ (DPN™) printing from NanoInk, Inc.

One application embodiment comprises a method for additive mask repair in the semiconductor industry with fine control over lateral dimensions and height comprising: depositing material to a defective mask by direct write nanolithography from a tip for additive repair, wherein the tip comprises a polymeric agent modifying a tip surface. The mask can comprise a clear defect or an opaque defect. The tip can comprise a scanning microscope tip, including an atomic force microscope tip. The material can comprise a metal. The material can also comprise metal nanoparticles or metallic salt. The material can also comprise a sol-gel material. The material can be applied to a height of at least 30 nm. In a preferred embodiment, the tip can comprise an atomic force microscope tip, wherein the polymeric agent is an elastomer, and wherein the material is applied to a height of at least 30 nm.

Basic and novel features of the present invention include avoiding use of expensive, high vacuum instruments, avoiding use of complicated photolithographic processes to make a stamp, and avoiding complicated fabrication methods for forming synthetic polymer probes.

The following is a listing of additional embodiments recited by number:

1. A method of direct-write nanolithography comprising: transporting an ink from a p olymer-coated tip to a substrate to form a structure on the substrate.
2. The method according to 1, wherein the tip is a nanoscopic tip.
3. The method according to 1, wherein the tip is a scanning probe microscopic tip.
4. The method according to 1, wherein the tip is an atomic force microscope tip.
5. The method according to 1, wherein the tip is a hollow tip.
6. The method according to 1, wherein the tip is a non-hollow tip.
7. The method according to 1, wherein the polymer is a hydrophobic polymer.
8. The method according to 1, wherein the polymer is a hydrophilic polymer.
9. The method according to 1, wherein the polymer is a hydrophobic elastomeric polymer.
10. The method according to 1, wherein the polymer is a hydrophilic elastomeric polymer.
11. The method according to 1, wherein the polymer is a siloxane polymer.
12. The method according to 1, wherein the polymer is polymer having a glass transition temperature of about 25° C. or less.
13. The method according to 1, wherein the polymer is an amorphous polymer.
14. The method according to 1, wherein the polymer is a cross-linked polymer.
15. The method according to 1, wherein the ink chemisorbs to the substrate.
16. The method according to 1, wherein the ink comprises a metal.
17. The method according to 1, wherein the ink comprises a metal precursor.
18. The method according to 1, wherein the ink comprises a dendrimer.
19. The method according to 1, wherein the ink comprises a solvent.
20. The method according to 1, wherein the ink comprises a biomolecule.
21. The method according to 1, wherein the ink comprises a nucleic acid, or protein.
22. The method according to 1, wherein the structure is a line.

23. The method according to 1, wherein the structure is a dot.
24. The method according to 1, wherein the structure has a lateral width of about 1,000 nm or less.
25. The method according to 1, wherein the structure has a lateral width of about 500 nm or less.
26. The method according to 1, wherein the structure has a lateral width of about 250 nm or less.
27. The method according to 1, wherein the structure has a lateral width of about 100 nm or less.
28. The method according to 1, wherein the tip is a scanning probe microscopic tip and the polymer is a hydrophobic elastomer.
29. The method according to 1, wherein the tip is a scanning probe microscopic tip and the polymer is a hydrophobic elastomer, and the structure has a lateral width of about 250 nm or less.
30. The method according to 1, wherein the tip is an atomic force microscopic tip and the polymer is a hydrophobic elastomer, and the structure has a lateral width of about 100 nm or less.
31. A method of micro- or nano-fabrication by stamping comprising: stamping an ink from a polymer-coated tip to a substrate to form a structure on the substrate.
32. The method according to 31, wherein the tip is a nanoscopic tip.
33. The method according to 31, wherein the tip is a scanning probe microscopic tip.
34. The method according to 31, wherein the tip is an atomic force microscope tip.
35. The method according to 31, wherein the tip is a hollow tip.
36. The method according to 31, wherein the tip is a non-hollow tip.
37. The method according to 31, wherein the polymer is a hydrophobic polymer.
38. The method according to 31, wherein the polymer is a hydrophilic polymer.
39. The method according to 31, wherein the polymer is a hydrophobic elastomeric polymer.
40. The method according to 31, wherein the polymer is a hydrophilic elastomeric polymer.
41. The method according to 31, wherein the polymer is a siloxane polymer.
42. The method according to 31, wherein the polymer is polymer having a glass transition temperature of about 25° or less.
43. The method according to 31, wherein the polymer is an amorphous polymer.
44. The method according to 31, wherein the polymer is a cross-linked polymer.
45. The method according to 31, wherein the ink chemisorbs to the substrate.
46. The method according to 31, wherein the ink comprises a metal.
47. The method according to 31, wherein the ink comprises a metal precursor.
48. The method according to 31, wherein the ink comprises a dendrimer.
49. The method according to 31, wherein the ink comprises a solvent.
50. The method according to 31, wherein the ink comprises a biomolecule.
51. The method according to 31, wherein the ink comprises a nucleic acid, or protein.
52. The method according to 31, wherein the structure is a line.
53. The method according to 31, wherein the structure is a dot.
54. The method according to 31, wherein the structure has a lateral width of about 1,000 nm or less.
55. The method according to 31, wherein the structure has a lateral width of about 500 nm or less.
56. The method according to 31, wherein the structure has a lateral width of about 250 nm or less.
57. The method according to 31, wherein the structure has a lateral width of about 100 nm or less.
58. The method according to 31, wherein the tip is a scanning probe microscopic tip and the polymer is a hydrophobic elastomer.
59. The method according to 31, wherein the tip is a scanning probe microscopic tip and the polymer is a hydrophobic elastomer, and the structure has a lateral width of about 250 nm or less.
60. The method according to 31, wherein the tip is an atomic force microscopic tip and the polymer is a hydrophobic elastomer, and the structure has a lateral width of about 100 nm or less.
61. A method of micro- or nano-fabrication comprising: printing an ink from a polymer-coated tip to a substrate to form a structure on the substrate, wherein the tip is scanned by a position system which provides scanning feedback.
62. The method according to 61, wherein the tip is a nanoscopic tip.
63. The method according to 61, wherein the tip is a scanning probe microscopic tip.
64. The method according to 61, wherein the tip is an atomic force microscope tip.
65. The method according to 61, wherein the tip is a hollow tip.
66. The method according to 61, wherein the tip is a non-hollow tip.
67. The method according to 61, wherein the polymer is a hydrophobic polymer.
68. The method according to 61, wherein the polymer is a hydrophilic polymer.
69. The method according to 61, wherein the polymer is a hydrophobic elastomeric polymer.
70. The method according to 61, wherein the polymer is a hydrophilic elastomeric polymer.
71. The method according to 61, wherein the polymer is a siloxane polymer.
72. The method according to 61, wherein the polymer is polymer having a glass transition temperature of about 25° or less.
73. The method according to 61, wherein the polymer is an amorphous polymer.
74. The method according to 61, wherein the polymer is a cross-linked polymer.
75. The method according to 61, wherein the ink chemisorbs to the substrate.
76. The method according to 61, wherein the ink comprises a metal.
77. The method according to 61, wherein the ink comprises a metal precursor.
78. The method according to 61, wherein the ink comprises a dendrimer.
79. The method according to 61, wherein the ink comprises a solvent.
80. The method according to 61, wherein the ink comprises a biomolecule.
81. The method according to 61, wherein the ink comprises a nucleic acid, or protein.
82. The method according to 61, wherein the structure is a line.
83. The method according to 61, wherein the structure is a dot.

84. The method according to 61, wherein the structure has a lateral width of about 1,000 nm or less.
85. The method according to 61, wherein the structure has a lateral width of about 500 nm or less.
86. The method according to 61, wherein the structure has a lateral width of about 250 nm or less.
87. The method according to 61, wherein the structure has a lateral width of about 100 nm or less.
88. The method according to 61, wherein the tip is a scanning probe microscopic tip and the polymer is a hydrophobic elastomer.
89. The method according to 61, wherein the tip is a scanning probe microscopic tip and the polymer is a hydrophobic elastomer, and the structure has a lateral width of about 250 nm or less.
90. The method according to 61, wherein the tip is an atomic force microscopic tip and the polymer is a hydrophobic elastomer, and the structure has a lateral width of about 100 nm or less.
91. A method of improving the direct-write nanolithographic printing of ink from a tip to a substrate comprising the step of modifying the tip with a polymer coating.
92. The method of 91, wherein the polymer coating is an elastomeric coating.
93. The method of 91, wherein the tip is a scanning probe microscopic tip.
94. The method of 91, wherein the tip is an atomic force microscopic tip.
95. The method of 91, wherein the tip is part of a probe with a reflective backing.
96. The method of 91, wherein the tip is a non-hollow tip.
97. The method of 91, wherein the polymer coating is hydrophobic.
98. The method of 91, wherein the polymer coating is hydrophilic.
99. The method of 91, wherein the polymer coating has a Tg of about 25° C. or less.
100. The method of 91, wherein the tip is an atomic force microscope tip, wherein the tip is a non-hollow tip, and wherein the polymer coating is hydrophobic elastomer.
101. A method of transferring material to a substrate to form a structure, comprising:providing a substrate; providing an elastomeric tip having a material to be transferred to the substrate coated thereon and having a reflective layer arranged on a back side of the tip; bringing the elastomeric tip into sufficient proximity to the substrate to transfer molecules of the material to be transferred to the substrate from the tip to the substrate; transferring molecules to the substrate to form the structure.
102. The method according to 101, wherein the structure comprises a self-assembled monolayer.
103. The method according to 101, wherein the structure comprises a line or a hollow line
104. The method according to 101, wherein the structure comprises a plurality of lines and/or hollow lines.
105. The method according to 101, wherein the structure comprises a line having a width of about 100 nm or less.
106. The method according to 101, wherein the structure comprises a line having a width of about 55 nm.
107. The method according to 101, wherein the structure comprises a line having a width of about 140-330 nm.
108. The method according to 101, wherein the structure comprises a line having a width of about 200-300 nm.
109. The method according to 101, wherein the structure comprises a line having a width of about 480 nm.
110. The method according to 101, wherein the structure comprises a line having a width of about 670 mm.
111. The method according to 101, wherein the structure comprises a hollow line having a width of about 250 nm to about 1,000 nm.
112. The method according to 101, wherein the structure comprises a dot.
113. The method according to 101, wherein the structure comprises a hollow dot.
114. The method according to 101, wherein the structure comprises a dot having a diameter of about 100 nm of less.
115. The method according to 101, wherein the structure comprises a dot having a diameter of about 55 nm.
116. The method according to 101, wherein the structure comprises a dot having a diameter of about 330-760 nm.
117. The method according to 101, wherein the structure comprises a hollow dot having an inner diameter of about 100 m or less.
118. The method according to 101, wherein the structure comprises a hollow dot which comprises a circular outer line having a width of about 125±10 nm.
119. The method according to 101, wherein the structure comprises a hollow dot which comprises a circular outer line having a width of about 165 nm.
120. The method according to 101, wherein the structure comprises an array of dots and/or hollow dots.
121. The method according to 101, wherein the substrate comprises Au.
122. The method according to 101, wherein the substrate comprises Si.
123. The method according to 101, wherein the substrate comprises Si/SiOx.
124. The method according to 101, wherein the elastomeric tip is formed from an elastomer which comprises a hydrophobic elastomer.
125. The method according to 101, wherein the step (b) comprises forming an elastomeric tip by a process comprising: a. providing a scanning probe microscope tip; b. providing an elastomer precursor; c. bringing the scanning probe microscope tip into contact with the elastomer precursor; d. withdrawing the scanning probe microscope tip from the composition elastomer precursor;
 e. optionally repeating the c and d;
 f. optionally curing the tip at elevated temperature, thereby forming an elastomeric tip.
126. The method according to 125, wherein the step of providing a scanning probe microscope tip comprises providing an AFM tip.
127. The method according to 126, comprising providing an AFM tip comprising $Si_3N_4$, Si, diamond-like carbon, or doped diamond coated probes, wherein tips are sharpened, unsharpened, or fibbed. Soft and stiff tips with different spring constants can be used.
128. The method according to 125, wherein step (b) of 125 comprises providing polydimethylsiloxane.
129. The method according to 125, wherein step (c) of 125 comprises bringing the scanning probe microscope tip into contact with the composition of step (b) for about 1 to about 1,000 s
130. The method according to 125, wherein step (f) of 125 comprises curing the tip at about 60-70° C.
131. The method according to 130, wherein step (f) of 125 comprises curing for about 12 hours.
132. The method according to 125, further comprising, dipping the elastomeric tip into a material to be transferred to the substrate.
133. The method according to 132, wherein the material to be transferred to the substrate comprises an inorganic metal precursor.

134. The method according to 132, wherein the material to be transferred to the substrate comprises 16-mercaptohexadecanoic acid, 1-ocatdecanethiol, dendrimer G6-OH, cystamine, or tetrachloropalladate.
135. The method according to 133, wherein the material to be transferred to the substrate comprises a solvent.
136. The method according to 132, wherein the material to be transferred to the substrate comprises an organic solvent.
137. The method according to 132, wherein the material to be transferred to the substrate comprises water under acidic, neutral, or basic pH.
138. The method according to 135, wherein the material to be transferred to the substrate comprises a mixture of water and an organic solvent.
139. The method according to 101, further comprising, after bringing the elastomeric tip into proximity to the substrate, maintaining the tip in proximity to the substrate and moving the tip relative to the substrate to form a desired arrangement of molecules on the substrate.
140. The method according to 101, wherein step (b) comprises providing an array of elastomeric tips.
141. A printing method with use of a soft lithography stamp material as a tip comprising: printing an ink from a polymer-coated tip to a substrate to form a structure on the substrate.
142. The method according to 141, wherein the tip is a nanoscopic tip.
143. The method according to 141, wherein the tip is a scanning probe microscopic tip.
144. The method according to 141, wherein the tip is an atomic force microscope tip.
145. The method according to 141, wherein the tip is a hollow tip.
146. The method according to 141, wherein the tip is a non-hollow tip.
147. The method according to 141, wherein the polymer is a hydrophobic polymer.
148. The method according to 141, wherein the polymer is a hydrophilic polymer.
149. The method according to 141, wherein the polymer is a hydrophobic elastomeric polymer.
150. The method according to 141, wherein the polymer is a hydrophilic elastomeric polymer.
151. The method according to 141, wherein the polymer is a siloxane polymer.
152. The method according to 141, wherein the polymer is polymer having a glass transition temperature of about −50° C. or less.
153. The method according to 141, wherein the polymer is an amorphous polymer.
154. The method according to 141, wherein the polymer is a cross-linked polymer.
155. The method according to 141, wherein the ink chemisorbs or physisorbs to the substrate.
156. The method according to 141, wherein the ink comprises an organic compound having a molecular weight of 500 g/mol or less.
157. The method according to 141, wherein the ink comprises a metal.
158. The method according to 141, wherein the ink comprises a synthetic polymer.
159. The method according to 141, wherein the ink comprises a solvent.
160. The method according to 141, wherein the ink comprises a biomolecule.
161. The method according to 141, wherein the ink comprises one or more nucleic acid, DNA, peptide, or protein.
162. The method according to 141, wherein the structure is a line.
163. The method according to 141, wherein the structure is a dot.
164. The method according to 141, wherein the structure has a lateral width of about 1,000 nm or less.
165. The method according to 141, wherein the structure has a lateral width of about 500 nm or less.
166. The method according to 141, wherein the structure has a lateral width of about 250 nm or less.
167. The method according to 141, wherein the structure has a lateral width of about 100 nm or less.
168. The method according to 141, wherein the tip is a scanning probe microscopic tip and the polymer is a hydrophobic elastomer.
169. The method according to 141, wherein the tip is a scanning probe microscopic tip and the polymer is a hydrophobic elastomer, and the structure has a lateral width of about 250 nm or less.
170. The method according to 141, wherein the tip is an atomic force microscopic tip and the polymer is a hydrophobic elastomer, and the structure has a lateral width of about 100 nm or less.
171. A probe for nanolithography having a tip for transfer of material from the tip to a substrate comprising: a probe comprising a tip, wherein the probe is a non-polymeric probe and the tip has a polymeric tip surface.
172. The probe according to 171, wherein the tip comprises a non-polymeric tip and a surface coating of polymer.
173. The probe according to 171, wherein the tip is a polymeric tip.
174. The probe according to 171, wherein the probe comprises an element for providing feedback on the position of the tip.
175. The probe according to 174, wherein the element is a reflective backing.
176. A pen array comprising a plurality of probes according to 171.
177. A nanolithographic instrument comprising a probe according to 171.
178. An atomic force microscope tip which comprises a surface coating of polymer.
179. A method for forming a polymer tip comprising: a. providing a scanning probe microscope tip; b. providing a polymer or a precursor composition; c. bringing the scanning probe microscope tip into contact with the polymer or the precursor composition; d. withdrawing the scanning probe microscope tip from the polymer or precursor composition; e. optionally repeating steps c and d; f. optionally curing the precursor composition to form a polymer.
180. The method according to 179, wherein the step of providing a scanning probe microscope tip comprises providing an AFM tip.
181. Use of the method in 1 for repair.
182. Use of the method in 1 for photomask repair.
183. A nanostructure fabricated by the method of 1.
184. A printed substrate fabricated by the method of 1.

BRIEF SUMMARY OF THE FIGURES

The patent or application file contains at least one drawing executed in color. Copies of this patent application publication with color drawing(s) will be provided by the Office upon request and payment of the necessary fee.

DETAILED DESCRIPTION AND WORKING EXAMPLES

I. Introduction

Figure 1:
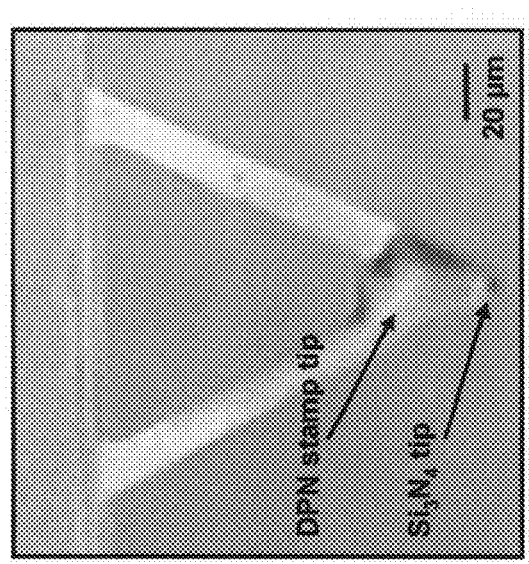
FIG. 1. A typical optical microscopy image of a DPN stamp tip. The image shows that polydimethylsiloxane (PDMS) was successfully coated on the cantilever of a commercial $Si_3N_4$ probe. The end part of the coated PDMS layer, is used as a tip to adsorb and deposit "inks" on a substrate and then to image the obtained DPN nanostructures.

The following patent applications are hereby incorporated by reference in their entirety including working examples, claims, figures, and detailed descriptions: provisional patent application serial application 60/544,260 filed Feb. 13, 2004 ("Direct-Write Nanolithography with Stamp Tips: Fabrication and Applications"); provisional patent application Ser. No. 60/547,091 filed Feb. 25, 2004 ("Methods for Patterning Conductive Material"); regular patent application Ser. No. 10/689,547 filed Oct. 21, 2003, published as 2004/0175631 on Sep. 9, 2004, (Nanometer-scale Engineered Structures . . . ), which claims priority to provisional application Ser. No. 60/419,781 filed Oct. 21, 2002; and regular patent application Ser. No. 10/647,430 filed Aug. 26, 2003, now U.S. Pat. 7,005,378, ("Process for Fabricating Conductive Patterns Using Nanolithography as a Patterning Tool").

A novel, simple and effective method was developed to fabricate, in a preferred embodiment, a PDMS-coated DPN stamp tip, which may be used to generate DPN micron-scale and nanopatterns, nanostructures, and nanoarrays of a wide variety of compositions, including, for example 16-mercaptohexadecanoic acid (MHA), 1-octadecanethiol (ODT), dendrimer, cystamine and metal "inks". Nanoparticle compositions of various types can be also used to form patterns. The advantages of using this kind of tip for DPN printing experiments include, for example, (1) Easy fabrication, low-cost and high output throughput (e.g., near 100% yield); (2) The PDMS coating readily absorbs many DPN inks, which provides for successful and reliable DPN experiments. The process of coating a DPN stamp tip with inks is easier and more effective, especially for relatively large molecules, compared to Si or $Si_3N_4$ tip-coating processes; (3) DPN stamp tips can be used to pattern the ink-substrate combinations that are currently done with micro-contact printing (μCP) technique. However, the resolution with DPN stamp tips, which can reach sub-100 nm, is finer than that with μCP patterns; (4) DPN with these kinds of tips combines the advantages of DPN and μCP; (5) DPN stamp tips also can pattern liquid (solvent-rich) ink, and make internal hollow nanostructures; (6) DPN stamp tips can also be used for AFM imaging after making DPN patterns. Additional important embodiments include (1) hydrophilic DPN stamp tips, which can be used to adsorb the water-soluble "inks" for patterning biomolecules (DNA, proteins, peptides, etc.); (2) a DPN stamp tip array, which could be used for generating DPN nanopatterns with large-area and high throughput.

II. Literature

One skilled in the art can refer to the technical literature cited in this patent application in the practice of the present invention in its many embodiments including the preferred embodiments. All references in this specification are incorporated by reference in their entirety and can be relied upon in general in practicing the invention. No admission is made that any of these references are prior art.

The present invention generally relates to nanolithography and, in one embodiment, etching, and more particularly, to systems capable of DIP PEN NANOLITHOGRAPHY™ printing (DPN™ printing) and deposition, coupled with etching. DIP PEN NANOLITHOGRAPHY™ and DPN™ are trademarks for NanoInk, Inc., Chicago, Ill. and are used accordingly herein. A variety of products related to DPN printing can be obtained from NanoInk including deposition instruments, computer software, including calibration and alignment software, substrates, cantilevers and cantilever arrays, kits, inks, inkwells, and the like. For example, NSCRIPTOR™ instrumentation can be used for patterning.

DPN printing and deposition methods are extensively described in the following patent applications and patent publications, which are hereby incorporated by reference in their entirety and support the disclosure for the present inventions, particularly with respect to the experimental parameters for carrying out the deposition:

1. U.S. Provisional Application 60/115,133 filed Jan. 7, 1999 ("Dip Pen Nanolithography") to Mirkin et al.
2. U.S. Provisional Application 60/157,633 filed Oct. 4, 1999 to Mirkin et al. ("Methods Utilizing Scanning Probe Microscope Tips and Products Therefor or Produced Thereby")
3. U.S. Regular patent application Ser. No. 09/477,997 filed Jan. 5, 2000 ("Methods Utilizing Scanning Probe Microscope Tips and Products Therefor or Produced Thereby") to Mirkin et al.
4. U.S. Provisional Application 60/207,713 filed May 26, 2000 ("Methods Utilizing Scanning Probe Microscope Tips and Products Therefor or Produced Thereby") to Mirkin et al.
5. U.S. Provisional Application 60/207,711 filed May 26, 2000 ("Methods Utilizing Scanning Probe Microscope Tips and Products Therefor or Produced Thereby") to Mirkin et al.
6. U.S. regular application Ser. No. 09/866,533 filed May 24, 2001 ("Methods Utilizing Scanning Probe Microscope Tips and Products Therefor or Produced Thereby") to Mirkin et al.
7. U.S. Patent Publication 2002/0063212 A1, published May 30, 2002 ("Methods Utilizing Scanning Probe Microscope Tips and Products Therefor or Produced Thereby") to Mirkin et al.
8. U.S. Patent Publication 2002/0122873 A1 published Sep. 5, 2002 ("Nanolithography Methods and Products Produced Therefor and Produced Thereby").
9. U.S. Regular patent application Ser. No. 10/307,515 filed Dec. 2, 2002 to Mirkin et al. ("Direct-Write Nanolithographic Deposition of Nucleic Acids from Nanoscopic Tips").
10. U.S. Regular patent application Ser. No. 10/320,721 filed Dec. 17, 2002 ("Patterning of Solid State Features by Direct-Write Nanolithographic Printing") to Mirkin et al.
11. U.S. Patent Publication 2003/0022470 A1, published Jan. 30, 2003 ("Parallel, Individually Addressable Probes for Nanolithography") to Liu et al.
12. U.S. Patent Publication 2003/0007242, published Jan. 9, 2003 to Schwartz ("Enhanced Scanning Probe Microscope and Nanolithographic Methods Using Same").
13. U.S. Patent Publication 2003/0005755 published Jan. 9, 2003 to Schwartz ("Enhanced Scanning Probe Microscope").
14. U.S. Regular patent application Ser. No. 10/366,717 to Eby et al., filed Feb. 14, 2003 ("Methods and Apparatus for Aligning Patterns on a Substrate").
15. U.S. Regular patent application Ser. No. 10/375,060 to Cruchon-Dupeyrat et al., filed Feb. 28, 2003 ("Nanolithographic Calibration Methods").
16. U.S. Patent Publication 2003/049381 A1 to Mirkin et al., published Mar. 13, 2003 ("Methods Utilizing Scanning Probe Microscope Tips and Products Therefor or Produced Thereby").
17. U.S. Patent Publication 2003/0068446 A1, published Apr. 10, 2003 to Mirkin et al. ("Protein and Peptide Nanoarrays")
18. U.S. Patent Publication 2003/157254 A1, published Aug. 21, 2003 to Mirkin et al. ("Methods Utilizing Scanning Probe Microscope Tips and Products Therefor or Produced Thereby").
19. U.S. Patent Publication 2003/162004 A1, published Aug. 28, 2003 to Mirkin, Dravid, Su, Liu ("Patterning of Solid State Features by Direct-Write Nanolithographic Printing").
20. U.S. Pat. No. 6,635,311 issued Oct. 21, 2003 to Mirkin et al. ("Methods Utilizing Scanning Probe Microscope Tips and Products Therefor or Produced Thereby").
21. U.S. Pat. No. 6,642,129 issued Nov. 14, 2003 to Liu et al. ("Parallel, Individually Addressable Probes for Nanolithography").
22. U.S. Pat. No. 6,674,074 issued Jan. 6, 2004 to Schwartz ("Enhanced Scanning Probe Microscope").
23. U.S. Patent Publication 2004/008330 A1 published Jan. 15, 2004 to Mirkin, Lim ("Electrostatically Driven Lithography").
24. U.S. Patent Publication 2004/028814 A1, published Feb. 12, 2004 to Mirkin et al. ("Methods Utilizing Scanning Probe Microscope Tips and Products Therefor or Produced Thereby").
25. U.S. Patent Publication 2004/037959 A1, published Feb. 26, 2004 to Mirkin et al. ("Methods Utilizing Scanning Probe Microscope Tips and Products Therefor or Produced Thereby").
26. U.S. Pat. No. 6,737,646 issued to Schwartz ("Enhanced Scanning Probe Microscope and Nanolithographic Methods Using Same").
27. U.S. Patent Publication 2004/119490 A1, published Jun. 24, 2004 to Liu et al. ("Parallel, Individually Addressable Probes for Nanolithography").
28. U.S. Patent Publication 2004/131843 A1, published Jul. 8, 2004 ("Nanolithography Methods and Products Produced Therefor and Produced Thereby").
29. U.S. Patent Publication 2004/142106 A1, published Jul. 22, 2004 to Mirkin et al. ("Patterning Magnetic Nanostructures").
30. U.S. Patent Publication 2004/175631 A1, published Sep. 9, 2004 ("Nanometer-scale engineered structures, methods and apparatus for fabrication thereof, and applications to mask repair, enhancement, and fabrications").

31. Australia Patent Publication AU 33440 A5, published Jul. 24, 2000 to Mirkin et al. ("Methods Utilizing Scanning Probe Microscope Tips and Products Therefor or Produced Thereby").
32. Australia Patent Publication AU 165003 A5, published Dec. 11, 2001 to Mirkin et al. ("Methods Utilizing Scanning Probe Microscope Tips and Products Therefor or Produced Thereby").
33. Australia Patent Publication AU 239740 A5, published Jun. 11, 2002 to Mirkin et al. "Nanolithography Methods and Products Therefor and Produced Thereby").
34. Canada Patent Publication CA 2358215 AA, published Jul. 13, 2000 to Mirkin et al. ("Methods Utilizing Scanning Probe Microscope Tips and Products Therefor or Produced Thereby").
35. Canada Patent Publication CA 2411198 AA, published Dec. 6, 2001 to Mirkin et al. ("Methods Utilizing Scanning Probe Microscope Tips and Products Therefor or Produced Thereby").
36. Canada Patent Publication CA 2454963 AA, published May 1, 2003 to Mirkin et al. ("Methods Utilizing Scanning Probe Microscope Tips and Products Therefor or Produced Thereby").
37. Canada Patent Publication CA 2462833 AA, published May 8, 2003 to Mirkin et al. ("Protein and Peptide Nanoarrays").
38. Canada Patent Publication CA 2468743 AA, published Jun. 12, 2003 to Mirkin et al. ("Direct Write Nanolithographic Deposition of Nucleic Acids from Nanoscopic Tips").
39. China Patent Publication CN 1341274 T, published Mar. 20, 2002 to Mirkin et al. ("Methods Utilizing Scanning Probe Microscope Tips and Products Therefor or Produced Thereby").
40. China Patent Publication CN 1444494 T, published Sep. 24, 2003 to Mirkin et al. ("Methods Utilizing Scanning Probe Microscope Tips and Products Therefor or Produced Thereby").
41. Europe Patent Publication EP 1157407 A1, published Nov. 28, 2001 to Mirkin et al. ("Methods Utilizing Scanning Probe Microscope Tips and Products Therefor or Produced Thereby").
42. Europe Patent Publication EP 1157407 A4, published Jan. 29, 2003 to Mirkin et al. ("Methods Utilizing Scanning Probe Microscope Tips and Products Therefor or Produced Thereby").
43. Europe Patent Publication EP 1292361 A1, published Mar. 19, 2003 to Mirkin et al. ("Methods Utilizing Scanning Probe Microscope Tips and Products Therefor or Produced Thereby").
44. Europe Patent Publication EP 1410436 A2, published Apr. 21, 2004 to Liu et al. ("Parallel, Individually Addressable Probes for Nanolithography").
45. Europe Patent Publication EP 1292361 A4, published Jul. 7, 2004 to Mirkin et al. ("Methods Utilizing Scanning Probe Microscope Tips and Products Therefor or Produced Thereby").
46. Taiwan Patent TW 473767 B, published Jan. 21, 2002 to Mirkin et al. ("Methods Utilizing Scanning Probe Microscope Tips and Products Therefor or Produced Thereby").
47. Taiwan Patent TW 563168 B, published Nov. 21, 2003 to Mirkin et al. ("Methods Utilizing Scanning Probe Microscope Tips and Products Therefor or Produced Thereby").
48. PCT Publication WO 00/41213 A1 published Jul. 13, 2000 based on PCT application no. PCT/US00/00319 filed Jan. 7, 2000 ("Methods Utilizing Scanning Probe Microscope Tips and Products Therefor or Produced Thereby").
49. PCT Publication WO 01/91855 A1 published Dec. 6, 2001 based on PCT application no. PCT/US01/17067 filed May 25, 2001 ("Methods Utilizing Scanning Probe Microscope Tips and Products Therefor or Produced Thereby").
50. PCT Publication WO 0041213 C2, published Oct. 4, 2001 to Mirkin et al. ("Methods Utilizing Scanning Probe Microscope Tips and Products Therefor or Produced Thereby").
51. PCT Publication WO 0245215 A2, published Jun. 6, 2002 to Mirkin et al. ("Nanolithography Methods and Products Therefor and Produced Thereby").
52. PCT Publication WO 0245215 A3, published Jun. 6, 2002 to Mirkin et al. ("Nanolithography Methods and Products Therefor and Produced Thereby").
53. PCT Publication WO 02071412 A1, published Sep. 12, 2002 to Schwartz ("Enhanced Scanning Probe Microscope").
54. PCT Publication WO 03001633 A2, published Jan. 3, 2003 to Mirkin et al. ("Nanolithography Methods and Products Therefor and Produced Thereby").
55. PCT Publication WO 03001633 A3, published Jan. 3, 2003 to Mirkin et al. ("Method and Device Utilizing Driving Force to Deliver Deposition Compound").
56. PCT Publication WO 03036767 A2, published May 1, 2003 to Liu et al. ("Parallel, Individually Addressable Probes for Nanolithography").
57. PCT Publication WO 03036767 A3, published May 1, 2003 to Liu et al. ("Parallel, Individually Addressable Probes for Nanolithography").
58. PCT Publication WO 03038033 A2, published May 8, 2003 to Mirkin et al. ("Protein and Peptide Nanoarrays").
59. PCT Publication WO 03038033 A3, published May 8, 2003 to Mirkin et al. ("Protein and Peptide Nanoarrays").
60. PCT Publication WO 03048314 A2, published Jun. 12, 2003 to Mirkin, Demers and Ginger ("Protein and Peptide Nanoarrays").
61. PCT Publication WO 03048314 A3, published Jun. 12, 2003 to Mirkin, Demers and Ginger ("Protein and Peptide Nanoarrays").
62. PCT Publication WO 03052514 A2, published Jun. 26, 2003 to Mirkin et al. ("Patterning of Solid State Features by Direct Write Nanolithographic Printing").
63. PCT Publication WO 03083876 A2, published Oct. 9, 2003 to Eby et al. ("Methods and Apparatus for Aligning Patterns on a Substrate").
64. PCT Publication WO 03083876 A3, published Oct. 9, 2003 to Eby et al. ("Methods and Apparatus for Aligning Patterns on a Substrate").
65. PCT Publication WO 04005582 A2, published Jan. 15, 2004 to Mirkin, Zhang and Salaita ("Electrochemical Miniaturization of Organic Micro-And Nanostructures").
66. PCT Publication WO 04005582 A3, published Jan. 15, 2004 to Mirkin, Zhang and Salaita ("Electrochemical Miniaturization of Organic Micro-And Nanostructures").
67. PCT Publication WO 04015772 A1, published Feb. 19, 2004 to Cruchon-Dupeyrat et al. ("Protosubstrates").
68. PCT Publication WO 04027791 A1, published Apr. 1, 2004 to Mirkin et al. ("Patterning Magnetic Nanostructures").
69. PCT Publication WO 04031072 A2, published Apr. 15, 2004 to Mirkin, Lim ("Electrostatically Driven Lithography").
70. PCT Publication WO 04031072 A3, published Apr. 15, 2004 to Mirkin, Lim ("Electrostatically Driven Lithography").

71. PCT Publication WO 04033480 A2, published Apr. 22, 2004 to Mirkin et al. ("Peptide and Protein Arrays and Direct-Write Lithographic Printing of Peptides and Proteins")
72. PCT Publication WO 04033480 A3, published Apr. 22, 2004 to Mirkin et al. ("Peptide and Protein Arrays and Direct-Write Lithographic Printing of Peptides and Proteins")
73. PCT Publication WO 04038504 A2, published May 6, 2004 to Crocker et al. ("Nanometer-Scale Engineered Structures, Methods and Apparatus for Fabrication Thereof, And Applications to Mask Repair, Enhancement, and Fabrication").
74. PCT Publication WO 04044552 A2, published May 27, 2004 to Cruchon-Dupeyrat et al., ("Methods and Apparatus for Ink Delivery to Nanolithographic Probe Systems").
75. PCT Publication WO 04044552 A3, published May 27, 2004 to Cruchon-Dupeyrat et al. ("Methods and Apparatus for Ink Delivery to Nanolithographic Probe Systems").
76. PCT Publication WO 03052514 C2, published Jun. 3, 2004 to Mirkin et al. ("Patterning of Solid State Features by Direct Write Nanolithographic Printing").

In addition, U.S. regular application Ser. No. 10/647,430 filed Aug. 26, 2003 to Crocker et al. ("Processes for fabricating conductive patterns using nanolithography as a patterning tool") describes a variety of polymer-modified tips and metal inks which can be patterned according to the present invention and is incorporated by reference in its entirety. Also, U.S. regular application published as 2004/0026681 ("Protosubstrates") to Cruchon-Dupeyrat et al. on Feb. 12, 2004 describes a variety of embodiments for printing micro and nano structures which can be tested on a macro scale, and is incorporated by reference in its entirety. Also, U.S. regular application published Jan. 15, 2004 to Mirkin et al. ("Electrostatically Driven Nanolithography") publication no. 2004/0008330 describes patterning of conductive polymers and is hereby incorporated by reference in its entirety. Also, U.S. regular application Ser. No. 10/442,189 filed May 21, 2003 to Mirkin et al. ("Peptide and Protein Nanoarrays and Direct-Write Nanolithographic Printing of Peptides and Proteins") is incorporated by reference in its entirety and describes a variety of peptides and proteins which can be patterned according to the present invention.

Parallel methods of the DPN printing process can be carried out as described in, for example, U.S. Pat. No. 6,642,129 to Liu et al. issued Nov. 4, 2003.

In addition, the following papers describes wet chemical etching procedures used in conjunction with direct-write nanolithography, and are hereby incorporated by reference in their entireties including figures, references, and working examples: Zhang et al., "Dip-Pen Nanolithography-Based Methodology for Preparing Arrays of Nanostructures Functionalized with Oligonucleotides"; *Adv. Mat.*, 2002, 14, 472-1474; Zhang et al., "Biofunctionalized Nanoarrays of Inorganic Structures Prepared by Dip-Pen Nanolithography"; *Nanotechnology*, 2003, 14, 1113-1117; Zhang et al., "Fabrication of Sub-50 nm Solid-State Nanostrcutures on the Basis of Dip-Pen Nanolithography"; Nano Lett., 2003, 3, 43-45. In addition, U.S. patent application "Fabrication of Solid-State Nanostructures including sub-50 nm Solid-State Nanostructures Based on Nanolithography and Wet Chemical Etching" (Ser. No. 10/725,939 filed Dec. 3, 2003 to Mirkin et al.) also describes etching and monolayer resists which can be used in the invention and is incorporated by reference in its entirety.

The text *Fundamentals of Microfabrication, The Science of Minitaturization*, $2^{nd}$ *Ed.*, Marc J. Madou, describes micro and nanotechnologies including additive and subtractive methods, for example, lithography (Chapter 1), pattern transfer with dry etching methods (Chapter 2), pattern transfer with additive methods (Chapter 3), and wet bulk micromachining (Chapter 4). Also, the text *Direct-Write Technologies for Rapid Prototyping Applications: Sensors, Electronics, and Integrated Power Sources* (Eds. A. Pique and D. B. Chrisey), describes micro and nanotechnologies including additive and subtractive methods. For example, bulk micromachining and etching are described on pages 617-619. DPN printing on the Sub-100 nanometer length scale is described in Chapter 10.

Self-assembled monolayers, etching, and microfabrication are further described in, for example, U.S. Pat. No. 5,618,760 to Soh et al; U.S. Pat. No. 5,620,850 to Bamdad et al.; and U.S. Pat. No. 5,512,131 to Kumar et al.

III. STAMP TIPS

Dip-pen nanolithographic printing (DPN printing)[1] in a preferred embodiment is a nanoscopic tip-based or atomic force microscopy (AFM)-based direct-write lithographic method for depositing "inks", such as small organic molecules,[2] polymers,[3] biomolecules,[4] sol-gel precursors, metal salts,[6] and nanoparticles,[7] onto a designed solid substrate with a "pen" (e.g., AFM tip). Although AFM tips are a preferred way of carrying out DPN printing, other types of tips can be used as well. Nanoscopic tips can be used which have a nanometer-scale apex radius. Moreover, the method can be used to prepare nanostructures with nanoscale width and separation distances (resolution), or microstructures with microscale width and separation distances (resolution). Compared to the other lithographic methods, for example e-beam,[8] nanoimprinting lithography (NIL),[9] microcontact printing (μCP)[10] and nanografting,[11] the direct-write DPN can generate soft-hard composites and multi-"ink" nanostructures from sub-100 nm to many micrometers with powerful "ink" alignment and nanoscale registration capabilities. Also, this method has been transitioned from a serial to parallel writing tool by using cantilever arrays comprising multiple pens.[12]

A variety of materials can be deposited by DPN printing by varying the tips, substrates and experimental conditions (humidity, temperature, etc.) for deposition. Two factors generally impacting a DPN experiment are: (i) the tip-coating process; and, (ii) "ink" diffusion from a coated tip onto a solid substrate, arising from the ink/tip and ink/substrate adsorption or interaction. Until now, a commercial $Si_3N_4$ probe tip was used in DPN experiments as a "pen" to deposit "inks" and thereby generate nanoscale patterns on a surface. In the case of making biomolecular nanopatterns, such as DNA[4b] and proteins,[4c,d] in order to increase the tip-coating efficiency, a silane-modified $Si_3N_4$ or thiol-modified Au-coated $Si_3N_4$ tip can be used. These methods serve to increase the adsorption of biomolecules via an increased ink-tip interaction.

Recently, as described in U.S. patent publication 2004/0228962 published Nov. 18, 2004 to Liu et al, a probe tip entirely made of polydimethylsiloxane (PDMS) was fabricated and used to create 1-octadecanethiol (ODT) nanopatterns and one skilled in the art can review this reference in practicing the present invention.[13] The patterned sizes of ODT dots, however, were only as small as 330 nm. There are, however, some shortcomings for the PDMS probe tip. Since the PDMS probe was completely made by polymeric materials,[13] there is no reflective Au layer coated on the back of the polymer cantilever, resulting in compromised AFM feedback control and reduced AFM imaging performance. The DPN resolution of a probe made entirely from PDMS cannot reach sub-100 nm due to a large radius of the specifically fabricated PDMS tip.

In a preferred embodiment of the present invention, a novel, effective, and simple method was developed to fabricate a PDMS-coated $Si_3N_4$ tip, called a DPN stamp tip, which kept the advantages and overcame the shortcomings of the PDMS probe mentioned above. Also developed was a method for forming structures on a substrate with the DPN stamp tip. Importantly, individual DPN pattern features generated with a DPN stamp tip are able to reach sub-100 nm, comparable with the results obtained with a bare $Si_3N_4$ tip.

According to a preferred embodiment, the DPN stamp tip may be formed from a polymeric material or agent which coats or modifies a tip. For example, the polymer can coat a preexisting silicon nitride tip. The polymeric material or agent does not need to covalently bond with the tip but can adhere to the tip via non-covalent interactions. Polymeric materials suitable for use in the fabrication of the DPN stamp tip may have linear or branched backbones, and may be crosslinked or non-crosslinked, depending upon the particular polymer and the degree of formability desired for the DPN stamp tip. Thermoplastic or thermosetting polymers can be used. In general, crosslinked elastomers are preferred. In general, the polymers can be porous and amorphous. A variety of elastomeric polymeric materials is suitable for such fabrication, especially polymers of the general classes of silicone polymers and epoxy polymers. Polymers have low glass transition temperatures such as, for example, below 25° C. or more preferably below −50° C., can be used. Epoxy polymers are characterized by the presence of a three-member cyclic ether group commonly referred to as an epoxy group, 1,2-epoxide, or oxirane. For example, diglycidyl ethers of bisphenol A may be used, in addition to compounds based on aromatic amine, triazine, and cycloaliphatic backbones. Another example includes the well-known Novolac polymers.

Examples of silicone elastomers suitable for use as the DPN stamp tip include those formed from precursors including the chlorosilanes such as methylchlorosilanes, ethylchlorosilanes, and phenylchlorosilanes, and the like. A particularly preferred silicone elastomer is polydimethylsiloxane (PDMS). Other materials include polyethylene, polystyrene and polybutadiene.

Further examples of suitable polymers that may be used to form a DPN stamp tip may be found in U.S. Pat. No. 5,776,748 and U.S. Pat. No. 6,500,549 each of which is hereby incorporated by reference in its entirety. In addition, suitable polymers that may be used to form hydrophilic DPN stamp tips may be found in U.S. Pat. No. 6,596,346, the entire disclosure of which is hereby incorporated by reference. Other suitable polymers include those disclosed by Q. He et al. in Langmuir 2003, 19, 6982-6986; C. Donzel et al. in Adv. Mater. 2001, 13, 1164-1167; and B. D. Martin et al. in Langmuir, 1998, 14-15, 3791-3795. The disclosures of these 3 articles are hereby incorporated by reference in their entirety. Hydrophobic polymers such as polydimethylsiloxane can be modified either chemically or physically by, for example, exposure to a solution of a strong oxidizer or to an oxygen plasma.

Hydrophobic tips are described in Jong Min Kim and Hiroshi Muramatsu, *Nanoletters*, "Two-Photon Photopolymerized Tips for Adhesion-free Scanning-Probe Microscopy". Also, a so-called SFINKS method, which combines elements of DPN printing and microcontact printing, is described by "Single-Feature Inking and Stamping: A Versatile Approach to Molecular Patterning," Alan Van Orden, Jonathon Gerding, and Dale Willard, *J. Am. Chem. Soc.*

The invention is further described with use of the following non-limiting working examples (including a preliminary experimental section), which include a description of the figures.

IV. WORKING EXAMPLES

Fabrication of Stamp Tips and Deposition Of Organic Molecules and Other Inks

Experimental Section

1) Chemicals. Ammonium hydroxide, hydrogen peroxide (30%), ethanol, methanol, and toluene were purchased from Fisher Scientific (Fairlawn, N.J.). 16-mercaptohexadecanoic acid (MHA), 1-octadecanethiol (ODT) and cystamine dihydrochloride were purchased from Aldrich chemical company (Milwaukee, Wis.). Starburst PAMAM dendrimer-G6.0 (surface: 100% OH, solvent: methanol, Concentration 11.46% w/w) (referred as G6-OH) was purchased from Dendritech Inc. (Midland, Mich. 48642). Silicone elastomer and silicone elastomer curing agent (Sylgard 184 silicone elastomer kit) were purchased from Dow coming corporation (Midland, Mich.). All chemicals were used without further purification.

2) Substrate preparation. An oxidized silicon wafer (~70 nm of oxide), purchased from Silicon Quest Int. (Santa Clara, Calif.), was cut into 1×1 cm² squares. After being ultrasonicated with acetone for 10 minutes and rinsed with Milli-Q water, the $Si/SiO_x$ substrates were immersed into a boiling solution of ammonium hydroxide and hydrogen peroxide ($V(NH_4OH):V(H_2O_2):V(H_2O)=1:1:5$) for 1 hour. The cleaned substrates were rinsed with Milli-Q deionized water and dried with $N_2$, and then immediately used as substrates for patterning dendrimer G6-OH. Au substrates were prepared by placing the cleaned $Si/SiO_x$ substrates into a thermal evaporator chamber and coating the substrates with a 1 nm Ti adhesion layer and subsequently with 10 nm Au under vacuum conditions (pressure<1×10⁻⁷ mbar).[2d,f,h]

Figure 15:
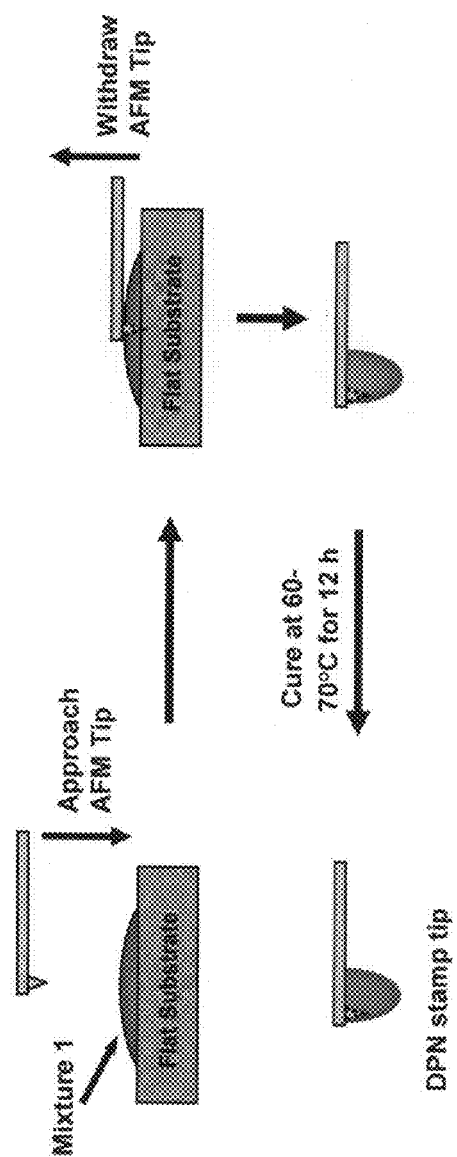
FIG. 15. Process for fabricating a DPN printing stamp tip.

3) Fabrication of DPN stamp tip. A piece of Si or $Si/SiO_x$ substrate (2×2 cm²) and a $Si_3N_4$ AFM probe (k=0.10 N/m, NanoInk, Inc., Chicago, Ill.; or k=0.05 N/m, TM Microscopes, Sunnyvale, Calif.) were cleaned as mentioned above. After completely mixing silicone elastomer and silicone elastomer curing agent (mixture 1) at a ratio of 5:1-15:1 (w/w) (normally 10:1 was used), a droplet of mixture 1 was put onto the cleaned Si or $Si/SiO_x$ substrate, which then was put onto the sample stage of a NSCRIPTOR™ (NanoInk, Inc., Chicago, Ill.) or an AutoProbe CP AFM (TM Microscopes, Sunnyvale, Calif.). A clean $Si_3N_4$ tip, which was mounted into the tip holder, was moved to touch the mixture 1, keep for about 10 s and then retracted. After repeating this procedure, the tip was removed and cured for 12 hours at 60-70° C. (FIG. 15). The obtained DPN stamp tip was then used for DPN experiments.

4) Nanopatterns using DPN stamp tips. Nanopatterns of MHA, ODT and cystamine on Au, and dendrimer G6-OH on Au and $SiO_x$, were generated with DPN stamp tip coated with the respective chemicals by being immersed in the respective solution (6.8 mM MHA, 10 mM ODT, 10 mM cystamine in ethanol, and G6-OH in methanol; W/W=5.73 mg/g) for about 15 s, then dried with compressed difluoroethane (Dust-off, Ted Pella, Inc., Redding, CA). The DPN experiments were carried out under ambient conditions (set point=0.1 nN, 22-24° C., 30-36% relative humidity), except in 60% relative humidity for writing G6-OH, by using a NSCRIPTOR™

(NanoInk Inc., Chicago, Ill.) or an AutoProbe CP AFM (TM Microscopes, Sunnyvale, Calif.), the latter combined with a commercial lithography software package (DPNWrite™, NanoInk Inc., Chicago, Ill.).

5) Wet Chemical Etching. The 10 nm thick Au substrates, patterned with MHA, were immersed in a ferri/ferrocyanide etching solution (a 1:1:1:1 (v:v:v:v) aqueous mixture of 0.1 M $Na_2S_2O_3$, 1.0 M KOH, 0.01 M $K_3Fe(CN)_6$ and 0.001 M $K_4Fe(CN)_6$) for ~20 min under constant stirring to remove the Au layer from the exposed regions of the Au substrate.[2d,f,h] After rinsing with Milli-Q $H_2O$, the etched substrates were immersed into a 0.5% (v/v) aqueous HF solution for 10-15 s to remove the 1 nm Ti layer. Then the substrates were rinsed with Milli-Q $H_2O$ and dried with $N_2$.

6) AFM Imaging. All AFM topographic and lateral force images (LFM) of DPN patterns were obtained with the same coated DPN stamp tip (except when specifically annotated). The etched patterns were imaged with a $Si_3N_4$ tip (k=0.10 N/m, NanoInk, Inc., Chicago, Ill.; or k=0.05 N/m, TM Microscopes, Sunnyvale, Calif.) in contact mode.

Working Example 1

Fabrication of Stamp Tips

Figure 2:
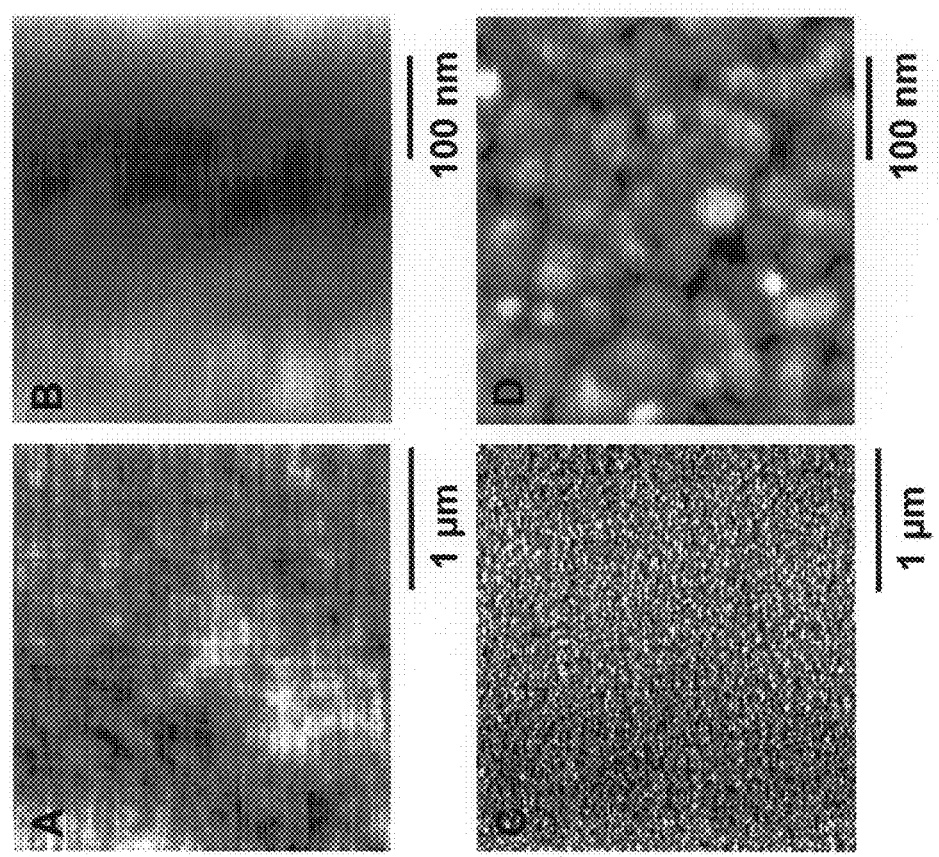
FIG. 2. The topographies of a gold (Au) substrate imaged with a DPN stamp tip (A, B) and a bare $Si_3N_4$ tip (C, D).

The process for fabricating a DPN stamp tip was shown in FIG. 15 by using AFM to control the movement of a $Si_3N_4$ tip to coat the mixture 1 (see the experimental section). The typical optical microscopy image of the fabricated polydimethylsiloxane (PDMS)-coated DPN stamp tip (FIG. 1) shows PDMS was successfully coated onto the $Si_3N_4$ probe. The fabricated DPN stamp tip was checked by imaging a Au substrate, FIGS. 2A and B, which are quite different compared to the images obtained with a bare $Si_3N_4$ tip (FIG. 2C, D). The bare $Si_3N_4$ tip is sharp and hard, while the PDMS-coated stamp tip is somewhat broader and softer, resulting in a larger contact area during the imaging process. The soft DPN stamp tip cannot resolve individual Au grains on the substrate (FIG. 2A, B), while Au grains were resolved with a bare $Si_3N_4$ tip (FIG. 2C, D). These results indicate that the effective tip of the PDMS-coated probe, used for AFM imaging and also for DPN process (shown in the following text), is the end part ("tip") of the coated PDMS layer and not the original $Si_3N_4$ tip.

Working Example 2

MHA Nanopatterns Generated with Stamp Tips

Figure 3B:
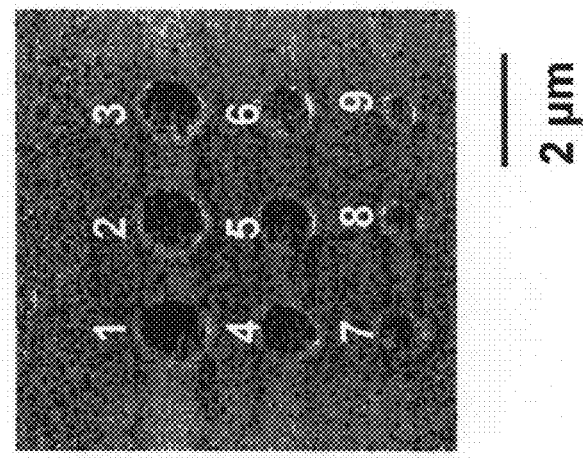
FIG. 3. Topography (A) and lateral force microscopy (LFM, B) images of patterned mercaptohexadecanoic acid (MHA) nanocircles on Au, imaged with the same MHA-coated DPN stamp tip. The tip-substrate contact times and the sizes of the internal holes are: 1) 5.0 s, 850 nm; 2) 4.5 s, 820 nm; 3) 4.0 s, 800 nm; 4) 3.5 s, 720 nm; 5) 3.0 s, 600 nm; 6) 2.5 s, 560 nm; 7) 2.0 s, 450 nm; 8) 1.5 s, 340 nm; 9) 1.0 s, 300 nm, respectively.
Figure 3A:
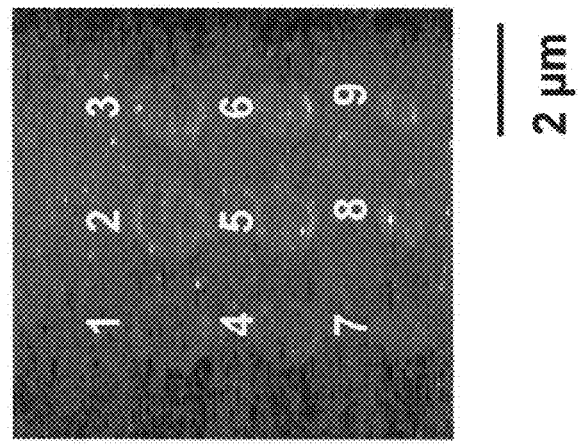

Nanopatterns of different shape and geometries can be fabricated using a DPN stamp tip. All kinds of interesting nanofeatures, including, for example, dots and lines with internal hollows, could be generated. FIG. 3 shows internal hollow dots, i.e., circular rings, generated on a gold substrate with a 16-mercaptohexadecanoic acid (MHA)-coated DPN stamp tip. The line width of the circles is 125±10 nm, which is not related to the tip-substrate contact time. The central holes of the hollow rings show a decrease in diameter from 850 to 300 nm with a decreasing tip-substrate contact time (from 5 to 1 s).

These hollow structures arise specifically from use of the DPN stamp tip. When the stamp tip is immersed into a MHA solution, the solvent (ethanol) that carries MHA is absorbed into the PDMS, coated on the $Si_3N_4$ probe. The absorbed solution, which consists of MHA and ethanol, does not immediately dry, due to the bulk absorption, as compared to the coated outer surface of the PDMS stamp tip. When the MHA-coated DPN stamp tip contacts a Au substrate, not only MHA, but also the ethanol solvent, is transferred onto the Au substrate. Dried MHA on the outer surface of the tip transfers directly onto the Au substrate to create the outer ring structure of the hollow, whereas, the diffusion of MHA and solvent (6.8 mM in ethanol) from inside of the "spongy" tip generates the inner hole, which remains filled with solvent. Since the tip-substrate contact time is very short (from 1-5 s), there is little amount of MHA in the central hollow (Note that the time required to form a closely packed self-assembled monolayer, SAM, on Au is usually up to several hours). The formation of hollow structures with DPN stamp tips is a generally applicable process which is not limited to the specific inks, substrates and/or DPN stamp tips described in this or the further examples below.

Figure 4:
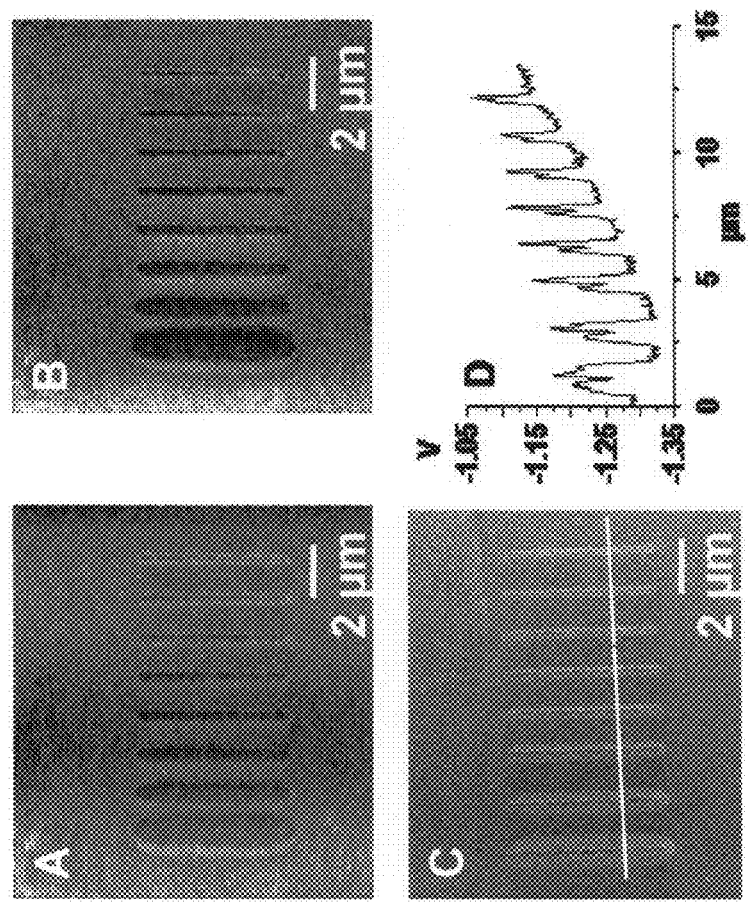
FIG. 4. Topography (A) and LFM (B) images of patterned MHA hollow lines on Au, imaged with the same MHA-coated DPN stamp tip. The writing speeds are 0.10, 0.15, 0.20, 0.25, 0.30, 0.35, 0.40 and 0.45 μm/s (from left to right), respectively. LFM image of the MHA hollow lines, passivated with ODT, imaged with a bare $Si_3N_4$ tip (C), and section analysis (D) of the white line in (C).

Hollow lines can also be generated with a DPN stamp tip (FIG. 4A, B). The hollow width decreases with increasing the writing speed, due to more solvent diffusion at the lower writing speed. After creating a DPN pattern with lines and accompanying hollows, the sample was immersed into 1 mM 1-octadecanethiol (ODT) ethanolic solution for 30 seconds (in order not to exchange the MHA nanostructures with ODT). The resulting LFM images of the patterns (FIG. 4C), using a bare $Si_3N_4$ tip, clearly show that MHA ink patterns have high friction, while the ODT-passivated hollows and Au substrate give lower friction contrast (FIG. 4D). This result provides evidence that the nanoscale hollows generated with the DPN stamp tip are quite different from the surrounding MHA patterns (consisting of MHA SAM). Herein, we should note that the differences of the measured hollow widths arise from a variation in tip-sample contact areas, i.e., due to difference of the effective tip radii (FIGS. 4B and C were imaged with a DPN stamp tip and a bare $Si_3N_4$ tip, respectively). Normally, in order to generate a hollow DPN nanostructure, multiple steps of DPN writing would be required.[14] For example, in order to form a hollow dot it might be necessary to first form a dot and subsequently etch a region in the center of the dot to remove material. In contrast, by using a DPN stamp tip, only one DPN holding-writing step is needed to create hollow nanostructures and no additional step, for example, etching, is required. This special stamp tip presents a novel method of creating hollow nanostructures, involving the direct transfer of solvent ("liquid" ink) materials. The hollows can be filled by another material (eg., ODT) via DPN or other methods (for example, immersing the substrate in ODT solution, mentioned above) to create two-component nanostructures.

Figure 5:
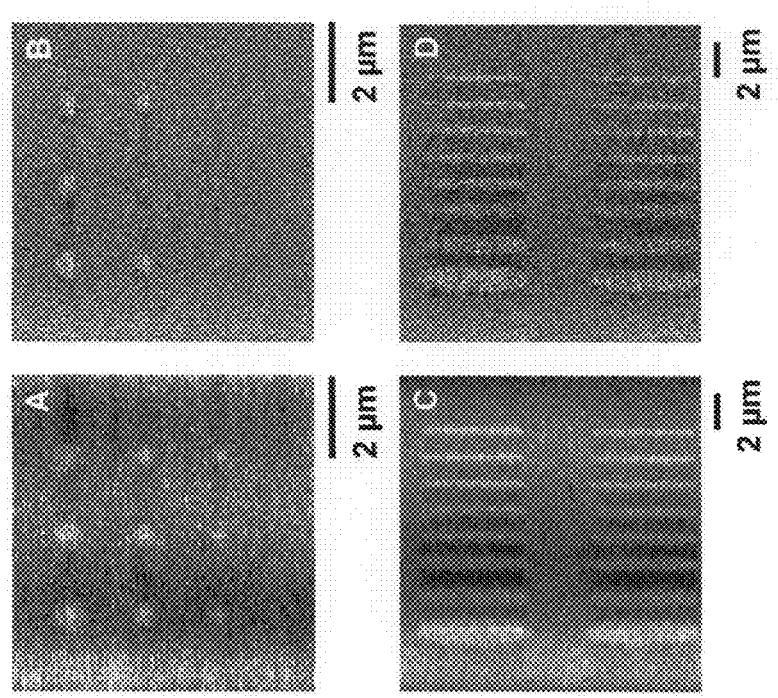
FIG. 5. Topographic (A, C) and LFM (B, D) images of MHA nanodots (A, B) and nanolines (C, D) on Au, imaged with the same MHA-coated DPN stamp tip. The tip-substrate contact times in (A, B) and the writing speeds in (C, D) are same as those in FIGS. 3 and 4, respectively.
Figure 6:
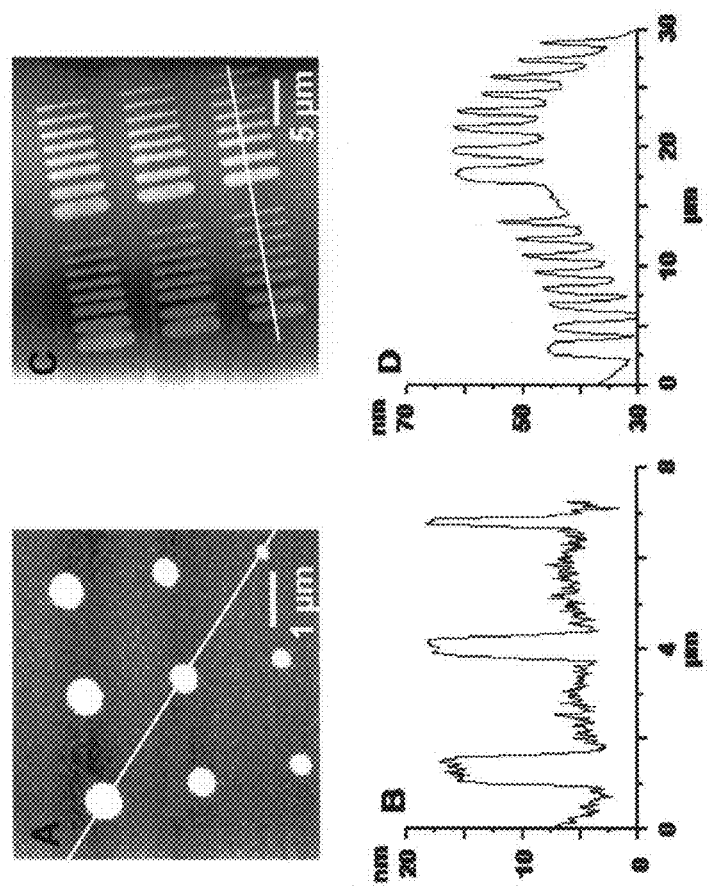
FIG. 6. Topographic images (A, C) of etched Au nanofeatures on a silicon substrate, obtained with a bare $Si_3N_4$ tip. (B, D) Height profiles of the cursor (white lines) in A and C, respectively.

After a MHA-coated DPN stamp tip has been used for 1-2 hours, the absorbed solvent within the coated PDMS layer will have evaporated (or let the MHA-coated DPN stamp tip completely dry in air), and thus, any further patterning with the same tip will yield "normal" structures that do not have internal hollows (FIG. 5). After immersing these non hollow-patterned Au substrates into a Au etchant and then a dilute HF solution (see experimental section),[2d,f,h] Au nanostructures were obtained (FIG. 6). The heights which were measured to be 14.1±1.1 nm for dots (FIG. 6B) and 12.5±2.0 nm for lines (FIG. 6D), indicates that patterning of MHA with a DPN stamp tip can be used as Au etch resists to subsequently create Au nanostructures, as consistent with the other DPN experiments.[2d,f,h]

Figure 7:
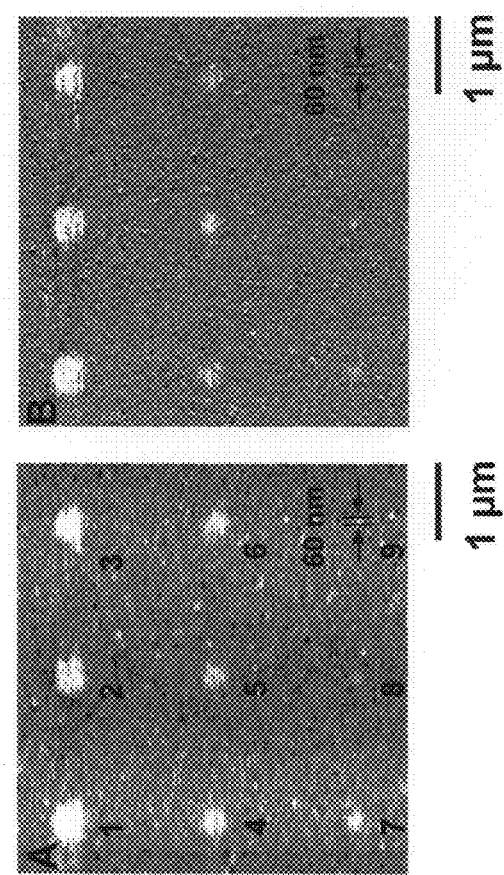
FIG. 7. Topography (A) and LFM (B) images of patterned MHA dots on Au, imaged with the same MHA-coated DPN stamp tip. The tip/substrate contact times and the sizes of the dots are: 1) 2.00 s, 470 nm; 2) 1.75 s, 430 nm; 3) 1.50 s, 400 nm; 4) 1.25 s, 340 nm; 5) 1.00 s, 300 nm; 6) 0.75 s, 240 nm; 7) 0.50 s, 215 nm; 8) 0.25 s, 105 nm; 9) 0.125 s, 60 mm, respectively.
Figure 8:
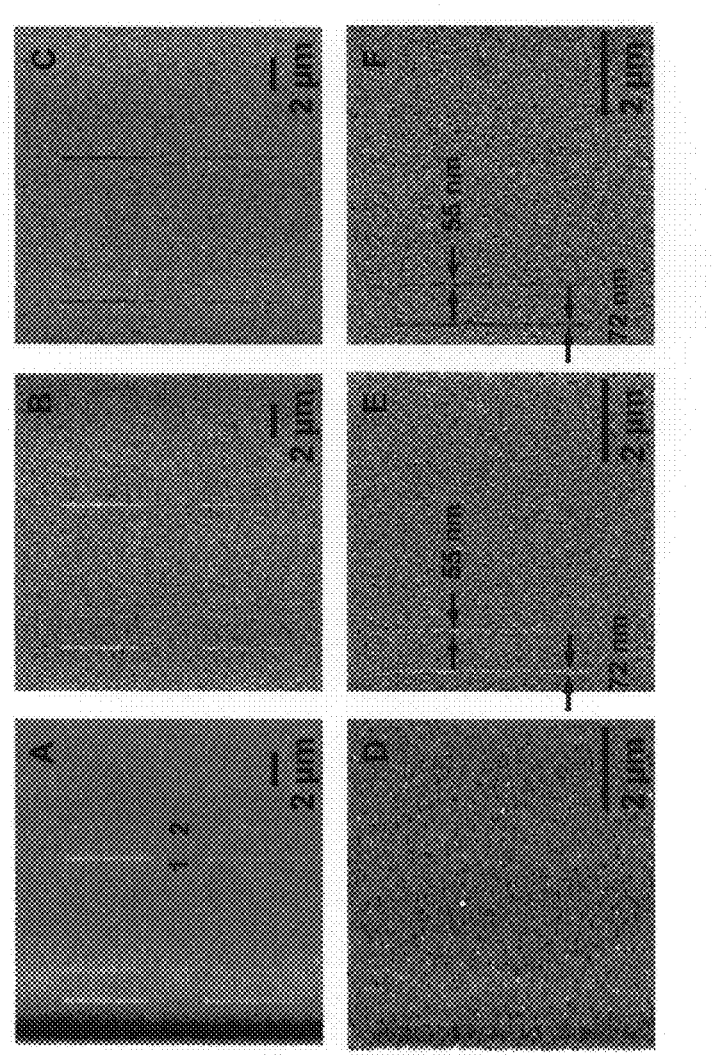
FIG. 8. Topography (A) and LFM (B, scan direction from left to right; C, scan direction from right to left) images of patterned MHA lines on Au, imaged with the same MHA-coated DPN stamp tip. (D, E, F) zoom-in images of (A, B, C). The writing speeds for lines 1 and 2 are 1.0 and 1.5 μm/s, respectively.

MHA nanostructures generated with a DPN stamp tip can reach sub-100 nm. Herein the smallest achieved diameter for MHA dots and the narrowest line width for MHA lines, patterned onto Au, are 60 nm (FIG. 7) and 55 nm (line 2 in FIG. 8), respectively. These sub-100 nm patterns are very comparable in sizes to those obtained with a $Si_3N_4$ tip.[1,2a,b]

Working Example 3

ODT and G6-Oh Nanostructures Prepared with Stamp Tips

Figure 9:
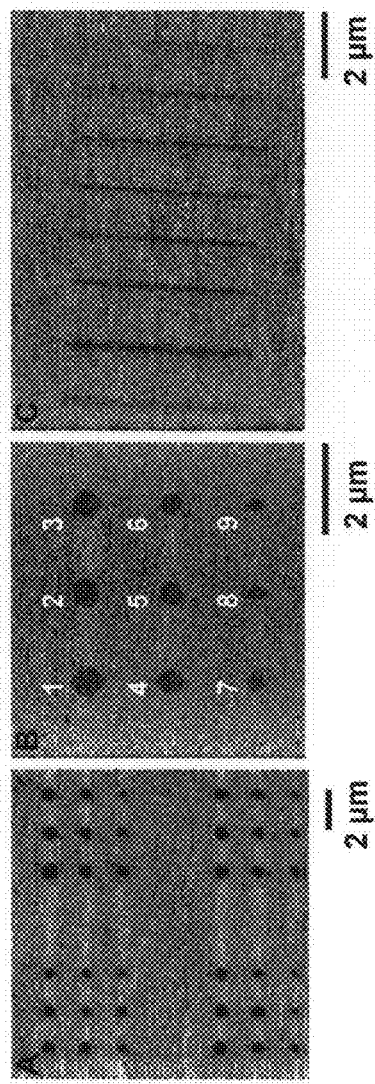
FIG. 9. LFM images of patterned octadecanethiol (ODT) dots (A, B: zoom-in image of A) and lines (C) on Au, imaged with the same ODT-coated DPN stamp tip. The tip-substrate contact times and the sizes of the dots in (B) are: 1) 5.0 s, 760 nm; 2) 4.5 s, 710 nm; 3) 4.0 s, 660 mm; 4) 3.5 s, 560 nm; 5) 3.0 s, 510 nm; 6) 2.5 s, 460 mm; 7) 2.0 s, 430 nm; 8) 1.5 s, 360 nm; 9) 1.0 s, 330 nm, respectively. The writing speeds of the lines in (C) are 0.10, 0.15, 0.20, 0.25, 0.30, 0.35, 0.40, 0.45 μm/s (from left to right), and the corresponding ODT line widths are 300, 260, 230, 190, 175, 160, 150, 140 nm, respectively.

Not only MHA, but also ODT, dendrimer G6-OH, cystamine and metal "inks"[15] were patterned. FIG. 9 shows the ODT nanopatterns fabricated on Au surface. The diameter and linewidth for the dots and lines are in range of 330-760 and 140-300 nm, respectively.

Figure 10:
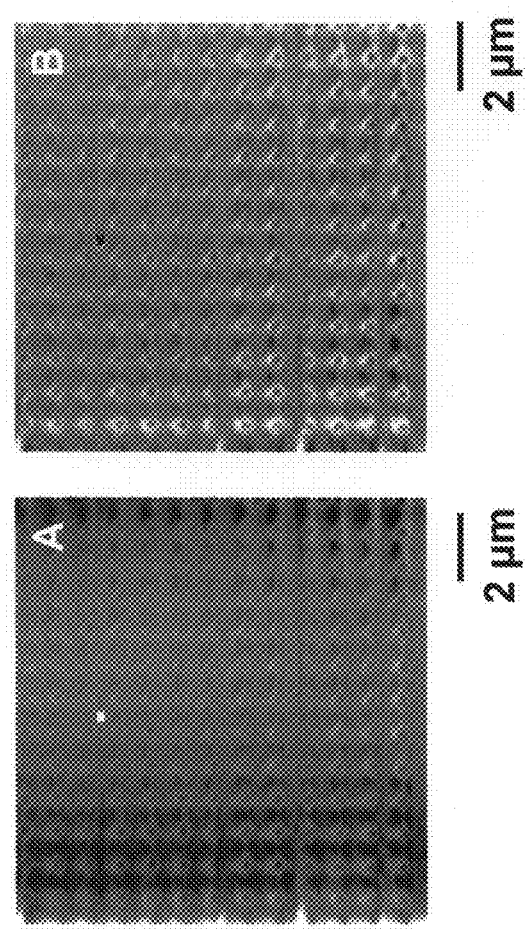
FIG. 10. Topography (A) and LFM (B) images of patterned "G6-OH" dendrimer nanocircle array on Si/SiO$_x$, imaged with the same dendrimer-coated DPN stamp tip. The tip-substrate contact time, height, width and the internal hollow size of the nanocircles are 10 s, 4.1±0.2, 165 and 300 nm, respectively.
Figure 11:
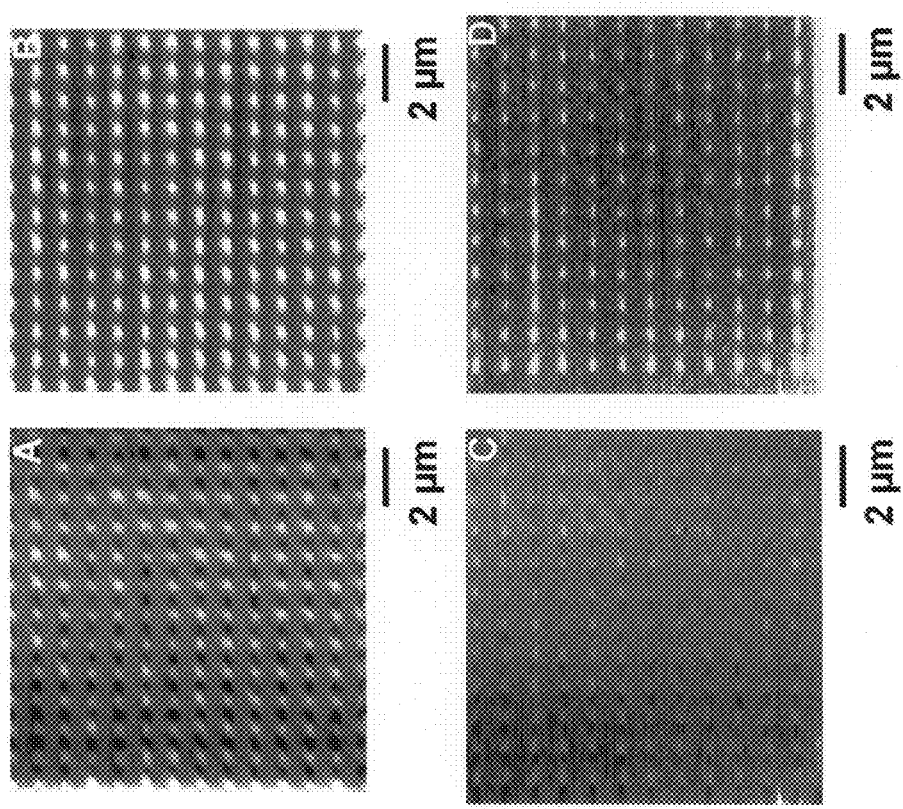
FIG. 11. Topography (A, C) and LFM (B, D) images of patterned dendrimer G6-OH dot arrays on Si/SiO$_x$, imaged with the same dendrimer-coated DPN stamp tip. The tip-substrate contact time, height, and size of the dots are 5 s, 3.7±0.2 nm, 470 nm (A) and 2 s, 1.0±0.2 nm, 430 nm (B), respectively.

By using a dendrimer G6-OH-coated DPN stamp tip, hollow dendrimer nanocircles can be generated on a $SiO_x$ surface (FIG. 10). The height of the dendrimer-derived nanocircles is 4.1±0.2 nm, and the width of circular outer lines is about 165 nm. The diameter of the internal hollows is ~300 nm. The dendrimer nanocircles arise from the diffusion of the solvent (in this case, methanol) that has absorbed into the "spongy" PDMS stamp tip. This ink and tip combination also resulted in the creation of hollow structures, as mentioned above. When the solvent dries after prolonged use of the stamp tip, dendrimer dot arrays can be fabricated without the hollow interior structures. By using a different tip-substrate contact time, nanostructures are formed with measurable and regular changes in their patterned heights, ranging from 3.7±0.2 nm (FIG. 11A) to 1.0±0.2 nm (FIG. 11C), but with only small changes in the dot size, from 470 nm (FIG. 11A) to 435 nm (FIG. 11C). This phenomenon arises from the hindrance of lateral diffusion of the large dendrimer molecules on the substrate.[4c,d,16] Note, the ideal-sphere diameter of dendrimer G6-OH is ~6.7 nm.[17] The measured height of the DPN dendrimer patterns is less than 6.7 nm due to the strong interaction between the dendrimer and the $Si/SiO_X$ substrate.[18] Apparently, DPN pattern features generated by shorter dwell time create more "squashed" molecular structures (i.e., the molecules are more flattened). When using a relatively longer tip-substrate contact time, the increased diffusion of dendrimer molecules from the tip onto the substrate causes an increase of the packing density of the dendrimers, which affects the layer thickness by decreasing the squashing effect on the molecules.

Figure 12:
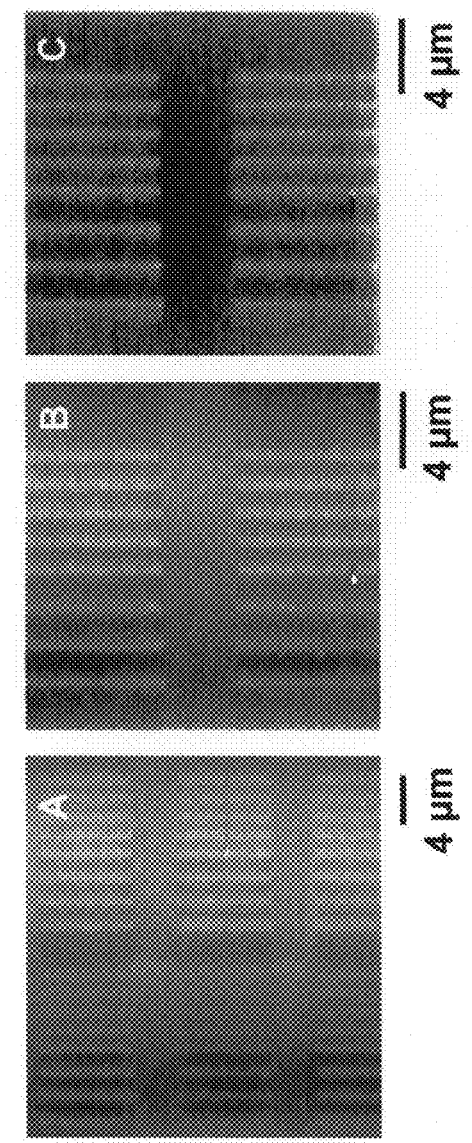
FIG. 12. Topography (A, B: zoom-in image of A) and LFM (C) images of patterned dendrimer G6-OH nanolines on Si/SiO$_x$, imaged with the same dendrimer-coated DPN stamp tip. The writing speeds, height and width of the patterned dendrimer lines in B (from left to right) are 0.10, 0.15, 0.20, 0.25, 0.30, 0.35, 0.40, 0.45 um/s; 6.9, 6.6, 6.0, 5.2, 4.8, 4.5, 4.0, 3.3 nm; and all of 670 nm, respectively.
Figure 13:
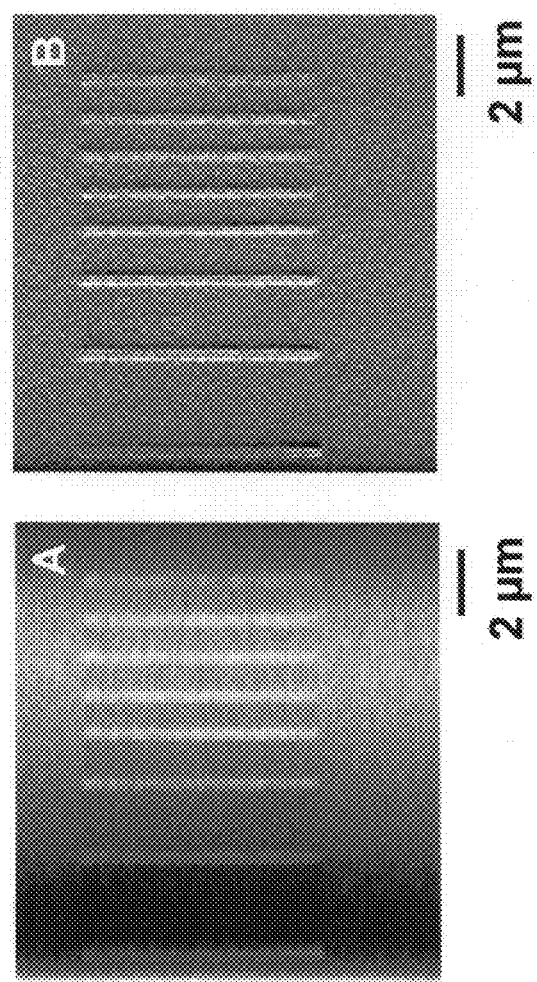
FIG. 13. Topography (A) and LFM (B) images of patterned "G6-OH" dendrimer nanolines on Au, imaged with the same dendrimer-coated DPN stamp tip. The writing speeds, height and width of the patterned dendrimer lines in A (from left to right) are 0.010, 0.025, 0.050, 0.075, 0.101, 0.125, 0.150, 0.200 um/s; 1.9, 1.6, 1.4, 1.3, 1.2, 1.1, 1.0, 0.8 nm; and all of 480 nm, respectively.

Dendrimer lines were also generated on $Si/SiO_x$ and Au surfaces. Variations in writing speed only resulted in different heights of the dendrimer lines, whereas, the line width remain constant (670 nm in FIG. 12, and 480 nm in FIG. 13). This provides more evidence of hindered diffusion of large molecules on the patterned substrate,[4c,d,16] and that a longer tip-substrate dwell time results in a thicker DPN patterns, as mentioned above. Comparing the results obtained on $Si/SiO_x$ and Au, although the writing speeds (from left to right in FIGS. 12B and 13A) on $Si/SiO_x$ are faster than those on Au, the diffusion rate of G6-OH on $Si/SiO_x$ is faster than that on Au, not only in the lateral direction, 670 nm on $Si/SiO_x$ and 480 nm on Au, but also in the vertical direction, 6.9-3.3 nm on $Si/SiO_x$ and 1.9-0.8 nm on Au. This difference arises from the different surface properties and a variation in ink-substrate binding interactions. Normally, it is difficult to coat a sharpened $Si_3N_4$ tip with big molecules and to transfer them onto a solid surface. We also attempted to pattern G6-OH by using a bare $Si_3N_4$ tip; however, the quality of the dendrimer patterns (data not shown) was not comparable with that of FIG. 12. One main advantage to using a DPN stamp tip is that the "spongy" PDMS tip can effectively absorb or adsorb these big molecules, much like has been done with the μCP technique[10] and then can be used generate uniform nanopatterns with macromolecular inks. However, the resolution that can be obtained with the DPN method is finer than that of μCP patterns.

Figure 14:
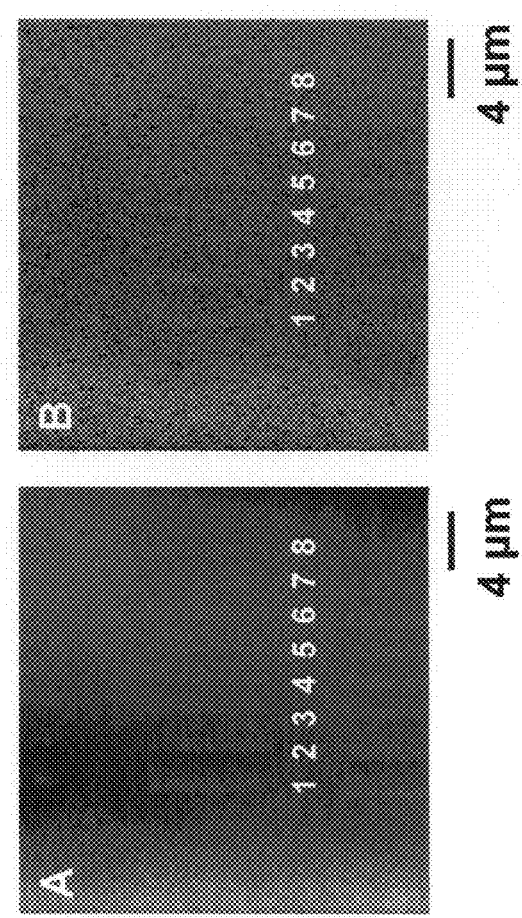
FIG. 14. Topography (A) and LFM (B) images of patterned cystamine nanolines on Au, imaged with the same cystamine-coated DPN stamp tip. The writing speeds and height of the patterned cystamine lines in A (from left to right, i.e., 1-8) are 0.10, 0.15, 0.20, 0.25, 0.30, 0.35, 0.40, 0.45 um/s and 0.41, 0.42, 0.47, 0.44, 0.38, 0.22, 0.17, 0.11 nm, respectively.

It can be difficult to pattern cystamine with a normal $Si_3N_4$ tip, due to the tip-coating process,[2h] but, conversely, nanoscale lines of cystamine were easily patterned on Au with a DPN stamp tip. The generated line widths and heights are in the range of 200-300 nm and 0.11-0.47 nm, respectively (FIG. 14). The topography and LFM images clearly show the cystamine nanopatterns. The measured heights, 0.11-0.22 nm, demonstrate that the thinner patterns of lines (lines 6-8 in FIG. 14) consist of a sub-monolayer or a monolayer of cystamine, whereas, the thicker lines, 0.38-0.41 nm (lines 1-5 in FIG. 14), comprise multiple layers of cystamine. The packing density of the cystamine patterned lines varies with the DPN writing speed.

ADDITIONAL WORKING EXAMPLES

Nanostructures of Metals

Working Example 4

Nanostructures of Palladium

Figure 16:
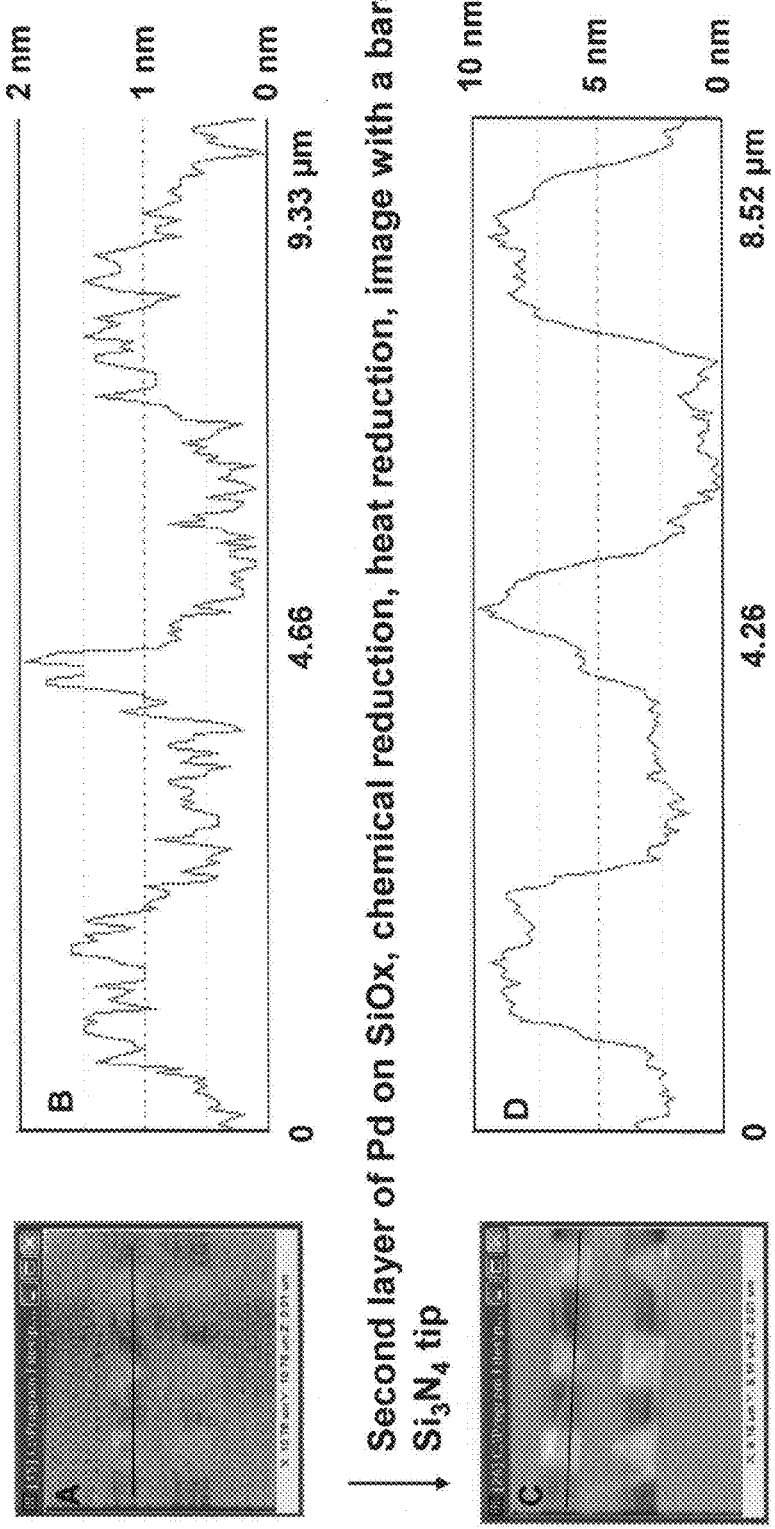
FIG. 16. AFM images and height profiles of a first and second layer of palladium metal (Pd) on SiO$_x$ as prepared with a DPN stamp tip. A first layer of a Pd-containing metal ink was formed on SiO$_x$ with a DPN stamp tip. The layer was cured to form a Pd layer on the substrate. A second layer of a Pd-containing layer was then formed and cured on the substrate. Although this figure provides data for Pd inks, other metal inks, including, for example, Pt, Au and Pt/Au alloys, can also be deposited.
Figure 17:
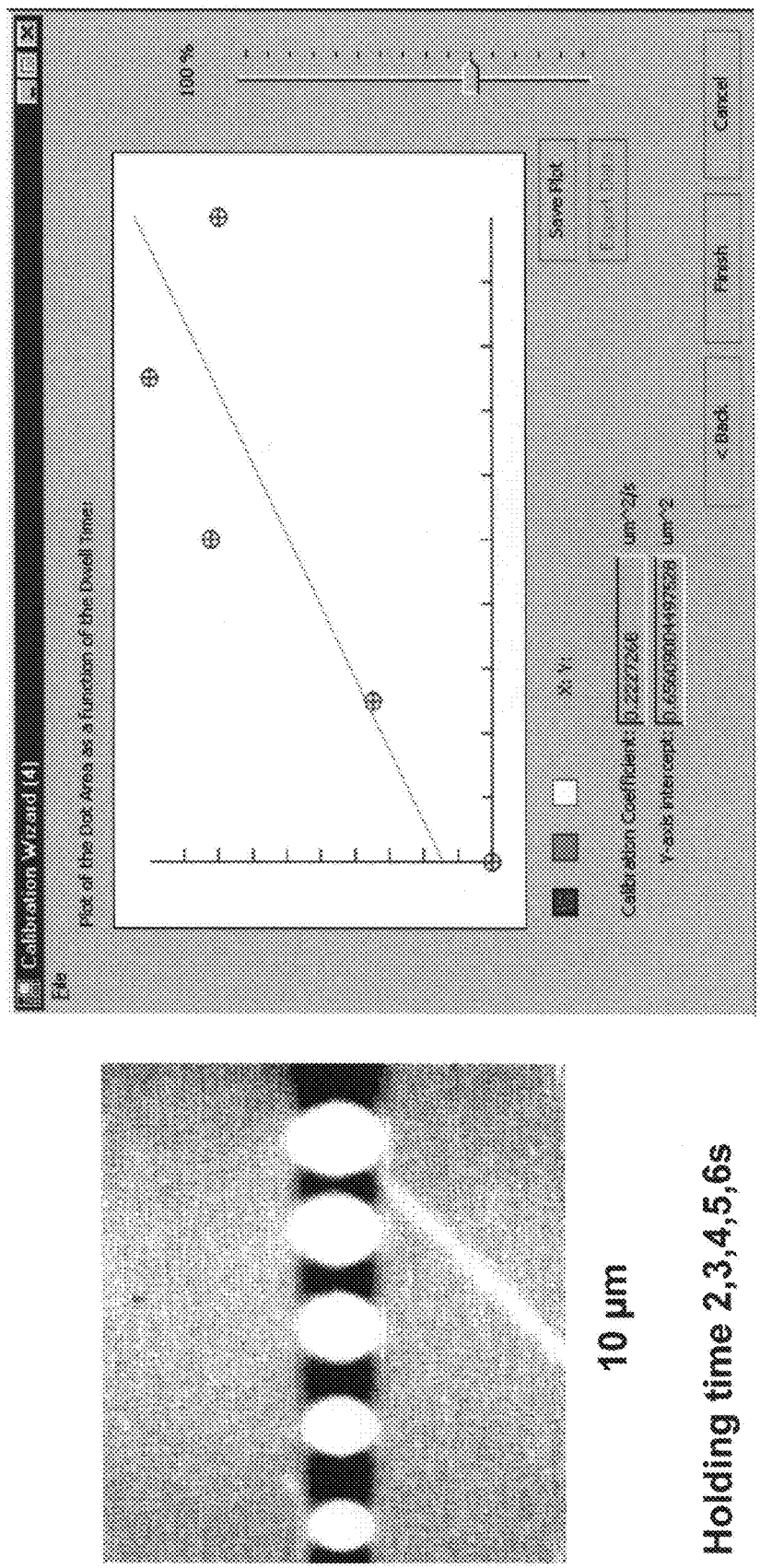
FIG. 17. Depiction of (i) an array of MHA dots deposited on a gold substrate with a PDMS DPN stamp tip coated with MHA; (2) a ink diffusion calibration curve revealing the relationship between dwell time and dot area.
Figure 18:
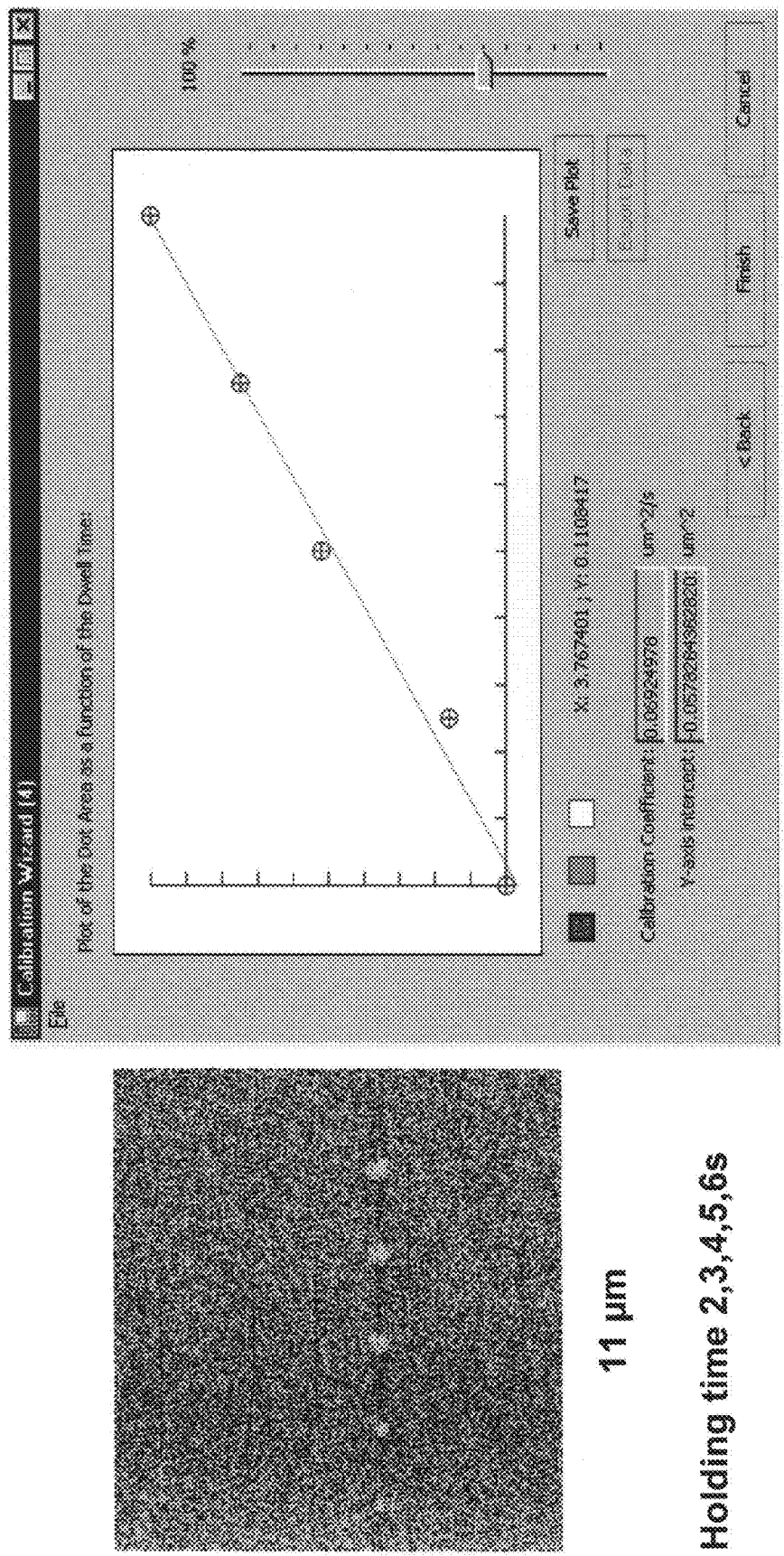
FIG. 18. Depiction of (i) an array of MHA dots deposited on a gold substrate with a $Si_3N_4$ tip coated with MHA and (ii) the ink diffusion calibration curve. As compared to the previous figure, FIG. 17, it is evident that diffusion is much faster with the DPN stamp tip. This is due, in part, to the larger amount of ink that has been absorbed by the DPN stamp tip and to the increased contact area of the DPM stamp tip.
Figure 19:
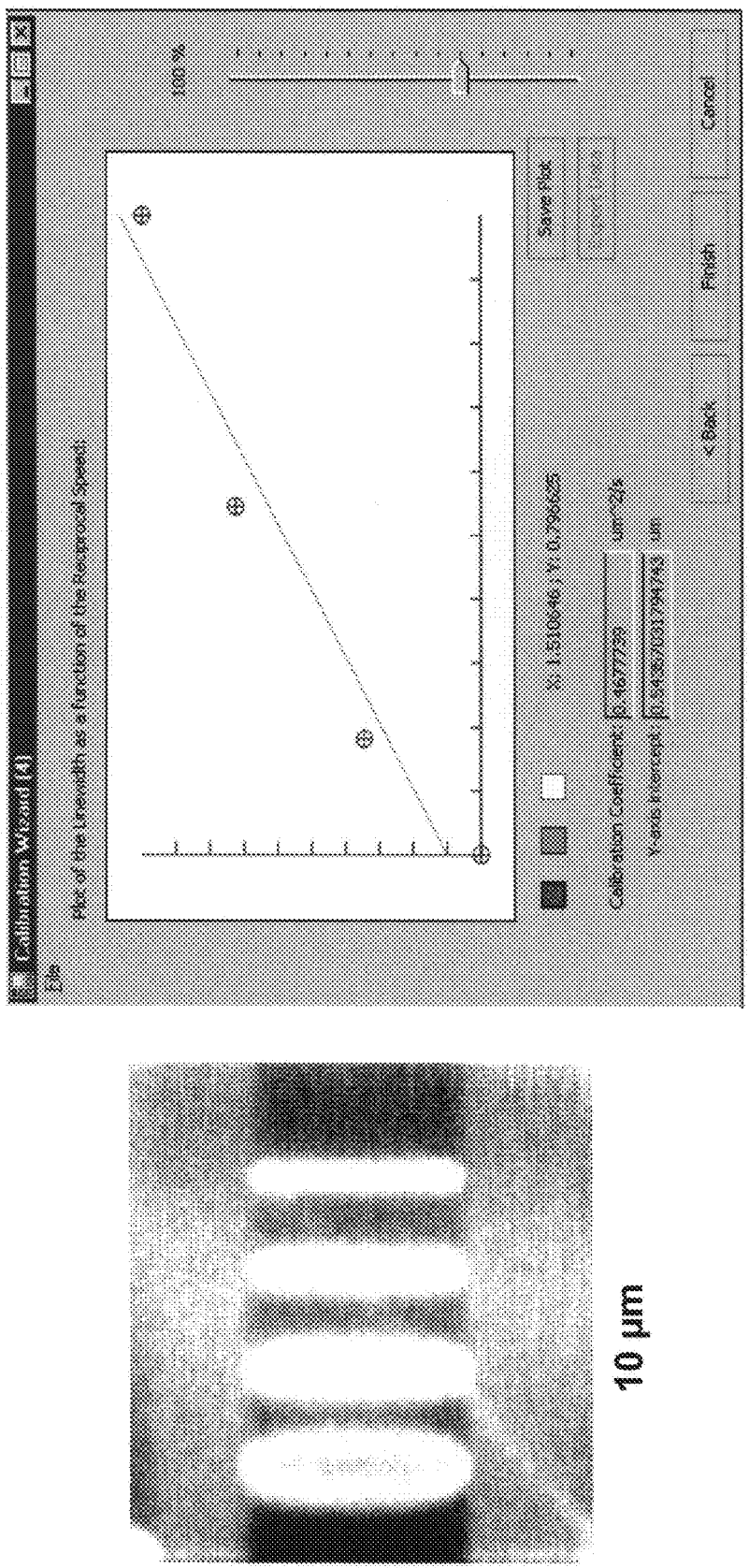
FIG. 19. Depiction of an array of MHA lines deposited on a gold substrate with a PDMS DPN stamp tip coated with MHA and corresponding calibration curve.
Figure 20:
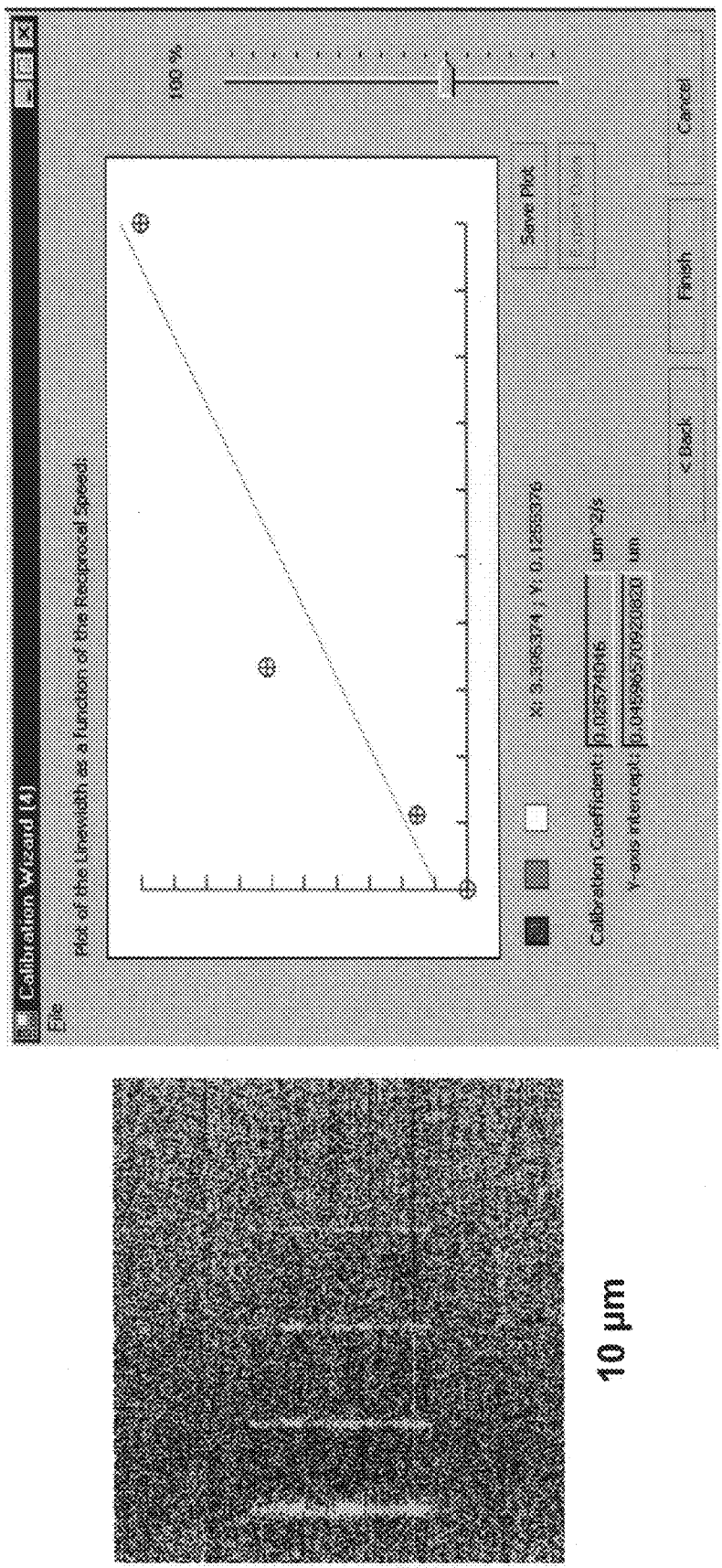
FIG. 20. Depiction of an array of MHA lines deposited on a gold substrate with a $Si_3N_4$ tip coated with MHA and corresponding calibration curve.
Figure 21:
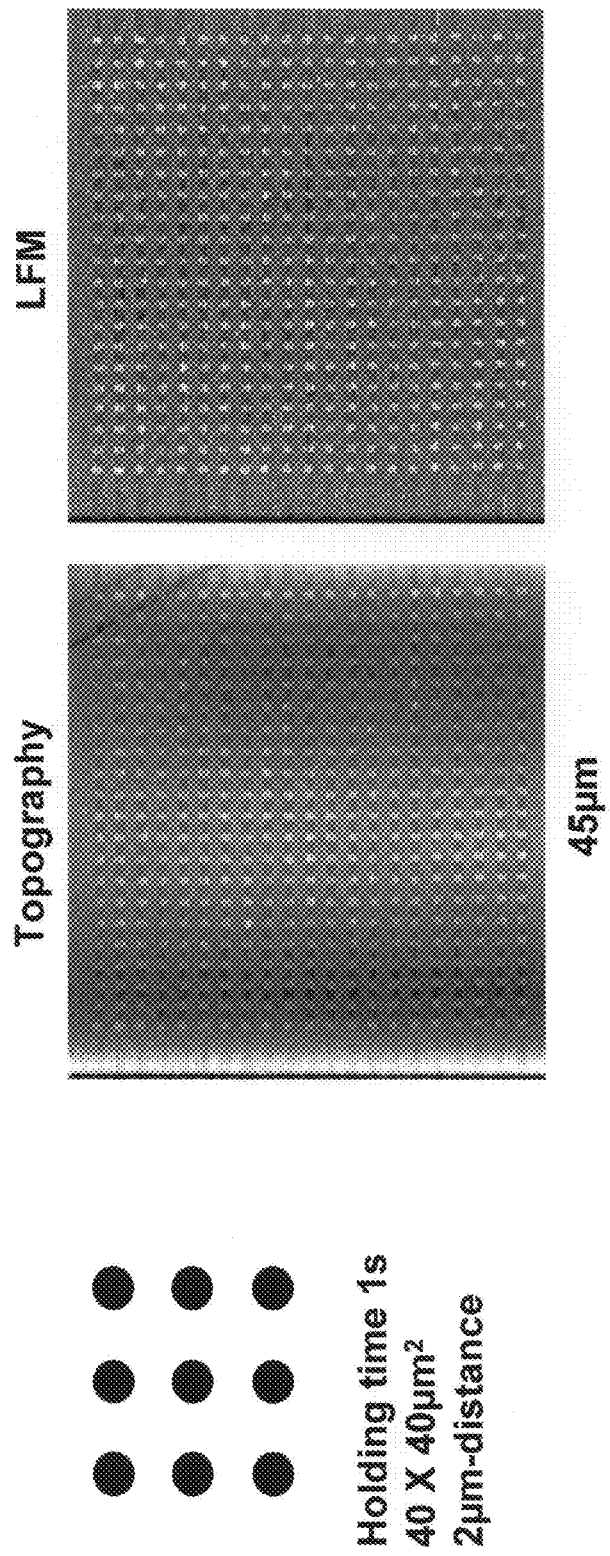
FIG. 21. Depiction of an array of MHA dots deposited on a gold substrate by a DPN stamp tip coated with MHA and imaged by a bare $Si_3N_4$ tip.
Figure 22:
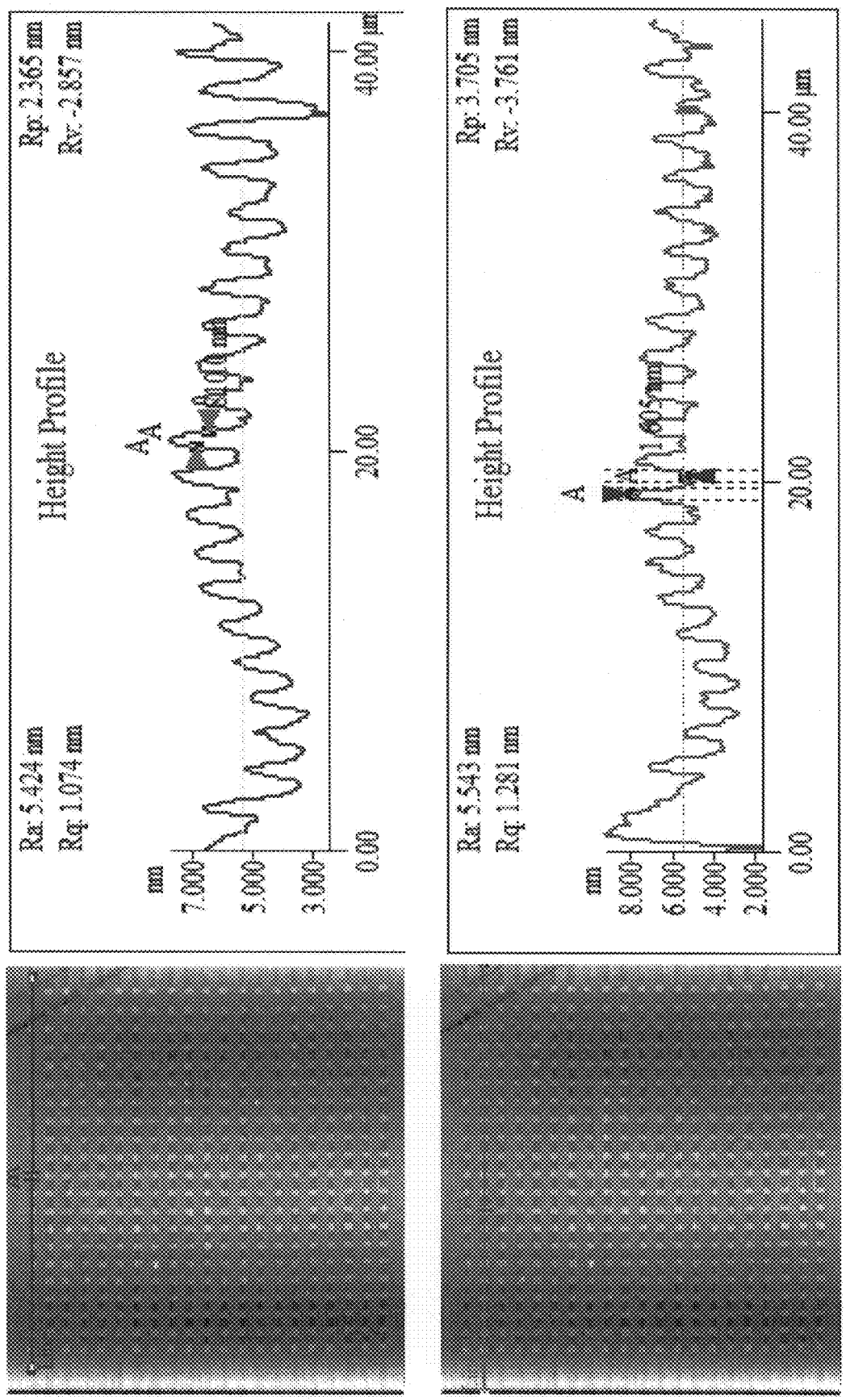
FIG. 22. Depiction of height profiles taken along two different rows in the array of MHA dots depicted in FIG. 21.
Figure 23:
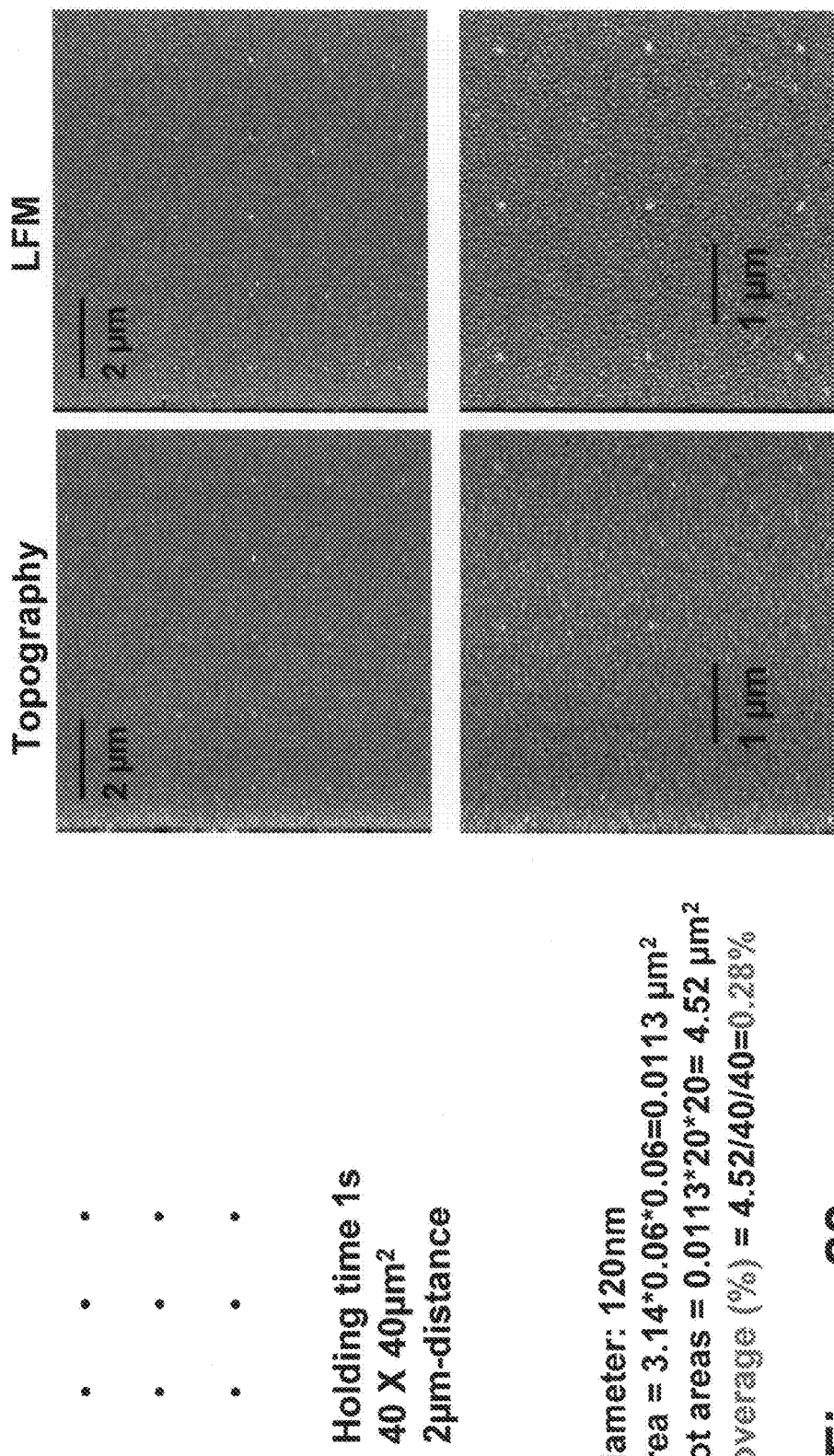
FIG. 23. Depiction of an array of MHA dots deposited on a gold substrate with a $Si_3N_4$ tip coated with MHA and imaged by a bare $Si_3N_4$ tip.
Figure 24:
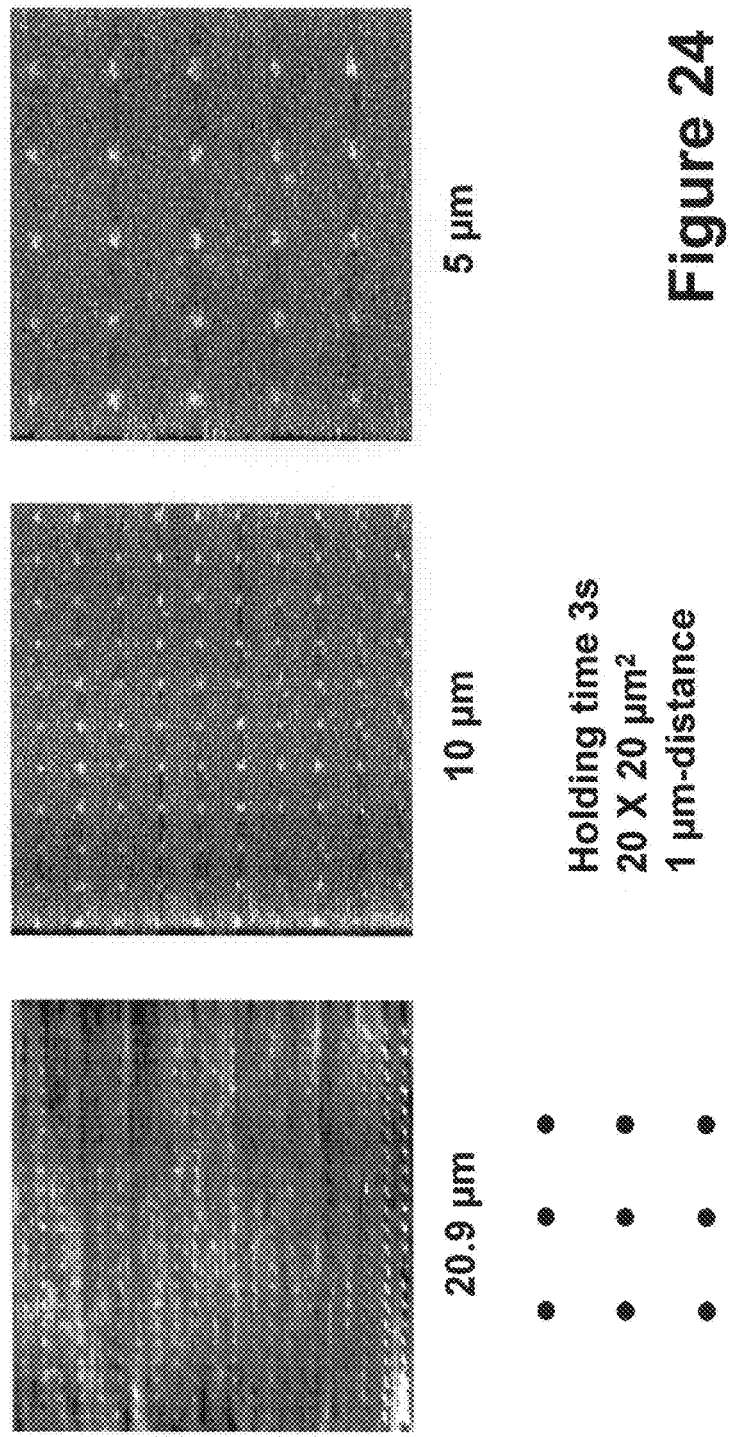
FIG. 24. Depiction of an array of MHA dots on Au generated with a 1-month-old MHA-coated DPN stamp tip and imaged by a bare $Si_3N_4$ tip.
Figure 25:
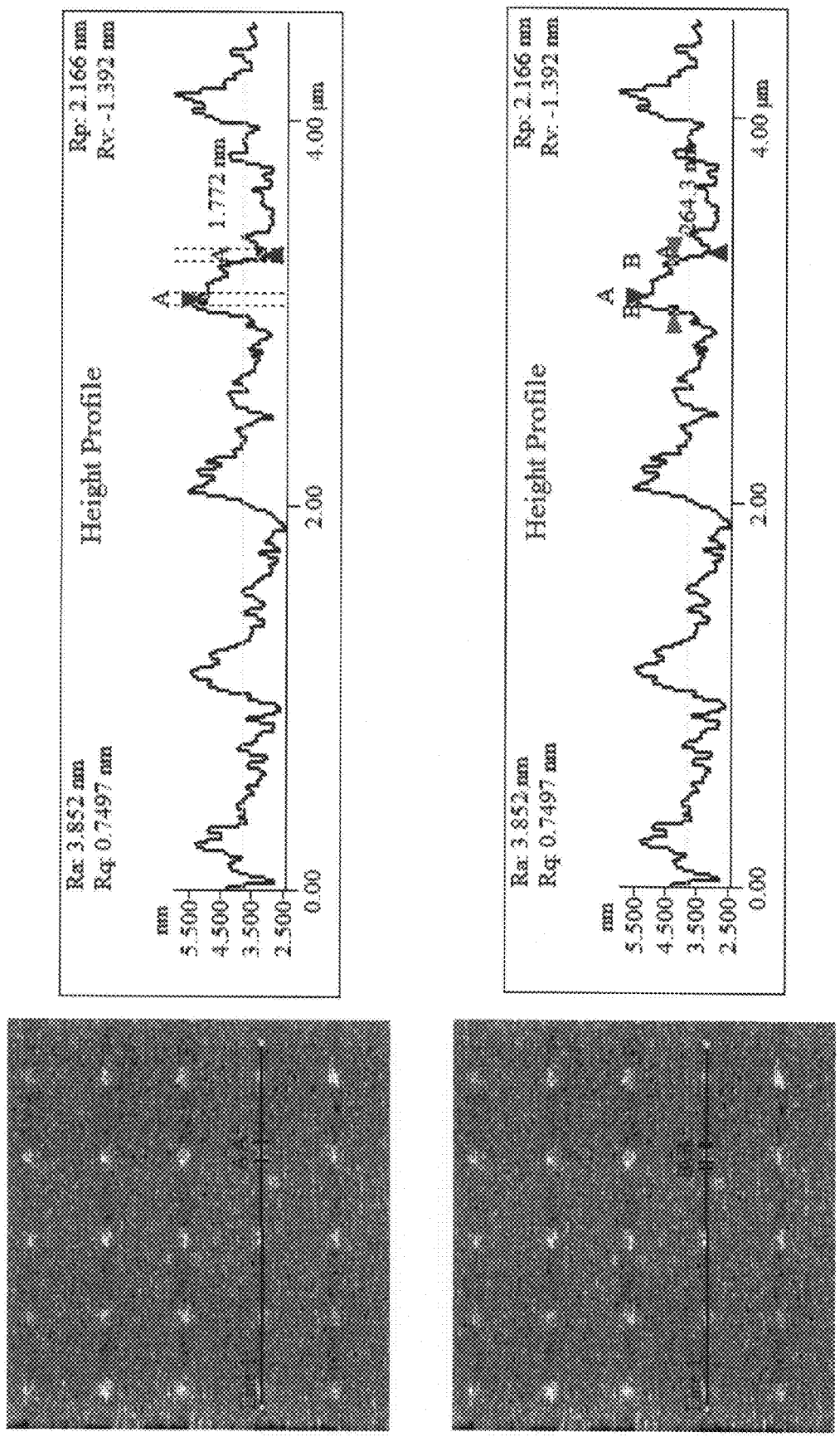
FIG. 25. Depiction of height profiles taken along two different rows in the array of MHA dots depicted in FIG. 24.
Figure 26:
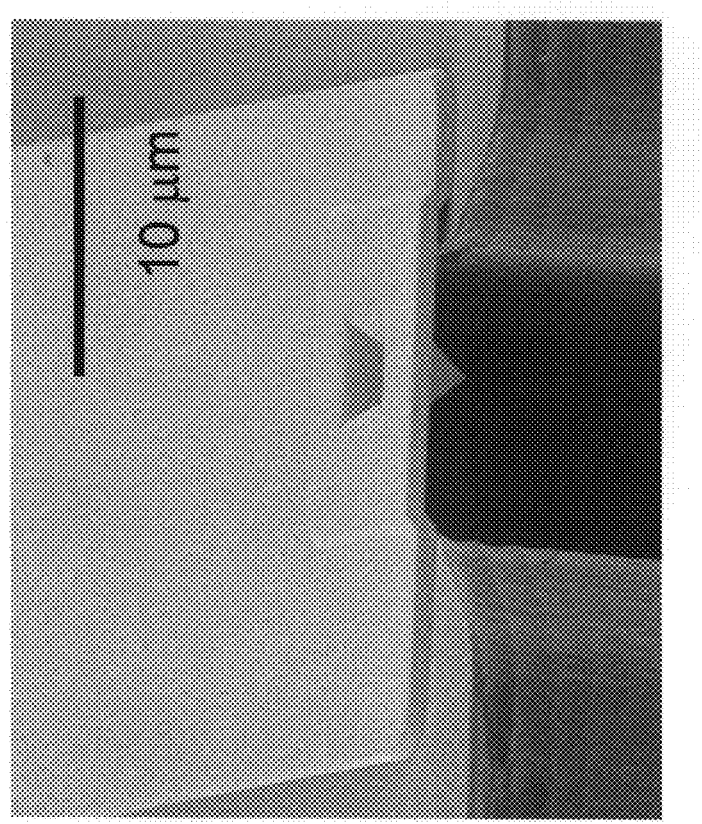
FIG. 26. Scanning electron microscopy image of an inkwell channel and microfabricated cantilever with integrated tip. Inkwells may be used to fabricate stamp tips.
Figure 45:
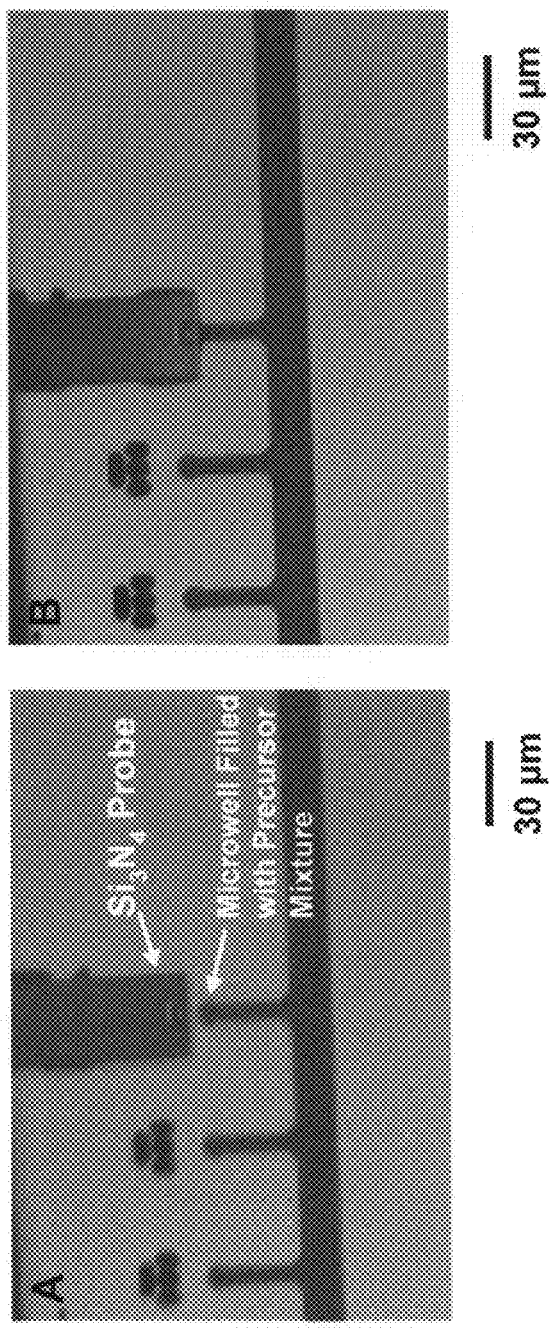
FIG. 45. Optical microscopy images illustrating the fabrication of a PDMS-coated DPN stamp tip using a microfabricated inkwell. (A) The tip of a commercial silicon nitride probe is first aligned above a microwell filled with a fluid polymer precursor. (B) The tip is lowered into the microwell, allowing the tip to be coated with the mixture.

As additional experimental demonstration of the invention, nanostructures of metals were fabricated under ambient condition using a DPN stamp tip. The DPN stamp tip was fabricated by aligning a $Si_3N_4$ tip to a microwell filled with mixture 1 (mixing silicone elastomer and silicone elastomer curing agent at a ratio of 5:1-15:1 (w/w). Normally a 10:1 ratio was used). The microwell is part of a microfluidic ink delivery device (called the DPN inkwell), which is described in further details below. After the single probe or probe array was leveled and rotationally aligned with the filled microwell array, the pen was dipped into the mixture 1 in a controlled fashion to prevent the mixture 1 to go onto the arm or the top side of the pen cantilever. In this manner, the $Si_3N_4$ tip was uniformly coated (FIG. 26A). FIG. 26B shows an SEM image of a tip dipped in an empty well. FIG. 45 shows the fabrication of a PDMS-coated DPN stamp tip by using the microfabricated inkwell. After the $Si_3N_4$ tip was coated with PDMS precursor in the inkwell, the tip was then placed into an oven at 65° C. for 12 hours to form the PDMS-coated DPN stamp tip (FIG. 26C). These DPN stamp tips were used in the following DPN experiments. In the example shown in FIG. 16 (palladium multilayer), the substrate used was $Si/SiO_x$, which was cleaned by immersing it into a boiling solution of ammonium hydroxide, hydrogen peroxide and water ($V_{(NH_4OH)}$:$V_{(H_2O_2)}$:$V_{(H_2O)}$=1:1:5) for 20 minutes. This cleaning procedure is known as RCA1 or standard clean 1. The DPN stamp tip was coated with palladium salt by dipping in a solution of 1.5 mg/μl sodium tetrachloropalladate (II) ($Na_2PdCl_4$) in a binary mixture of ethylene glycol (EG) and water 80:20 (v:v), and blown to dry with a gentle stream of $N_2$. This coating procedure was repeated few times. In this mixture, ethylene glycol acts as reducing agent when heat is applied, as it has been described in the polyol process. The metal nanopatterns are shown in FIG. 16A, six patterns consisting of three squares (1.3×1.3 μm$^2$) and three equatorial triangles were produced on the cleaned $Si/SiO_x$ substrates. These patterns are separated by 1.3 μm and are 1-2 nm taller than the surrounding substrate, shown in the cursor profile FIG. 16B. The resulting patterns were fabricated using a set point of 0 V and characterized with a bare $Si_3N_4$ tip after reducing the metal patterns by dipping in a borane dimethylamine complex solution in water or by heating. A second layer of Pd was fabricated on top of the first layer in the same manner described previously, FIG. 16C. The same area was imaged after metal reduction of the second layer with a bare $Si_3N_4$ tip, shows a height increase of 8 nm, FIG. 16D.

Working Example 5

Nanostructures of Platinum

Another example shows the versatility of using different salt solution to fabricate metal structures, such as essentially pure metals and metal alloys including, for example, Pd, Pt, Au, Ag, and Au—Pt alloy. In this experiment, Pt structures were fabricated by following the above procedure and using a platinum complex (e.g. $H_2PtCl_6$) in ethylene glycol (EG)/water mixture. The fabricated structures were reduced with borane dimethylamine complex (DMAB) or borane-methyl sulfide complex in tetrahydrofuran and heat (160° C.). The resulting patterns were characterized with a bare $Si_3N_4$ tip. A set of 12 squares ($1.0 \times 1.0$ $\mu m^2$) separated by 0.5 $\mu m$ were generated and are 2-4 nm taller than the surrounding $Si/SiO_x$ substrate.

Additional results illustrating the invention are shown in FIGS. 17-26, including MHA patterning.

V. APPLICATIONS OF STAMP TIPS INCLUDING FOR REPAIR INCLUDING PHOTOMASK REPAIR, ENHANCEMENT, AND FABRICATION

One important application for the tips of the present invention is for repairing, enhancing, and fabricating structures including photomask and other lithography structures as described in, for example, U.S. patent application Ser. No. 10/689,547 filed Oct. 21, 2003 to Crocker et al, ("Nanometer-scale engineered structure, methods, and apparatus for fabrication thereof, and applications to mask repair, enhancement, and fabrication"), which is hereby incorporated by reference in its entirety. In general, many types of structures can be repaired by the present invention. For example, photomask defects, such as gaps in conductive materials forming the top layer of said photomask, can be filled with the metal inks of the present invention.

Indeed, photomask repair via deposition nanolithography generally employs the deposition of a sizable amount of materials (about a thousandth of a micron cube, a significant quantity compared to amounts generally present on the polymer-free silicon nitride or silicon tip of an AFM cantilever) in a minimum amount of time. It is therefore advantageous to modify DPN probes in a way such as (1) more ink may be retained on the tip, when delivered to it; and (2) more ink may be deposited, when the tip is used. One possible modification involves coating the tip with a semi-porous and/or gelatinous layer, for example a siloxane polymer or copolymer like polydimethylsiloxane (PDMS) or a copolymer thereof. Without wishing to be bound by theory, it is believed that (1) the polymer forms a spongy coating that stores ink; and (2) that the contact area between the tip and sample is increased by the polymeric coating, which in turn increases the overall rate of ink deposition during photomask repair.

A person skilled in the art will recognize that numerous alternative embodiments and applications of the present invention exist. These alternatives are considered to be within the scope of the present invention. In particular, this includes the use of said polymer-coated probes for (i) other forms of nanolithography than DPN printing, including other forms of scanning microlithography and scanning probe nanolithography; (ii) the fabrication or repair of the masks used in semiconductor chip manufacturing, including the photomasks used in deep UV photolithography; (iii) the repair of flat panel displays, including TFT LCD panels; and (iv) the fabrication or repair of micro- or nanostructured stamps or molds used e.g. in nanoimprint lithography, step and flash imprint lithography and other embossing techniques are considered within the scope of the present invention. In addition, besides PDMS, other hydrophobic polymers, elastic polymers, and thermosetting systems and non-polymeric compounds can be used as well, including polysiloxane-type polymers and alkyl- and aryl-siloxane type polymers and flourinated polymers. In general, polymers which are suitable for microcontact printing [Wilbur et al., Advanced materials 6 (7-8):600-604, 1994] and soft lithography can be used to coat stamp tips.

Working Example 6

Enhanced Deposition of Sol-Gel and Palladium-Containing Inks on a Simulated Photomask Substrate Using a Polymer-Coated "DPN Stamp Tip"

In a first example, deposition experiments carried out with a bare silicon or silicon nitride tip on photomask or simulated photomask substrate were repeated with a PDMS-coated stamp tip. The following procedure illustrates the preparation of the sample and fabrication of the PDMS-coated DPN stamp tip:

A Si or $Si/SiO_x$ substrate ($2\times2$ $cm^2$) and a $Si_3N_4$ tip were immersed into a boiling mixture of $H_2O_2:NH_4OH:H_2O$, 1:1:5 (v:v:v) for about one hour, then rinsed with double deionized $H_2O$ (provided by e.g. Milli-Q equipment) and dried in a flow of pure nitrogen ($N_2$).

A silicone elastomer and a silicone elastomer curing agent (Sylgard 184 silicone elastomer kit, Dow Corning corporation, Midland, Mich.) was mixed together in a 10:1 ratio (w/w). The resulting elastomer is essentially pure polydimethylsiloxane.

A droplet of the mixture was placed onto the cleaned Si or $Si/SiO_x$ substrate and put onto the sample stage of an atomic force microscope. A clean $Si_3N_4$ microcantilever (available from NanoInk, Inc.) was mounted into the tip holder. The $Si_3N_4$ tip was placed in contact with the silicone mixture, then retracted. The procedure was repeated again.

The coated tip was placed in an oven for 12 hours at 60-70° C. to completely cure the polymer coating.

Before lithography, the finished tip was inked by dipping in an appropriate solution (the sol-gel ink or metallic ink described below) and drying it in air.

Other experimental conditions in this photomask experiment done with a DPN stamp tip were the same than when done with a $Si_3N_4$ tip. Only the $Si_3N_4$ tip was exchanged with a DPN stamp tip.

The following recipe for preparing the sol-gel ink was used: 40 $\mu L$ of MEOS (MethoxyEthoxyOrthoSilicate) and 10 $\mu L$ of 10% Pluronic (a block copolymer of ethylene oxide and propylene oxide, commercialized by BASF, Ludwigshafen, Germany) made in water. After deposition, the sol-gel ink structures were cured for 6 min at 120° C. After the curing step, the nanostructures were found to be resistant to mild sonication, piranha solution (3:1 mixture of concentrated sulfuric acid and hydrogen peroxide) and RCA1 treatment (5:1:1 mixture of water, hydrogen peroxide, and ammonium hydroxide).

For depositing metal ink on the photomask, the following procedure was used, which is similar to that in working example 4: A saturated solution of sodium tetrachloropalladate II was prepared in ethylene glycol (80% in water). After deposition, the metal salt was reduced to metal by exposing it to DMAB vapor for 15-30 seconds and then heating the substrate to a temperature of 120° C.-160° C. for 10 min.

VI. REFERENCES

The following references are hereby incorporated by reference in their entirety.
(1) (a) Piner, R. D.; Zhu, J.; Xu, F.; Hong, S.; Mirkin, C. A. *Science* 1999, 283, 661. (b) Ginger, D. S.; Zhang, H.; Mirkin, C. A. *Angew. Chem. Int. Ed.* 2004, 43, 30.
(2) (a) Hong, S. H.; Zhu, J.; Mirkin, C. A. *Science* 1999, 286, 523. (b) Hong, S. H.; Mirkin, C. A.; *Science* 2000, 288, 1808. (c) Ivanisevic, A.; Mirkin, C. A. *J. Am. Chem. Soc.* 2001, 123, 7887. (d) Zhang, H.; Li, Z.; Mirkin, C. A. *Adv. Mater.* 2002, 14, 1472. (e) Jung, H.; Kulkarni, R.; Collier, C. P. *J. Am. Chem. Soc.* 2003, 125, 12096. (f) Zhang, H.; Chung, S.-W.; Mirkin, C. A. *Nano Lett.* 2003, 3, 43. (g) Pena, D. J.; Raphael, M. P.; Byers, J. M. *Langmuir* 2003, 19, 9028. (h) Zhang, H.; Lee, K.-B.; Li, Z.; Mirkin, C. A. *Nanotechnology* 2003, 14, 1113. (i) Liu, X. G.; Liu, S. W.; Mirkin, C. A. *Angew. Chem. Int. Ed.* 2003, 42, 4785. (j) Zhang, H.; Jin, R.; Mirkin, C. A. *Nano Lett.* 2004, 4, 1493.
(3) (a) Maynor, B. W.; Filocamo, S. F.; Grinstaff, M. W.; Liu, J. *J. Am. Chem. Soc.* 2002, 124, 522. (b) Noy, A.; Miller, A. E.; Klare, J. E.; Weeks, B. L.; Woods, B. W.; DeYoreo, J. J.; *Nano Lett.* 2002, 2, 109. (c) Lim, J. H.; Mirkin, C. A. *Adv. Mater.* 2002, 14, 1474.
(4) (a) Wilson, D. L.; Martin, R.; Hong, S.; Cronin-Golomb, M.; Mirkin, C. A.; Kaplan, D. L.; *Proc. Natl. Acad. Sci. U.S.A.* 2001, 98, 13660. (b) Demers, L. M.; Ginger, D. S.; Park, S. J.; Li, Z.; Chung, S. W.; Mirkin, C. A. *Science* 2002, 296, 1836. (c) Lee, K. B.; Lim, J. H.; Mirkin, C. A. *J. Am. Chem. Soc.* 2003, 125, 5588. (d) Lim, J. H.; Ginger, D. S.; Lee, K. B.; Heo, J.; Nam, J. M.; Mirkin, C. A. *Angew. Chem. Int. Ed.* 2003, 42, 2309.
(5) (a) Su, M.; Liu, X. G.; Li, S. Y.; Dravid, V. P.; Mirkin, C. A. *J. Am. Chem. Soc.* 2002, 124, 1560. (b) Fu, L.; Liu, X. G.; Zhang, Y.; Dravid, V. P.; Mirkin, C. A. *Nano Lett.* 2003, 3, 757. (c) Su, M.; Li, S. Y.; Dravid, V. P. *J. Am. Chem. Soc.* 2003, 125, 9930.
(6) (a) Li, Y.; Maynor, B. W.; Liu, J. *J. Am. Chem. Soc.* 2001, 123, 2105. (b) Maynor, B. W.; Li, Y.; Liu, J. *Langmuir* 2001, 17, 2575. (c) Porter, L. A.; Choi, H. C.; Schmeltzer, J. M.; Ribbe, A. E.; Elliott, L. C. C.; Buriak, J. M. *Nano Lett.* 2002, 2, 1369.
(7) (a) Ben Ali, M.; Ondarcuhu, T.; Brust, M.; Joachim, C. *Langmuir* 2002, 18, 872. (b) Garno, J. C.; Yang, Y. Y.; Amro, N. A.; Cruchon-Dupeyrat, S.; Chen, S. W.; Liu, G. Y. *Nano Lett.* 2003, 3, 389.
(8) see a review: Wallraff, G. M.; Hinsberg, W. D. *Chem. Rev.* 1999, 99, 1801 and references therein.
(9) Chou, S. Y. *MRS Bull.* 2001, 26, 512.
(10) (a) Xia, Y.; Whitesides, G. M. *Angew. Chem. Int. Ed.* 1998, 37, 550. (b) Xia, Y.; Rogers, J. A.; Paul, K. E.; Whitesides, G. M. *Chem. Rev.* 1999, 99, 1823.
(11) Liu, G. Y.; Xu, S.; Qian, Y. L. *Acc. Chem. Res.* 2000, 33, 457.
(12) (a) Zhang, M.; Bullen, D.; Chung, S. W.; Hong, S.; Ryu, K. S.; Fan, Z. F.; Mirkin, C. A.; Liu, C. *Nanotechnology* 2002, 13, 212. (b) Service, R. F. *Science* 2002, 298, 2322.
(13) Wang, X.; Ryu, K. S.; Bullen, D. A.; Zou, J.; Zhang, H.; Mirkin, C. A.; Liu, C. *Langmuir* 2003, 19, 8951.
(14) Zhang, H.; Mirkin, C. A. et al. Papers cited above regarding chemical etching and U.S. patent application Ser. No. 10/725,939 filed Dec. 3, 2003.
(15) For example, see FIG. 16 and working examples.
(16) McKendry, R.; Huck, W. T. S.; Weeks, B.; Florini, M.; Abell, C.; Rayment, T. *Nano Lett.* 2002, 2, 713.
(17) Dendritech Inc., Midland, Mich. 48642.
(18) (a) Tsukruk V. V. *Adv. Mater.* 1998, 10, 253. (b) Hierlemann, A.; Campbell, J. K.; Baker, L. A.; Crooks, R. M.; Ricco, A. J. *J. Am. Chem. Soc.* 1998, 120, 5323. (c) Tsukruk, V. V.; Rinderspacher, F.; Bliznyuk, V. *Langmuir* 1997, 13, 2171.

Additional embodiments of the present invention are further described in the following four sections, VII, VIII, IX, and X, which include additional working examples including: (a) methods for the fabrication of metallic or metal-containing nanopatterns using DPN stamp tips comprising use of both metallic nanoparticles and metal salt solutions; (b) applications of these methods for photomask repair applications; and (c) methods for the mass production of polymer-coated probes for easier commercialization of said probes.

VII. ADDITIONAL EMBODIMENTS

Advanced Fabrication Methods Of Metallic Alloy and Metal-Doped Nanostructures

Deposition and Curing of Metallic Nanoparticle-Based Inks

In another embodiment, the invention provides a direct-write lithographic method, the method comprising:
the deposition of an ink on a substrate, the ink comprising nanoparticles, optionally one or more solvent(s) or ink delivery agents, and optionally one or more binding agent, to form a pattern with at least one dimension in the micro- or nanometer range.
the thermal curing of said pattern to obtain one or more solid nanostructure(s) substantially bound to said substrate.

In a preferred embodiment, said ink composition is coated on the tip of an AFM-style probe, which has been previously coated with a thin layer of polydimethylsiloxane polymer, and the tip is contacted with or rastered across the surface, according to the Dip Pen Nanolithography method.

Without wishing to be bound by theory, it is believed that the use of a polymer-coated (e.g. PDMS-coated) tip increases (i) the storage and lifetime of said ink on the tip; and (ii) its deposition rate. It is further believed that thermal curing removes or destroys the solvent and other organic compounds in the ink and induces partial melting or coalescence of the nanoparticles into a solid mass.

Binding agent may optionally be added to the ink composition to favor the adhesion of the metallic or metal-containing pattern to the substrate. For example, the binding agent may comprising a chemical compound that polymerizes upon heating or/and that binds to the substrate, the nanoparticles or both. Binding preferably occurs through strong covalent, (dative) coordination or hydrogen bonds.

An ink delivery agent may be added to the ink composition to facilitate delivery of the ink to the probe, storage of the ink on the probe and/or controlled diffusion of said ink from the probe onto the substrate. Such chemical compounds, for example, may control the viscosity of the ink, its drying time and its surface tension.

In a preferred embodiment, metallic gold nanoparticles are used. However, small nanoparticles of other metals (and especially silver, platinum and palladium) may be used instead of gold, in the limit of material compatibility with the process, in which the resulting metallic nanostructures may be used. The invention is not limited to metals and also includes the use of nanoparticles of alloys, oxides, groups II-VI or III-V semiconductors, group IV semiconductors, as well as core-shell nanoparticles, for example. Mixtures of different types of nanoparticles may also be used.

In a further preferred embodiment, said nanoparticles are prepared according the monolayer-protected cluster (MPC) method, in which each nanoparticle is surrounded by a coating one molecule in thickness. That monolayer stabilizes the clusters, favors monodispersity, and prevents their rapid coalescence in solution. The monolayer preferably self-assembles on the surface of the nanoparticles. Monolayers of alkanethiols are particularly preferred, but xanthates, disulfides, di- and trithiols, (poly)thioethers, phosphine (oxides), amines, carboxylic acids, isocyanides are non-limiting examples of alternate ligands. Without being bound by theory, it is believed that, upon heating or other form of curing, the monolayer is either desorbed from the nanoparticles' surface or is quickly oxidized, allowing nanoparticle sintering.

It is possible to modify nanoparticles and especially MPCs post-synthetically, for example by place-exchange of the protecting monolayer with another molecule. This method may incorporate polymerizable or surface-reactive groups that increase adhesion.

The following literature may be used to practice the invention, especially with regards to nanoparticle synthesis and functionalization, and is hereby incorporated by reference:
1) "Reactive self-assembled monolayers on flat and nanoparticle surfaces and their application in soft and scanning probe lithographic nanofabrication technologies", X.-M. Li, J. Huskens and D. N. Reinhoudt, J. Mater. Chem. 14, 2954, 2004.
2) "Recent advances in the liquid-phase syntheses of inorganic nanoparticles", B. L. Cushing, V. L. Kolesnichenko, C. J. O'Connor, Chemical Reviews 104 (9): 3893-3946, 2004.
3) "Gold nanoparticles: Assembly, supramolecular chemistry, quantum-size-related properties, and applications toward biology, catalysis, and nanotechnology" M. C. Daniel, D. Astruc, Chemical Reviews 104 (1): 293-346, 2004.
4) "Synthesis routes for large volumes of nanoparticles" O. Masala, R. Seshadri, Annual Review of Materials Research 34: 41-81, 2004.

In addition, "Fountain pen-based laser microstructuring with gold nanoparticle inks", T. Y. Choi, D. Poulikakos, C. P. Griporopoulous Appl. Phys. Lett. 85 (1), 13, 2004 describes the use of a micropipette to write micro- to mesoscopic patterns with a gold nanoparticles/toluene ink on glass substrates. A continuous-wave laser is subsequently used to evaporate the solvent and sinter the nanoparticles in a solid gold pattern. In another embodiment, the invention improves on Choi's disclosure by providing a method of fabrication of nanometer-scale patterns, the method comprising (i) the deposition of an ink comprising sinterable nanoparticles in at least one nanometer-scale area using Dip Pen Nanolithographic printing; (ii) the curing of said deposits by irradiation of a region surrounding and comprising the deposition area(s) with a laser or a similar heating light source. In a preferred embodiment, an infrared gun (IR) manufactured by Research, Inc. (Eden Prairie, Minn.; www.irheaters.com) is used as the local heating tool. In a further preferred embodiment, the laser or heating tool is integrated with the direct-write writing tool, e.g. a modified atomic force microscopy platform. This embodiment enables the rapid and seamless fabrication of multilayered patterns by shortening the deposition/curing cycle and rendering its automation possible.

The invention further provides articles (pattern or array thereof) prepared by the aforementioned methods and the ink composition to prepare said articles.

Working Example 7

Deposition and Curing of a Mixture of Gold Nanoparticles and Octadecyltrichlorosilane In this example, metal nanostructures were fabricated using PDMS-coated probes and an "ink" comprising mainly of gold nanoparticles. It was prepared by mixing 1 mg of hexanethiol-capped gold nanoparticles, 2 μL of decanol and 3 μL of 1 mg/mL of thiotic acid dissolved in mesitylene. The gold nanoparticles used in this experiment were synthesized according to the following references:
1) "Alkanethiolate Gold Cluster Molecules with Core Diameters from 1.5 to 5.2 nm: Core and Monolayer Properties as a Function of Core Size", M. J. Hostetler, J. E. Wingate, C.-J. Zhong et al. Langmuir 1998, 14, 17-30.
2) "Plastic-Compatible Low Resistance Printable Gold Nanoparticle Conductors for Flexible Electronics", D. Huang, F. Liao, S. Molesa, D. Redinger, and V. Subramanian, Journal of The Electrochemical Society 150 (7) G412-G417, 2003. A 4:1 thiol-to-gold-salt molar ratio was chosen, yielding nanoparticles with estimated average diameter of ~1.5 nm. Small nanoparticles are believed to easily store on the tip and transfer to the surface. They have a lower melting/sintering temperature as well.

To further improve interaction with the quartz surface, 1.5 μL of octadecyltrichlorosilane (OTS) was also added to the mixture. Without wishing being bound by theory, it is believed that OTS reacts with decanol as well as trace hydroxyl groups on the quartz surface and condenses into a polymeric siloxane network that covalently binds to the surface while entrapping the gold nanoparticles.

Figure 27:
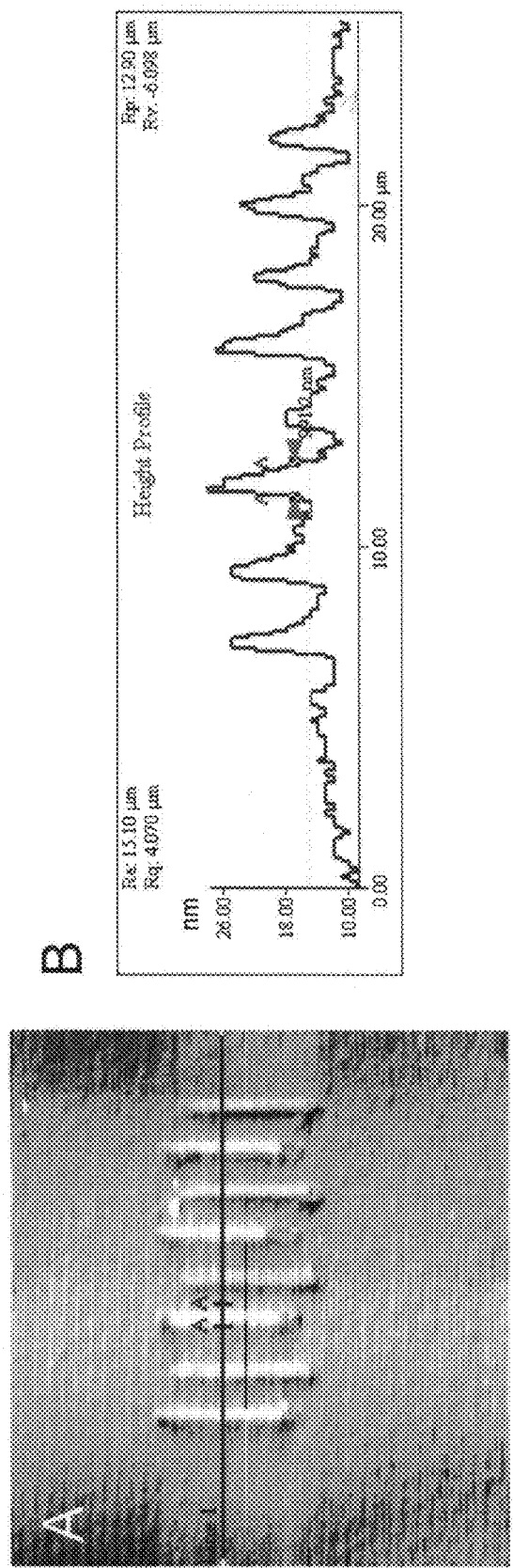
FIG. 27. Lateral Force Microscopy image (A) and height profile (B) corresponding to the cursor in image A of nanolines fabricated by DPN printing of a gold nanoparticle/octadecyltrichlorosilane ink with a PDMS-coated stamp tip, followed by heat curing.

FIG. 27 shows a set of lines fabricated on a quartz surface with a PDMS-coated probe. First, the quartz surface was cleaned with Piranha solution at 120° C. prior to patterning. Eight lines were then drawn on the surface by moving the PDMS-coated probe dipped into the aforementioned ink at a speed of 0.05 μm/sec. The AFM topographic scan shown in FIG. 27 was acquired after a two-step thermal curing step: The ink was cured by performing a high temperature curing at 250-300° C. for 5 minutes followed by low-temperature curing at 120° C. for 30 minutes.

Figure 28:
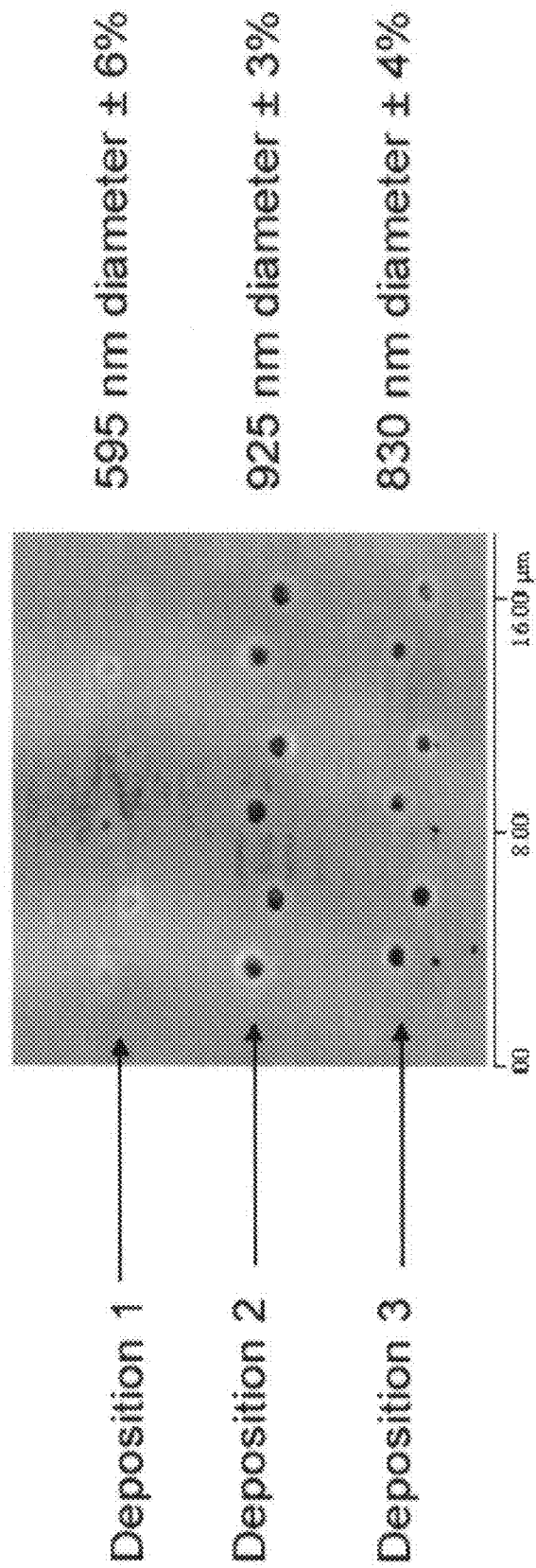
FIG. 28. LFM image of three series (depositions 1, 2, 3) of nanodots patterned by deposition of a gold nanoparticle/octadecyltrichlorosilane mixture and heat curing.

Similar experimental conditions were used to fabricate an array of dots. FIG. 28 shows the lateral force microscopy image of 3 series of dots of different average diameters created by contacting a PDMS-coated tip dipped in the aforementioned gold nanoparticles ink with the substrate for 3 different dwell times. Dots in deposition area 1 measured ~595 nm for a contact time with the substrate of 15 seconds. Similarly, dwell times of 90 and 45 seconds yielded dot 925 nm and 830 nm in diameters in the deposition areas 2 and 3.

Surprisingly, depositing the ink composition was more favorably enabled with use of the stamp tip compared with use of a bare silicon nitride tip. While the mechanism for this is not fully understood, it is possible that (i) the PDMS tip surface, being microscopically rough and fairly hydrophobic, more readily adsorbs and retains monolayer-protected nanoparticles than the hydrophilic, very smooth silicon nitride tip surface; (ii) the fact that the apex diameter of the stamp tip is typically larger than that of a bare silicon nitride tip facilitates the transfer of the nanoparticles from the tip to the substrate.

Working Example 8

Deposition and Curing of Gold Nanoparticles Modified with Mercaptopropyltrichlorosilane In the previous example 8, gold nanoparticles were capped during synthesis with a mostly unreactive, low-surface-energy alkanethiol monolayer. However, it is advantageous to introduce reactive or at least polar chemical groups at the surface of said gold nanoparticles, for example to favor their cross-linking during curing. While it is rarely possible to directly use omega-functionalized thiol ligands during nanoparticle synthesis, it is often possible to place-exchange the short-chain alkanethiols $CH_3(CH_2)_nSH$ usually used as protective layers with functionalized thiol molecules. Place-exchange, exchange of the outer self-assembled monolayers (SAMs) protecting Au nanoparticles, also usually results in mixed monolayers with a low-density of reactive groups, which avoids premature aggregation of the nanoparticles in solution (before deposition).

In this example, place-exchange SAMs-exchange was carried between hexanethiol-capped gold nanoparticles and (3-mercaptopropyl)triethoxysilane (MPTS, $HS(CH_2)_3Si(OCH_2CH_3)_3$) or (3-mercaptopropyl) trimethoxysilane (HS $(CH_2)_3Si(OCH_3)_3$). 100 µL of 5% mercaptotrimethoxysilane in toluene was mixed with 1 mg of dried gold nanoparticles. The mixture was set aside for 12 hours to give sufficient time for thiol exchange. After that period of time, the solution was separated from the nanoparticles using a high-speed vacuum centrifuge (vacufuge). The nanoparticles were further washed with ethanol to remove the remaining unreacted mercaptotrimethoxysilane molecules.

Again, the thiol functional group of MPTS can adsorb or displace existing alkanethiols on the surface of gold nanoparticles, while its condensable (tri)alkoxysilane group contributes to the formation of a polymeric network that binds gold particles to each other and to residual hydroxyl groups at the surface of the substrate. Other terminal groups, such as amine groups, may also be used to improve adhesion by electrostatic binding to or reaction with surface species.

VIII. ADDITIONAL EMBODIMENTS

Deposition and Curing of Metallic Salt-Based Inks

In another embodiment, the invention provides a method of fabrication of metal-rich nanostructures by deposition of an ink comprising metallic salts and subsequent (thermal) curing using a polymer-coated tip. The ink may comprise a reducing agent, such as an alcohol, a polyol, such as ethylene glycol, which may be activated by heating. It may also be exposed during curing to a vapor or a bath of a reducing agent. Said ink may also comprise ink delivery agent(s) and binding agent(s) as in the previous embodiment. Organic or organometallic adjuvants, such as thiotic acid, mercaptopropyltrimethoxysilane $HS(CH_2)_3Si(OCH_3)_3$, aminopropyltriethoxysilane $H_2N(CH_2)_3Si(OCH_2CH_3)$, related compounds (trichloro-, trimethoxy- or triethoxysilane analogs) and mixtures thereof are preferred binding agents. This method of reducing a metal salt in presence of alcohol groups is based on the "polyol" process that is known to the art of metallic thin film formation.

The invention further provides an article (pattern or array thereof) prepared by the aforementioned method and the ink composition therefor.

The invention also provides multilayered metallic patterns. When the application of metallic nanopatterns on quartz substrates is in the repair of clear defects on photomasks, for example, a controlled degree of opacity at the wavelength of exposure is required. As light absorption is a function of the pattern thickness, it is commercially advantageous to prepare thicker patterns than naturally permitted by direct-write nanolithography by stacking multiple layers. In yet another embodiment, the invention provides a direct-write nanolithographic method for fabricating a pattern with multiple layers, the method comprising (i) forming a first nanopattern on a surface with direct-write nanolithography;

(ii) curing or ortherwise processing said nanopatterns to form a stable substrate suitable as a substrate for further direct-write nanolithography;

(iii) forming a second nanopattern atop the first;

(iv) repeating said curing and writing steps until the desired number of layers, thickness or pattern property is achieved.

For example, for photomask repair applications, nanopatterns with two or more identical layers may be prepared until the thickness or opacity matches that of the chromium/chromium oxide film light-blocking layer.

The curing step may not need to be complete, provided that the nanopattern is not smeared by the scanning probe tip during the second or higher layer deposition; if said pattern is formed by the sol-gel method, syneresis, rather than its full conversion to a dense oxide, may be enough.

Finally, the invention provides metal-doped nanostructures and method of fabrication thereof, which comprises (i) providing an ink composition that comprises at least a jellification (e.g. sol-gel) agent and at least one metal-containing salt or complex, (ii) providing a (polymer-coated) tip, (iii) coating the tip with said ink composition, (v) contacting said coated tip with a substrate to form at least one nanometer-scale pattern, (vi) (thermally) curing said pattern to form an xerogel, said xerogel comprising an oxide that has been doped with the chosen metal.

In a preferred embodiment, the jellification agent is selected from a group that comprises silicon alkoxides, such as tetraethyl- or methylethylorthosilicate (TEOS, MEOS), alkyltrichlorosilanes and alkyltrialkoxysilanes; and silsequioxanes. The metal may be a noble metal. Without wishing to be bound by theory, it is believed that upon curing the metal is present as ions in the sol-gel matrix or as reduced metal nanoparticles embedded in the matrix. The resulting metal-doped patterns benefits from the good adherence properties and inertness of sol-gel materials and the optical properties of the metal, for example. For example, patterns with two or more identical layers are prepared, which opacity matches that of the chromium/chromium oxide layer currently used as the light-blocking layer in existing photomasks.

The following examples demonstrate the deposition of gold salts (Au); platinum (Pt) salts; ruthenium (Ru) salts to form nanostructures of said metal; mixtures of Au and Pt salts; mixtures of Ru and Pt salts to form nanostructures of the respective alloys; and formation of multilayered Au/Pt-doped sol-gel nanostructures.

Working Example 9

Deposition and Curing of Gold Salts to Fabricate Gold Nanostructures

The following ink composition was used to fabricate gold nanostructures: A saturated solution of hydrogen tetrachloroaurate (III) trihydrate was prepared in dimethylformamide (DMF). 7 μL of this salt solution was added to 2 μL of ethylene glycol and 1 μL of a solution containing 1 mg/mL of thiotic acid in DMF.

A PDMS-coated stamp tip was coated with this mixture and used to deposit it on the quartz substrate of a commercial chromium-on-quartz photomask. Four square patterns were fabricated by moving the tip at a raster speed of 1 Hz. The patterned quartz substrate was submitted to low-temperature curing at 120° C. for 30 minutes followed by a high-temperature curing between 250 and 300° C. for 5 minutes.

Figure 29:
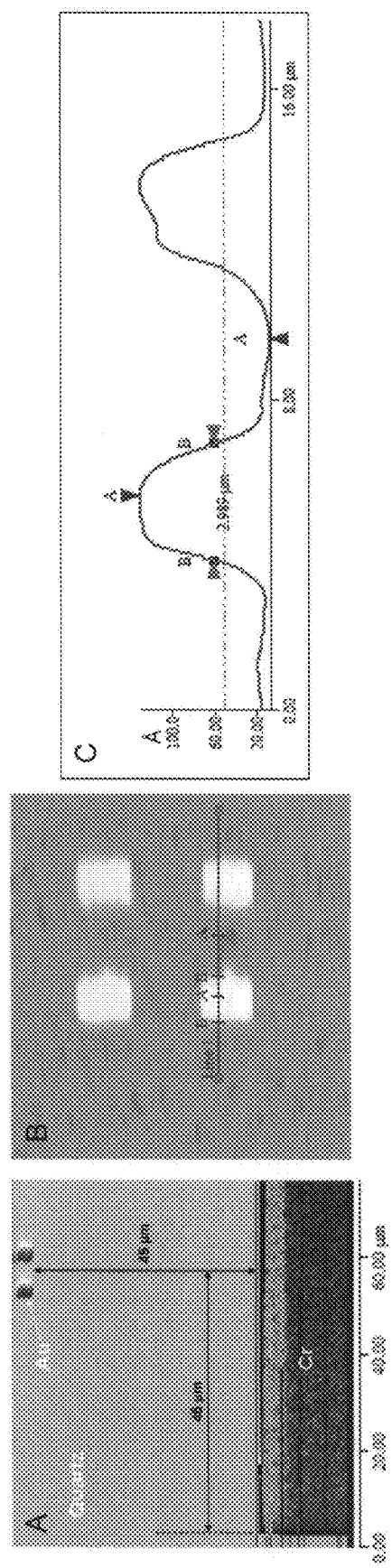
FIG. 29. LFM image (A) and topographic image (B) of its upper right corner showing four gold nanostructures fabricated on quartz; cross-section (C) corresponding to the cursor in image B. Patterns were fabricated by deposition of a hydrogen tetrachloroaurate (III), ethylene glycol, thiotic acid mixture with a PDMS stamp tip and two-step heat curing.

FIG. 29 shows the resulting Au patterns on quartz. Image (A) is a Lateral Force Microscopy (LFM) image of said squares fabricated on quartz next to the edge of a preexisting chromium pattern. LFM contrast is the result of the different friction coefficients of the metal areas (Cr and Au) and of the quartz. Image (B) is a topographic AFM scan of the 3 um-wide and 12 nm-high squares. Diagram (C) is a line profile across the fabricated squares corresponding to the cursor in image B.

Working Example 10

Deposition and Curing of Platinum Salts to Fabricate Platinum Nanostructures 0.051 g of hydrogen hexachloroplatinate hexahydrate was dissolved in 150 μL of DMF. 6 μL of this solution was then mixed with 4 μL of ethylene glycol (EG) and 0.0002 g of thiotic acid to prepare a Pt ink, which was then used to coat a PDMS stamp tip. Three squares (10, 3 and 3 m² in area, respectively) were written on quartz using this mixture. After curing on a hot plate at about 250° C. for 10 minutes, AFM imaging reveals three stable patterns with a different frictional contrast that their surrounding, suggesting metallic patterns. The heights of the 10 and 3 μm² patterns are approx. 2.7 nm and 2.0 nm, respectively.

Working Example 11

Fabrication of Au—Pt alloy Nanostructures

The above procedures were slightly modified to use a mixture of gold and platinum salts instead of a pure metal salt. Saturated solutions of hydrogen tetrachloroaurate (III) trihydrate and hydrogen hexachloroplatinate (IV) hexahydrate were prepared separately in polyethylene glycol (MW: 10000). Ink was prepared by mixing 2 μL of each salt solution with 1 μL of ethylene glycol and 0.5 μL of 1 mg/mL thiotic acid in dimethylformamide (DMF). A PDMS-coated stamp tip was coated with this ink and used to fabricate several arrays of nanodots. After deposition, the metal salt mixture was reduced to an alloy by heating the substrate to a temperature of 120° C. in a laboratory oven for 30 minutes then exposing it to high temperature (250-350° C.) using a heat gun for 1 min.

Figure 30:
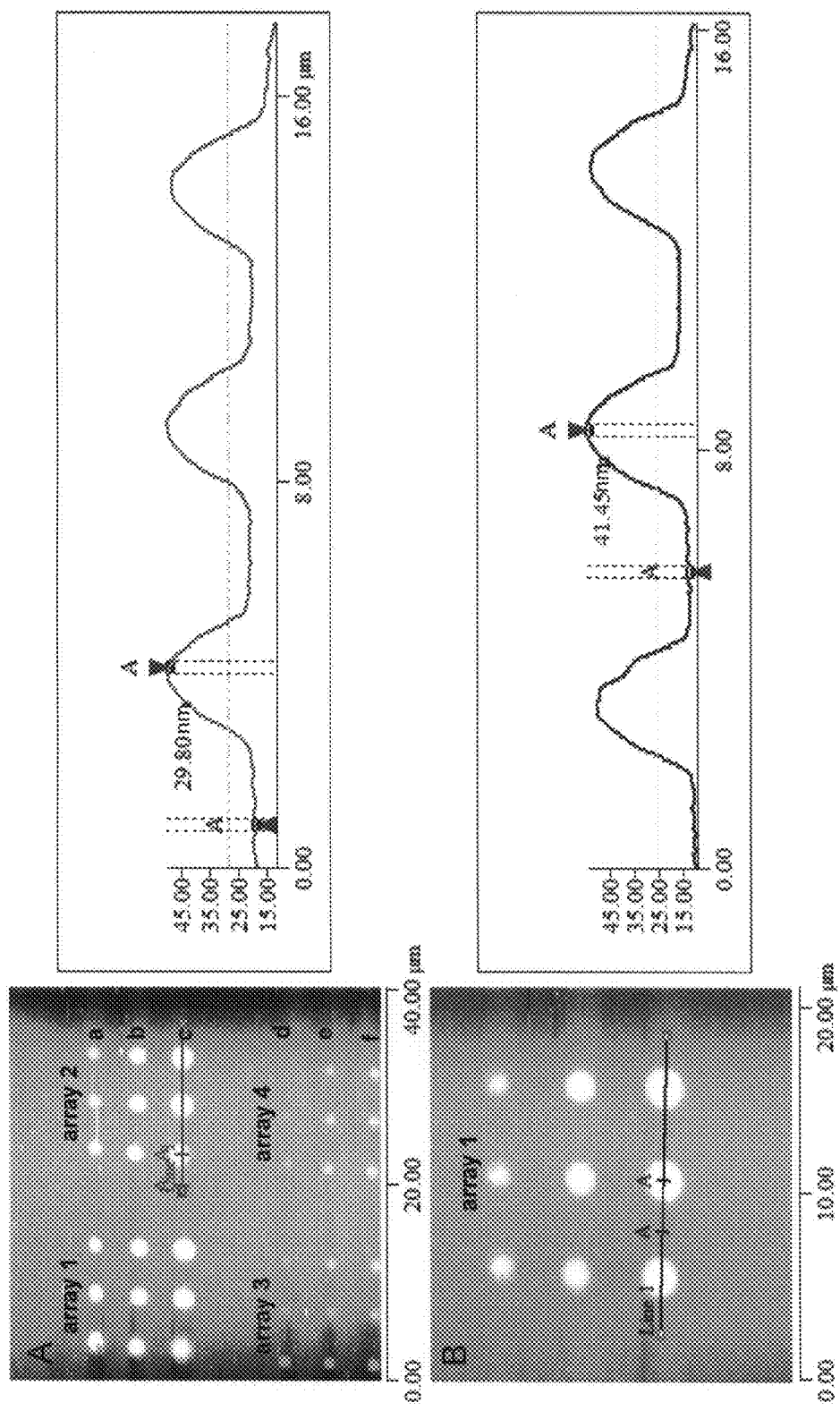
FIG. 30. Topographic AFM image of Au—Pt metal alloy dots (A), and detail image (B), fabricated with a DPN stamp tip. In image A, the tip-substrate contact time for arrays 1 and 2 are: (a) 5 s, (b) 15 s, and (c) 30 s, and for arrays 3 and 4 are: (d) 0.5 s, (e) 1.5 s, and (f) 2.5 s respectively. The height of the dots varies between 10 and 45 nm, and the width varies between 2 um and 400 nm, as shown in the corresponding height profiles.

FIG. 30 shows topographic atomic force microscopy images of the resulting Au—Pt alloy dots (image B is the detail of the upper left corner of image A). In image (A), the tip substrate contact time for arrays 1 and 2 were (a) 5 seconds, (b) 15 s, and (c) 30 s. Arrays 3 and 4 dwell times were (d) 0.5 s, (e) 1.5 s, and (f) 2.5 s, respectively. The heights of the dots above the substrate varied between 10 and 45 nm, and their diameters varied between 2 μm and 400 nm.

After curing, the nanostructures were resistant to mild sonication, piranha solution (3:1 mixture of concentrated sulfuric acid and hydrogen peroxide) and Standard Clean 1 treatment (5:1:1 mixture of water, hydrogen peroxide, and ammonium hydroxide).

Figure 31:
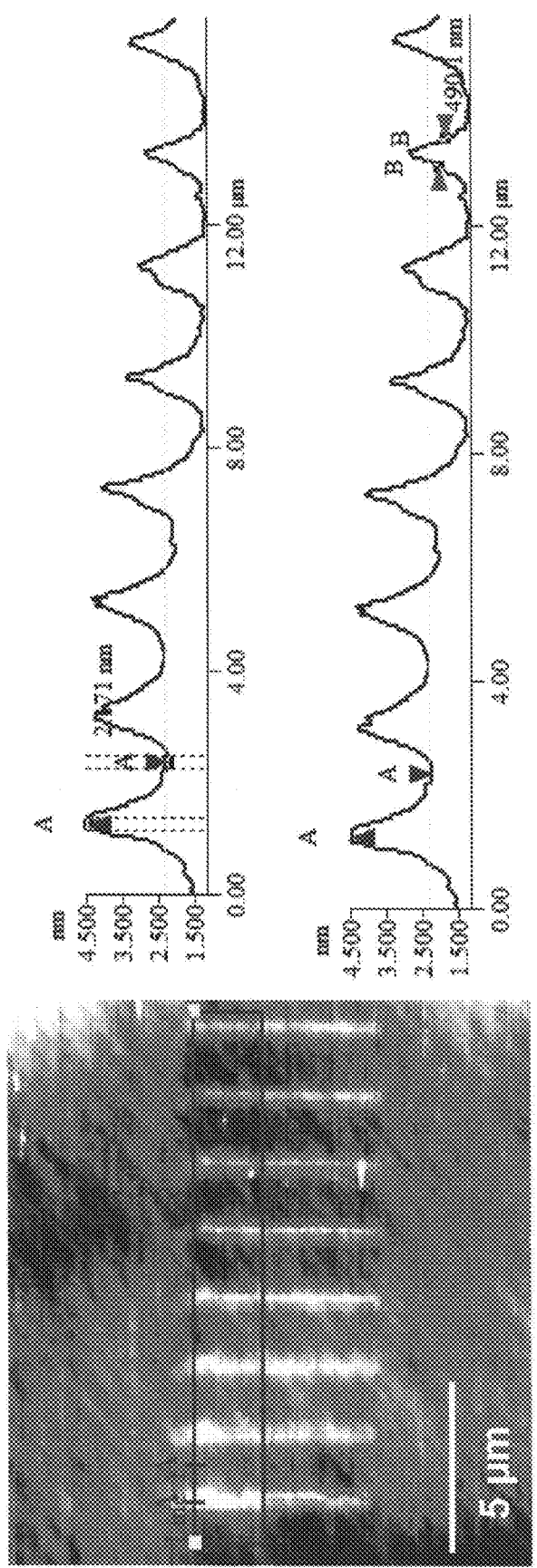
FIG. 31. AFM image of eight Au/Pt lines on quartz generated by DPN with PDMS stamp tip.

Not only are recipes based on metal complex and polyol quite general with regards of the composition (provided that the chosen redox couple has a high enough potential), but it is general with regards to the pattern shape that may be produced:

FIG. 31 shows the resulting eight Au/Pt alloy lines prepared in a second experiment with very similar experimental conditions. A 6 μL aliquot of 0.0077 g of $HAuCl_4.3H_2O$ and 0.0114 g of $H_2PtCl_6.6H_2O$ dissolved in 50 μL of DMF was mixed with 2 μL ethylene glycol (EG) and 0.0002 g of thiotic acid. A PDMS stamp tip was coated with this solution and eight lines were written at a tip speed of 0.005 μm/s on a quartz substrate. The structures were reduced by heating the substrate with a hot plate for 10 minutes. The average height and width of said Au/Pt lines were ca. 220 and 490 nm, respectively.

Figure 32:
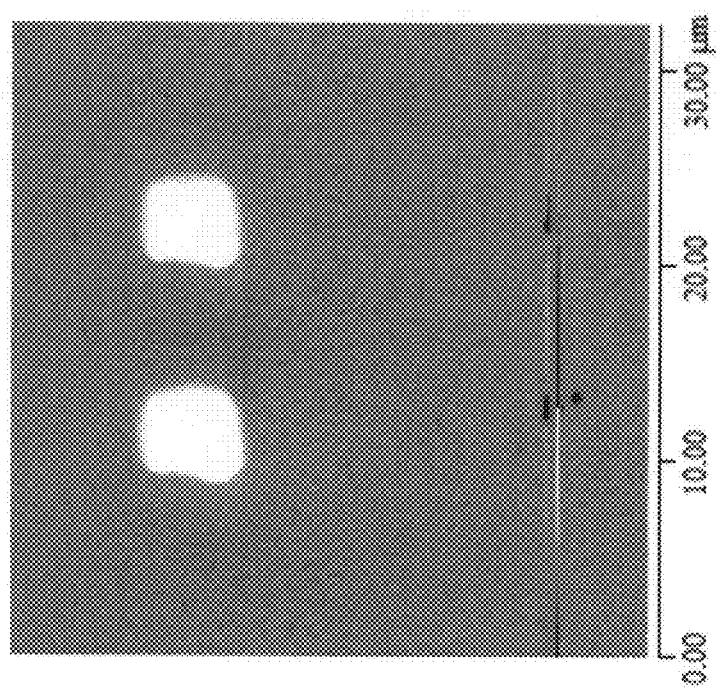
FIG. 32. Topographic AFM image of two 3.5 μm-wide and 30 nm-high square Au—Pt alloy patterns fabricated on quartz.

FIG. 32 shows the results of a third experiment, in which squares were patterned. To detail the exact experimental conditions, 7 μL of each of saturated solutions of hydrogen tetrachloroaurate (III) trihydrate and hydrogen hexachloroplatinate (IV) hexahydrate in DMF were mixed together. 2 μL of ethylene glycol and 1 μL solution containing 1 mg/mL of thiotic acid in DMF were added to the previous aliquot. The two squares a and b were fabricated by moving the tip in contact with the quartz substrate at a speed of 1 Hz. The ink was cured by performing a lower temperature curing at 120° C. for 30 min followed by a high temperature curing at 250-300° C. for 5 min. FIG. 32 reveals two 3.5 um wide and 30 nm high square Au—Pt alloy patterns.

Working Example 12

Fabrication of Ru—Pt Alloy Nanostructures

Figure 33:
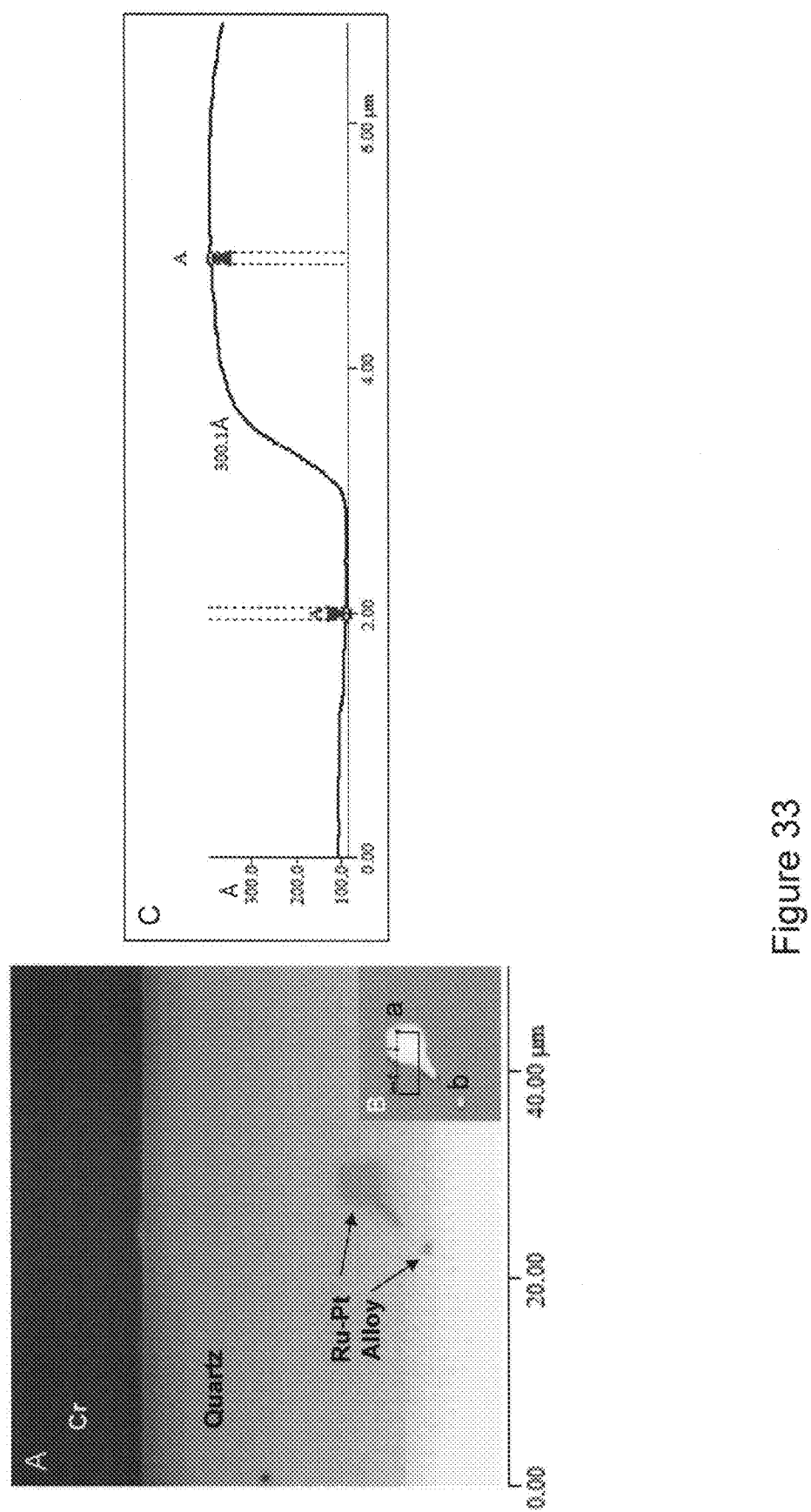
FIG. 33. LFM image (A) and topographic AFM image (B) of Ru—Pt alloy squares fabricated on quartz. Square shape (a) is 4.6 microns wide and 30 nm high, square (b) is 0.8 microns wide and 30 nm high; (C) Corresponding average line profile across the fabricated squares.

The following ink composition was used to fabricate Ruthenium-Platinum nanostructures: A saturated solution of ruthenium (III) chloride hydrate was prepared in dimethylformamide (DMF). Similarly a saturated solution of hydrogen hexachloroplatinate (IV) hexahydrate was prepared in DMF. 7 μL of each salt solution was mixed in a 1:1 volume ratio and added to 2 μL of ethylene glycol and 1 μL of a solution containing 1 mg/mL thiotic acid in DMF. A PDMS stamp tip was prepared, coated with said ink composition, and contacted with the quartz substrate of a chromium-on-quartz photomask. Two square deposits of Ru—Pt ink were fabricated by rastering the tip at a speed of 1 Hz. The ink was cured at 120° C. for 30 min and then at 250-300° C. for 5 min, as usual. Image (A) in FIG. 33 is a lateral force microscopy image of the resulting Ru—Pt alloy squares that were fabricated on a quartz substrate. Note that the unetched portions of the Cr layer (top of image A), the Ru—Pt patterns, and the quartz substrate have different friction coefficients with the tip. Insert (B) is a topographic (AFM) image of the resulting 4.6 μm-wide and 30 nm-high square (a), and 0.8 um-wide and 30 nm-high square (b). An averaged line profile across the fabricated squares is also shown, revealing a 30 nm average pattern height above the substrate.

Working Example 13

Fabrication of Multilayered Gold and Platinum-Doped Sol-Gel Nanopatterns

Figure 34:
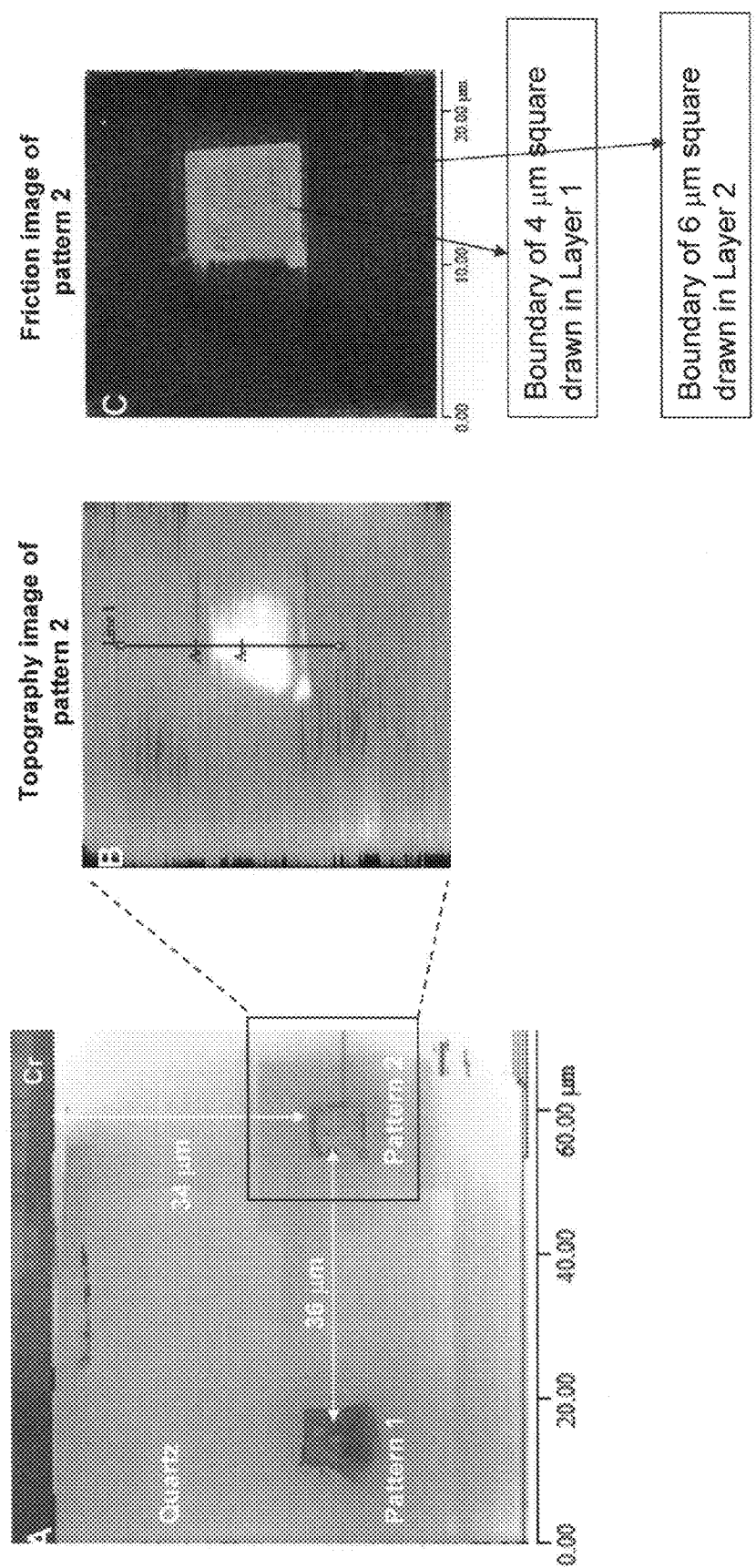
FIG. 34. Au—Pt alloy patterns fabricated on quartz. (A) LFM image of two square patterns fabricated on quartz. The first pattern comprises one layer; the second pattern is formed of two layers. (B) Topographic AFM image of pattern 2. Its total height after deposition of the second layer is 35 nm. (C) LFM image showing slightly different contrast between the two layers of pattern 2.

FIG. 34 shows two patterns nanopatterns fabricated on quartz (Image A, LFM image). The first pattern on the left is formed of one layer; the pattern on the right is formed of two layers. Image (B) is a topographic AFM image of pattern 2. The measured total height of this pattern above the substrate after the deposition of the second layer is 35 nm. (C) is a lateral force image of pattern 2 showing slightly different contrasts between the two deposited layers.

As in other examples, 7 µL each of saturated DMF solutions of hydrogen tetrachloroaurate (III) trihydrate and hydrogen hexachloroplatinate (IV) hexahydrate, respectively, were mixed together. However, 1 µL of a solution containing 1 mg/mL thiotic acid in DMF and 2 µL of neat MEOS (MethoxyEthoxyOrthoSilicate) were added to the solution.

A first layer of said Au/Pt-containing metal ink was first deposited on a quartz substrate with a DPN stamp tip and cured by performing dual-step curing at 120° C. for 30 min then at 250-300° C. for 5 min. to form a solid Au—Pt-rich sol-gel pattern on the substrate. After curing, the quartz substrate was inserted again in the patterning instrument (NSCRIPTOR from Nanoink, Inc.) and the alignment capabilities of this instrument were used to position the DPN stamp probe in registration with the initial pattern. Publication WO 03/083876 A2 to Eby et al. may be used to practice the invention and is hereby incorporated by reference in its entirety. A second layer of a Au—Pt containing layer was then formed and cured on top of the first layer.

A slightly different frictional contrast between layers was observed in LFM images of the pattern, suggesting that the first layer may undergo further densification during the second curing step.

Working Example 14

Alternative Ink Compositions

This example describes alternative ink compositions for the preparation of gold or gold-platinum nanostructures that comprise alkoxysilanes.

Ink composition #1—gold complex with aminopropyltrimethoxysilane A saturated solution of tetrachloroaurate (III) trihydrate was prepared in 2 mg/mL polyethylene glycol (10,000 molecular weight) in water. 1% by weight of 3-aminopropyltrimethoxysilane was added to the gold salt solution.

Ink composition #2—gold complex with (3-mercaptopropyl) trimethoxysilane A saturated solution of tetrachloroaurate (III) trihydrate was prepared in 2 mg/mL polyethylene glycol (MW 10 k) in water. To that solution, 1% by weight of (3-mercaptopropyl)trimethoxysilane was added.

Ink composition #3—Au/Pt alloy with 3-aminopropyl-trimethoxysilane A saturated solution of hydrogen tetrachloroaurate (III) trihydrate was prepared in 2 mg/mL polyethylene glycol (MW 10 k) in water. Similarly a saturated solution of hydrogen hexachloroplatinate (IV) hexahydrate was prepared in 2 mg/mL polyethylene glycol (MW 10 k) in water. 2 µL of each salt solution were mixed with 1% by weight of 3-aminopropyl-trimethoxysilane.

Ink composition #4—Au/Pt alloy with (3-mercaptopropyl) trimethoxysilane Saturated solutions of hydrogen tetrachloroaurate (III) trihydrate and hydrogen hexachloroplatinate (IV) hexahydrate were prepared in 2 mg/mL 10 k polyethylene glycol. Equal volumes of these salt solutions were mixed with 1% of (3-mercaptopropyl)-trimethoxysilane. Partial precipitation during ink formulation was observed; the supernatant was collected and used as the DPN ink.

All inks in this section were heat cured in conditions similar to the previous working examples. These inks demonstrated improved adhesion characteristics compared to inks not containing silane binding agents.

IX. ADDITIONAL EMBODIMENTS

Applications of DPN Stamp Tips for Repair Including Photomask Repair, Enhancement and Fabrication Working Example 15

Filling of a Simulated Pinhole Defect with a Gold Nanoparticle-Based Ink

In the next example, a series of small holes were prepared by focused ion beam in the top chromium layer of a test photomask. Said holes with a diameter of 0.4 µm simulate small pinhole defects that may be naturally observed on photomasks.

Figure 35:
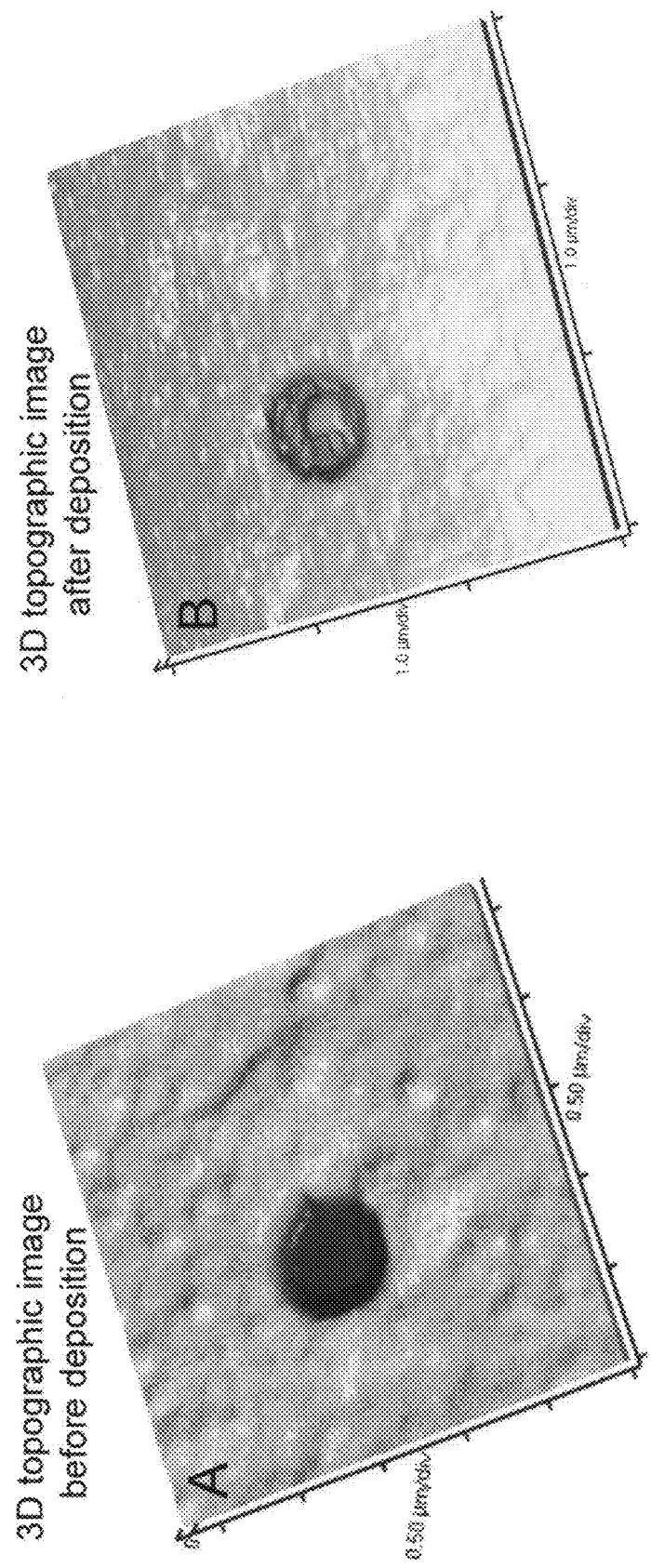
FIG. 35. 3D topographic image of a simulated photomask defect (A) before fabrication and (B) after deposition of a small gold island in the middle of the hole.
Figure 36:
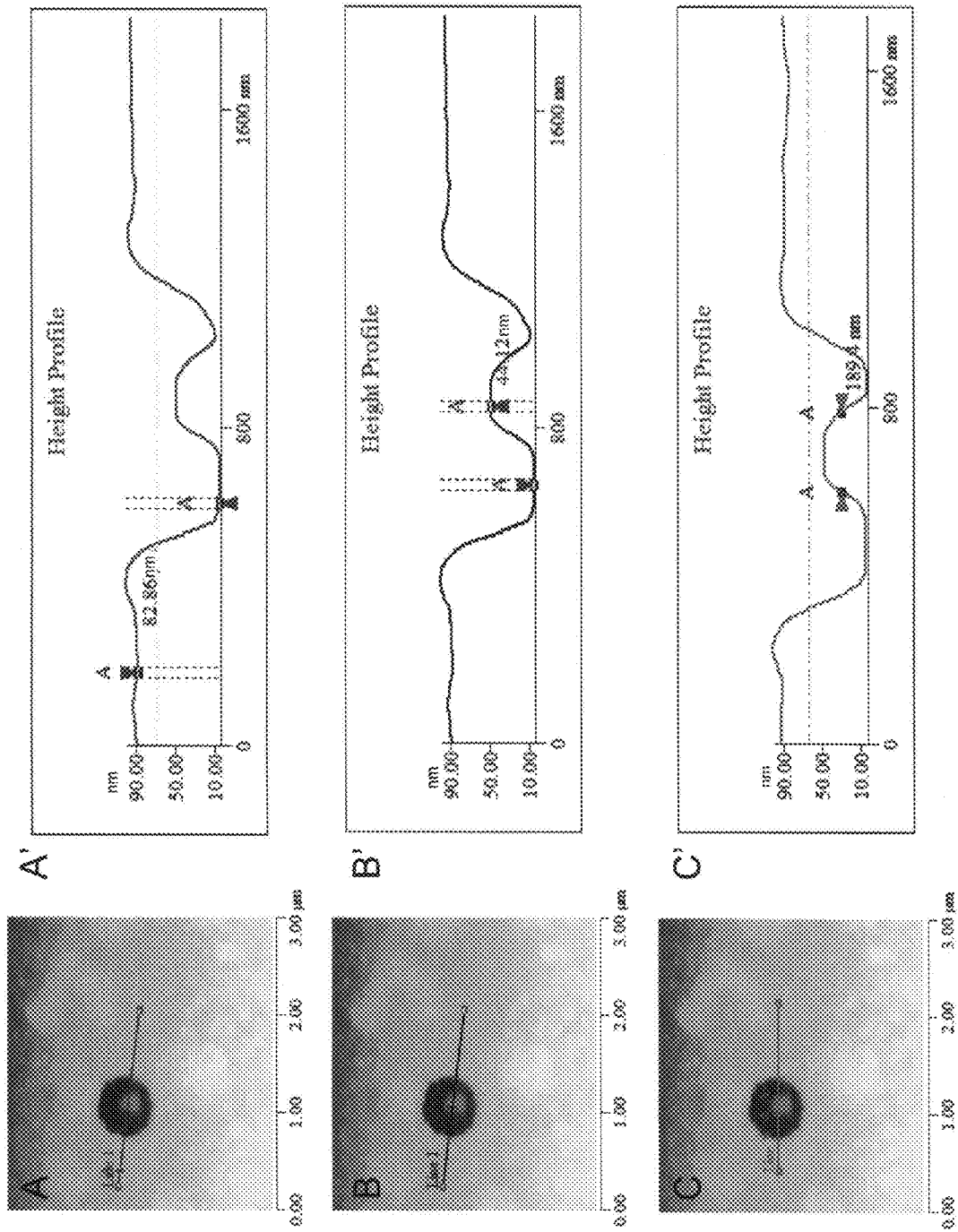
FIG. 36. 2D AFM images (A, B, C) and corresponding height profiles (A', B', C') of the filled simulated photomask defect of FIG. 35.

FIG. 35 shows 3D topographic image of a simulated photomask defect before fabrication (A) and after deposition (B) of a patch. A small gold island was fabricated in the middle of the hole. Its width is about 190 nm and its height is about 44 nm, according to height profiles in FIG. 36. The mask was cleaned with 'piranha' solution at 120° C. prior to fabrication. The AFM topographic scan that is shown was acquired after two-step curing at 250-300° C. for 5 min and 120° C. for 30 min.

The gold nanoparticle ink used in this example was prepared by mixing 1 mg of dried hexanethiol-capped gold nanoparticles to 3 µL of a solution prepared by mixing 6 µL of thiotic acid dissolved in mesitylene (1 mg/mL), 2 µL of decanol, 2 µL of polyethylene glycol (5%) dissolved in mesitylene, and 1.5 µL of neat octadecyltrichlorosilane (OTS).

Working Example 16

Filling of Simulated Pinhole Defects with a Metallic Salt-Based Ink

Figure 37:
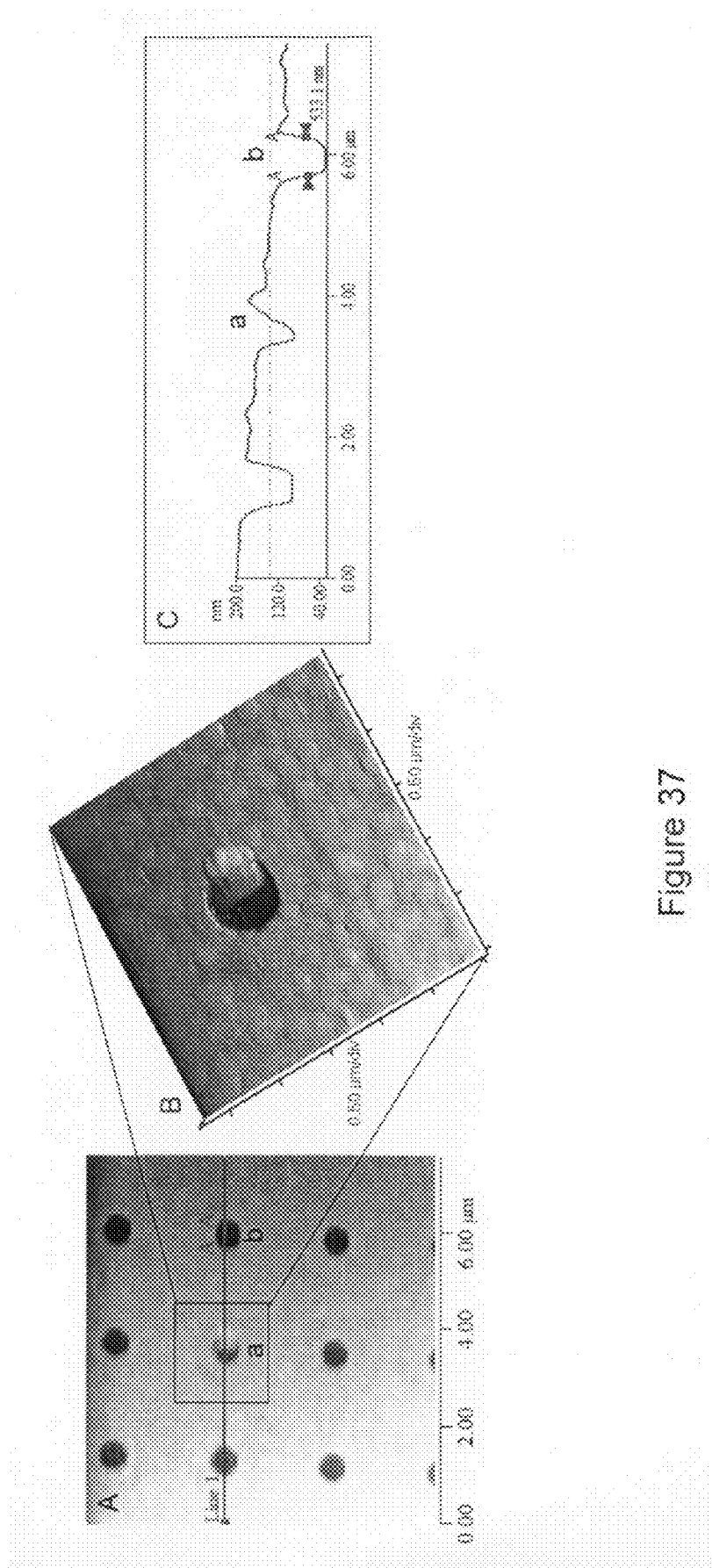
FIG. 37. 2D topographic image (A) of eight empty simulated pinhole defects and one defect (partially) filled with a gold/platinum alloy by DPN deposition of a metallic complex mixture with a PDMS stamp tip and two-step curing; (B) Detailed 3D view of the filled middle defect in (A); (C) Cursor profile across the filled and unfilled defect. AFM images were acquired after two-step thermal curing.
Figure 38:
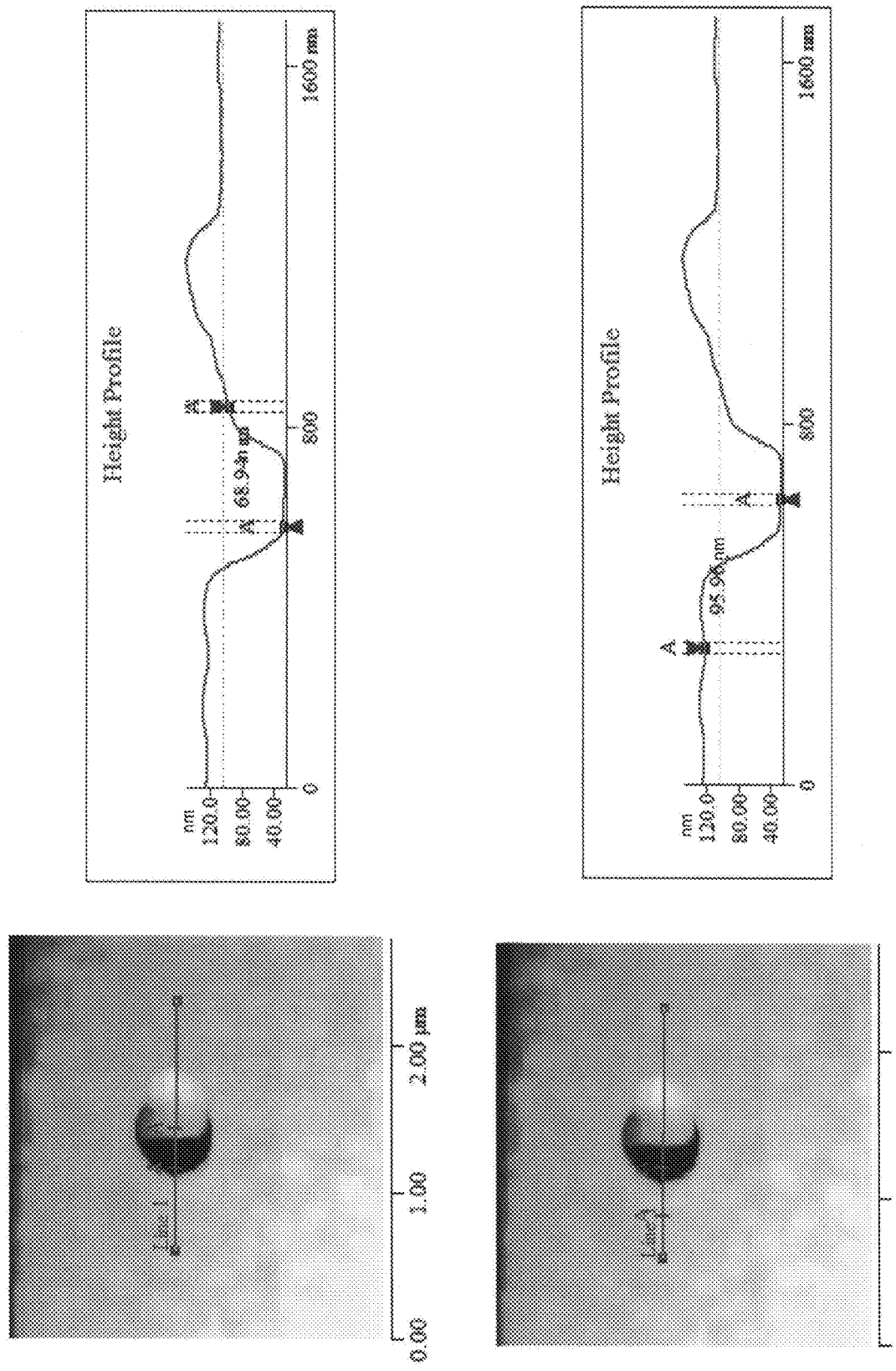
FIG. 38. AFM image and height measurements of the pinhole defect filling of FIG. 37.

The following example illustrates the repair of simulated pinhole defects in a test photomask using the polyol process. FIG. 37A is a topographic image of an array of 9 simulated defect holes. The middle defect was filled with an ink prepared according to the recipe in example 11, with the exception of a change of solvent: DMF was replaced by mesitylene $(C_6H_3(CH_3)_3)$. The repair patch was then thermally cured following the usual two-step method. Image B is a 3D zoomed-in view of the middle defect in image A, showing that the repair patch almost entirely fill the defect. FIG. 38 includes height profiles across the repaired area. The nanostructure deposited in the middle holes was found resistant to mild sonication, exposure to piranha solution (3:1 mixture of concentrated sulfuric acid and hydrogen peroxide) and SC1 treatment (5:1:1 mixture of water, hydrogen peroxide, and ammonium hydroxide.

Working Example 17

Figure 39:
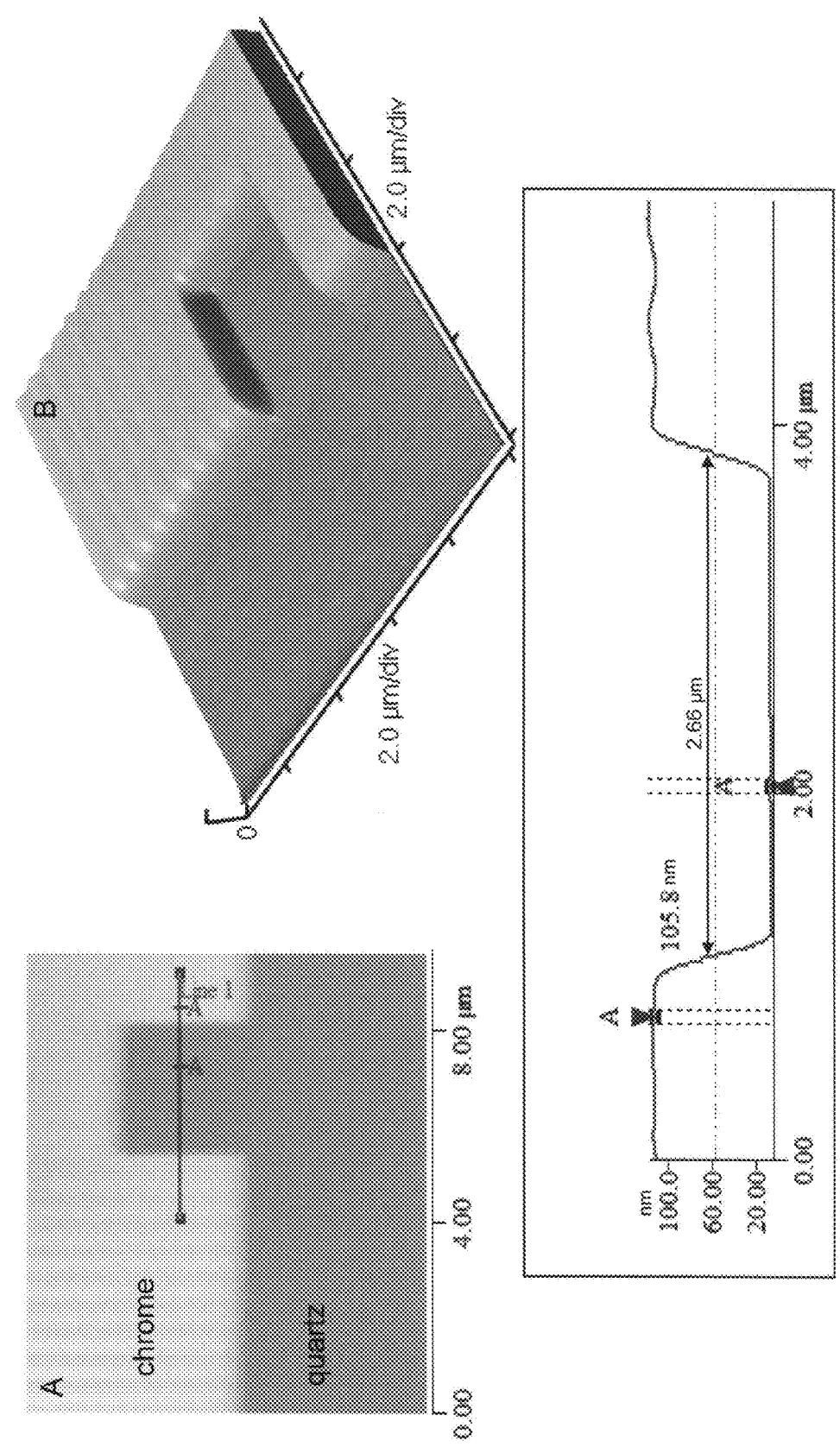
FIG. 39. Topographic AFM image of a simulated edge photomask defect. (A) 2D topographic AFM image of a 3×3 um² notch in the quartz substrate. The chromium layer is 100 nm high; and (B) 3D topographic image.

Filling of a Simulated Edge Defect with a Gold Nanoparticle-Based And Metallic Salt-Based Inks A test photomask was used that comprised simulated edge defects, i.e. notches at the edge of the chromium layer. These defects range from 3 µm to 20 µm in dimension. FIG. 39 shows the smallest test edge defect. This example and the next demonstrate repair of these edge defects in three experiments: (1) patterning of a standalone feature of the same dimension than the smallest test defect within a larger notch, in order to initially avoid issues with buttressing and alignment within the 100 nm-deep recess formed by the notch sidewalls; (2) filling of the 3×3 µm² defect with a gold nanoparticle ink; and (3) filling of the 3×3 µm² defect with a Au/Pt alloy.

Figure 40:
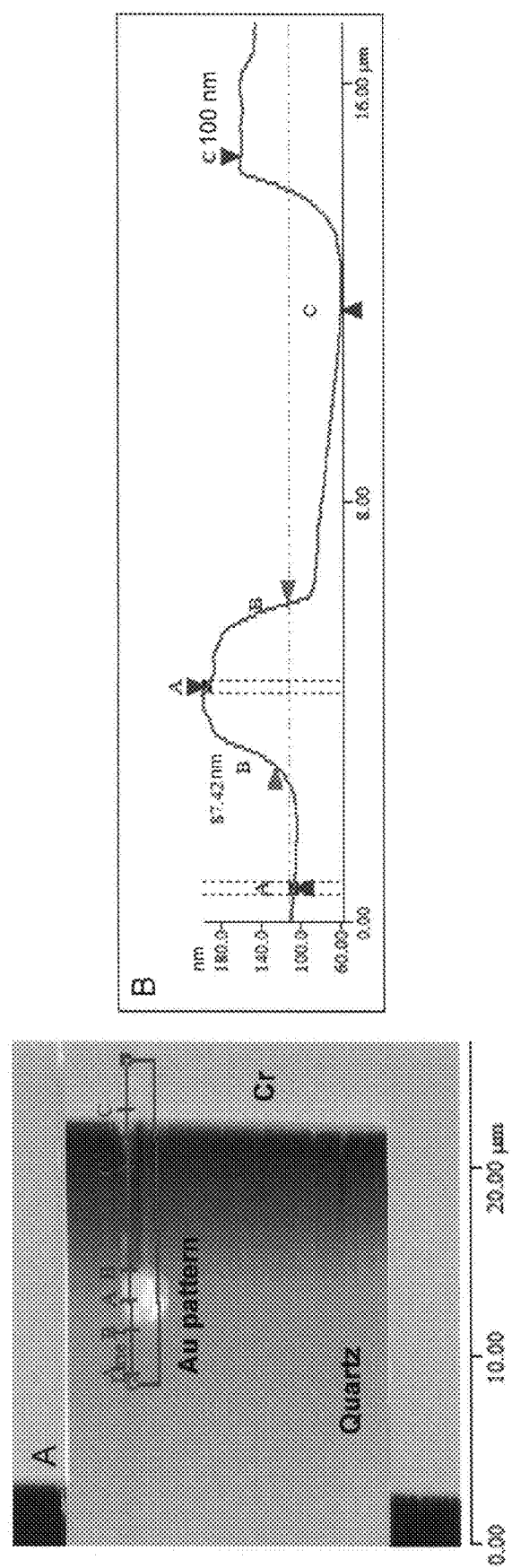
FIG. 40. 2D topographic image of a small gold deposit within a 20×20 micron² simulated edge photomask defect. (A) A 3 micron² pattern was fabricated within the defect area. (B) Corresponding cursor profile comparing the height of the fabricated pattern and the chromium layer.

In a first experiment, a small 3×3 µm square was patterned within a larger quartz feature, in this case a 20×20 µm² notch in the chromium layer (FIG. 40). The height of the fabricated structure is 87 nm, which is 13 nm smaller then the chrome. The gold nanoparticles ink used was prepared according to example 7 by mixing 1 mg of hexanethiol-capped gold nanoparticles, to 2 µL of a solution prepared by mixing 6 µL of 1 mg/mL of thiotic acid in mesitylene, 2 µL of decanol, 2 µL of polyethylene glycol (MW 0.22 k) dissolved in mesitylene and 1.5 µL of octadecyltrichlorosilane.

Figure 41:
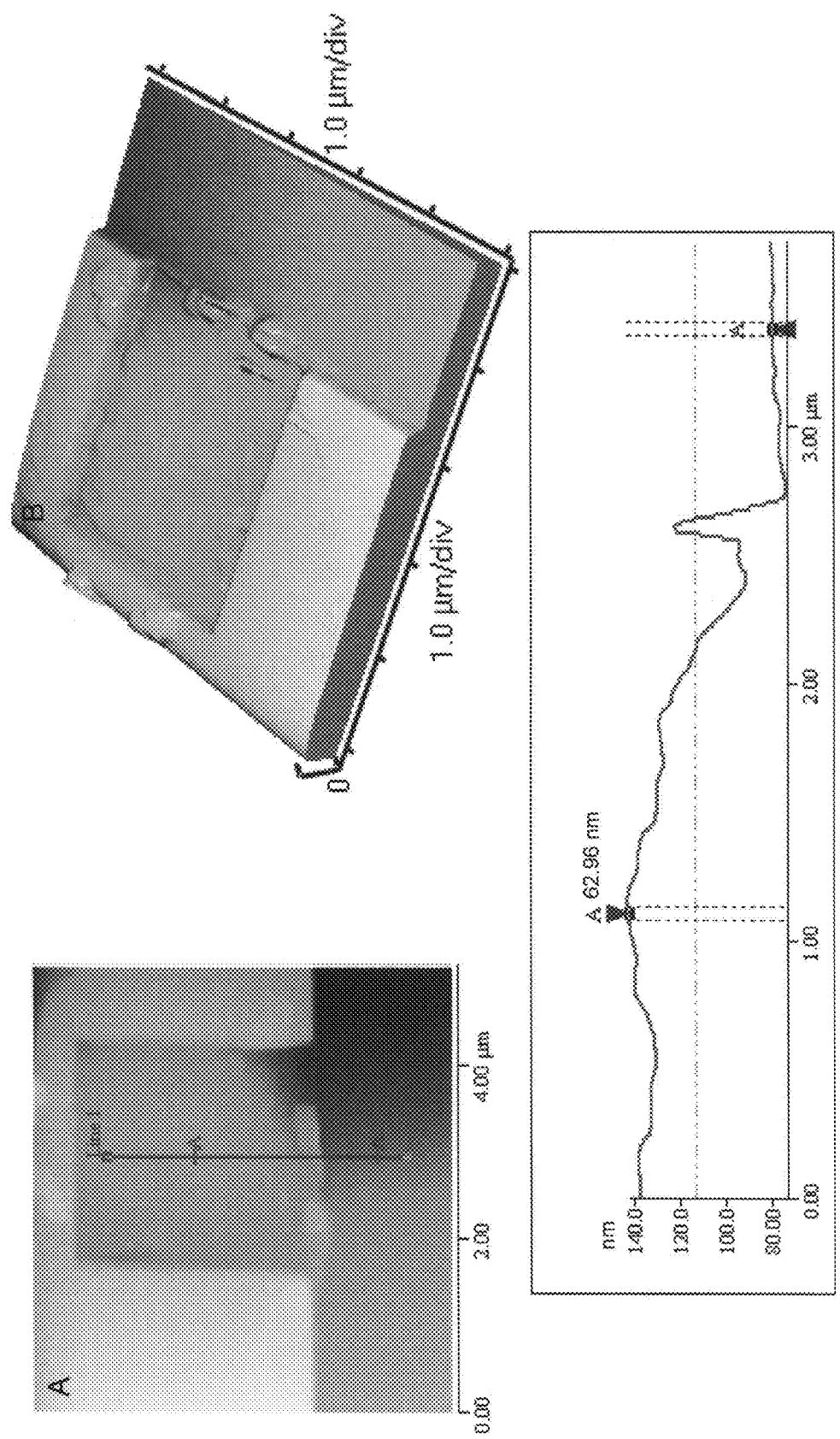
FIG. 41. Topographic AFM image (A) and 3D view (B) of a simulated edge photomask defect after filling with a gold nanoparticle ink with a DPN stamp tip and heat curing. (C) Height profile across the filled area.
Figure 42:
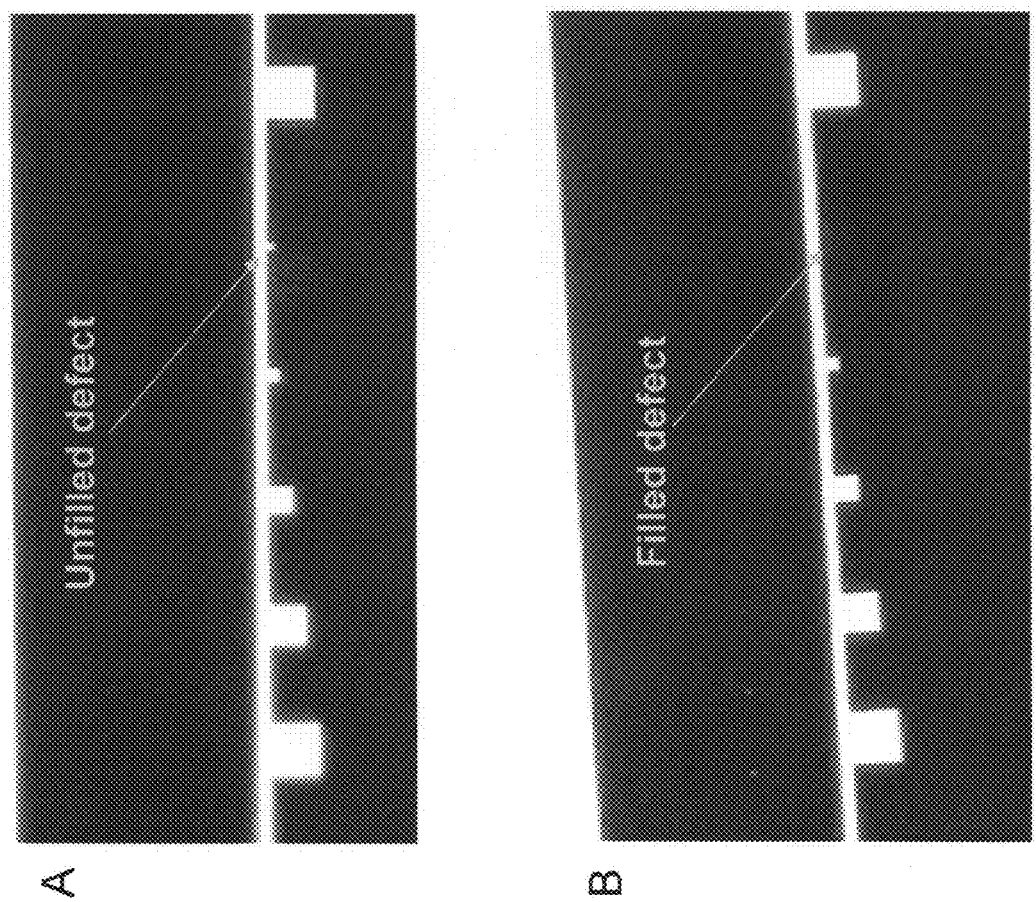
FIG. 42. Optical image of a portion of a photomask before (A) and after (B) repair of a simulated defect with a gold nanoparticle ink.

In a second experiment, a 3×3 µm² square defect (the smallest available) was filed with a gold nanoparticle ink using a DPN stamp tip. FIG. 41 shows an AFM topographic image of the result. Note that no significant flow of ink outside of the simulated edge defect region is observed. FIG. 42 shows optical images of a portion of said binary chromium-on-quartz photomask before and after repair of the simulated defect. The photomask is observed in transmission; hence the chromium film is present in dark (opaque) areas and has been etched in lit areas. The smallest defect (second from the right), after being filled with said gold nanoparticle ink, appears opaque in visible light. Tests using actinic or deep UV irradiation (for example using an AIMS tool) further demonstrated total opacity of the nanoparticle-ink nanostructures at the wavelength of lithographic exposure.

Figure 43:
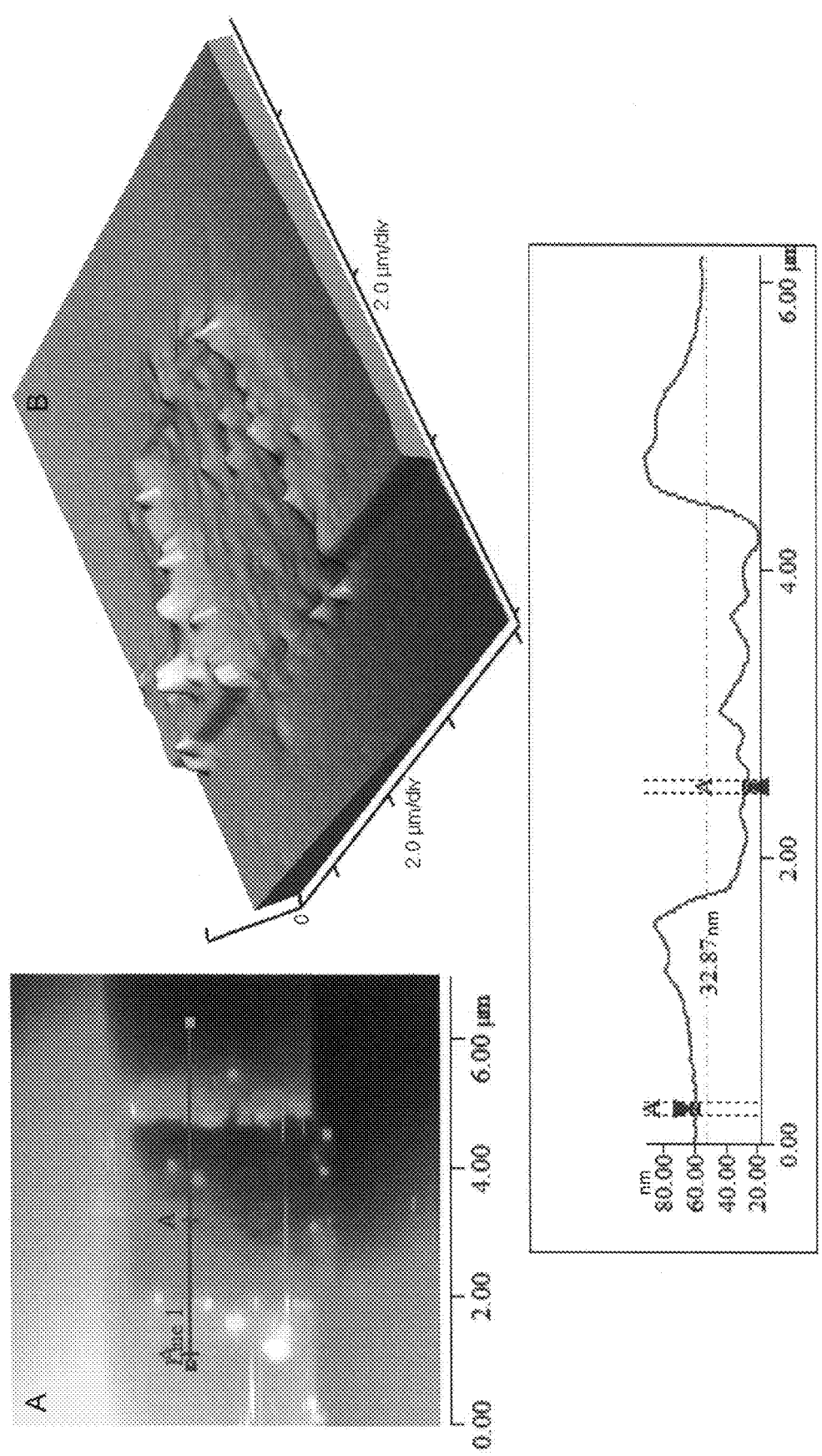
FIG. 43. Topographic AFM image (A) and 3D image (B) of a simulated edge photomask defect filled with a Au/Pt-rich alloy with the help of a DPN stamp tip.

FIG. 43 illustrates a third experiment, the successful repair of the 3×3 um² simulated edge defect (initially identical to that of FIG. 39) within the test photomask using the metallic salt/polyol protocol described in part VIII (without use of ethylene glycol).

All AFM topographic scans shown were acquired after a two step curing at 250-300° C. for 7 min then at 120° C. for 60 min.

X. ADDITIONAL EMBODIMENTS

Enhanced Fabrication of Polymer-Coated Tips for Direct-Write Nanolithography

Hereinabove is described a process, which can be done manually, for fabricating DPN stamp tip—by simply dipping a commercial cantilever with integrated $Si_3N_4$ tip (available, for example, from NanoInk, Chicago, Ill.) into a droplet of polymer precursor solution and curing the precursor by heat or light irradiation treatment. Variants include dipping into a polymer melt followed by cooling; or dipping in the solution of a polymer in a volatile solvent, followed by drying. Chemical transformation of the polymer precursor is not a requirement. While these methods are convenient for the fabrication of small lots for R&D use, there is a commercial need for methods capable of better producing polymer-coated tips—and eventually mass-produce them.

In a first embodiment for this section, the invention provides an improvement on dipping the tip into a droplet of polymer precursor with the use of a microfabricated inkwell. Inkwells are described in the International Patent Application WO 04044552 to Cruchon-Dupeyrat et al, which is hereby incorporated by reference in its entirety. Inkwell are microfluidic circuits that combine reservoirs, in which a fluid may be deposited e.g. with a pipette; microwells adapted to serve as dipping wells for the tip(s) of microfabricated cantilevers and cantilever arrays; and a network of microchannels connecting them. Inkwells were originally designed to deliver inks to probes but may be used to deliver the polymeric precursor of the invention to the tip for coating purposes as well. Advantages include (i) controlled delivery of polymer precursor to the tip; (ii) limited dispersion of polymeric precursor onto the cantilever holding the tip; and (iii) possible fabrication of tips coated with different polymers or coating materials.

In a second embodiment for this section, the invention provides an automated method for the commercial production of stamp tips, the method comprising:
  providing an AFM or other instrument capable of controlling the movement of at least one microfabricated tip, such as a commercial AFM tip,
  providing a polymer precursor source, for example a filled microfabricated inkwell,
  coating the tip with a polymer or polymer precursor, such as a PDMS precursor mixture, under semi-automatic or automatic control of the AFM instrument,
  curing said polymer or precursor either in-situ, i.e. within the instrument, or ex-situ, e.g. following removal of the at least one tip from the instrument.

The advantages of this embodiment include:
  unattended or partially unattended fabrication of stamp tips,
  fabrication of tips coated with different polymers (from tip to tip in a tip array or on the same tip), if multiple sources of polymers are available (i.e. in different inkwells),
  higher throughput than may be obtained by manual dipping;

Working Example 18

Automated Delivery Method Using the NSCRIPTOR Instrument and Inkwells

Figure 44:
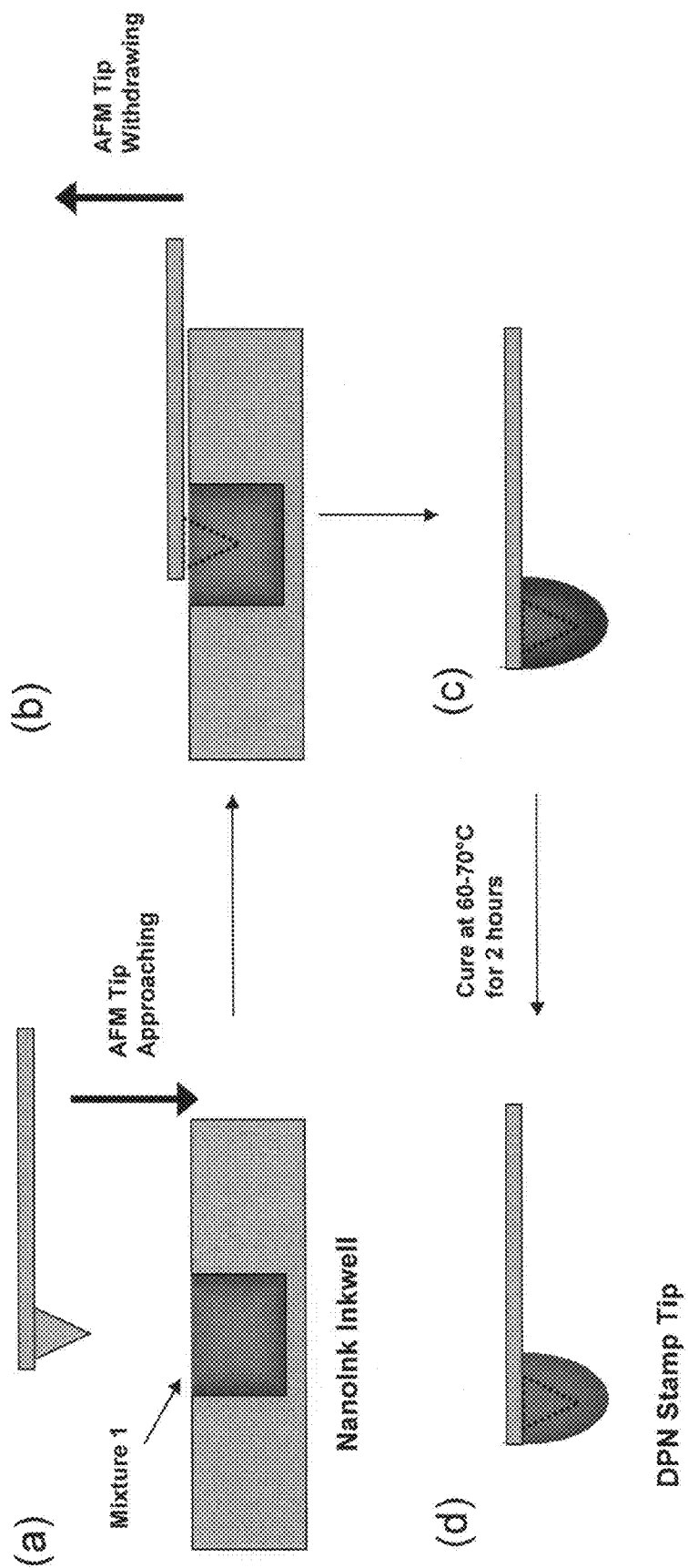
FIG. 44. Schematic diagram illustrating a process for fabricating a DPN stamp tip by (a, b) dipping a bare tip into a microfabricated "inkwell" containing a polymer precursor; and (c, d) heat curing said precursor in an oven.

FIG. 44 illustrates schematically a method of fabricating polymer-coated tips by dipping bare microfabricated tips into microfabricated "inkwells" filled with a polymeric precursor (such as a PDMS precursor mixture). Inkwells are custom microfluidic circuits adapted to storing and delivering fluid to micron-scale tips.

In step a, the inkwells were filled with a polymer precursor through a reservoir using a pipet and were placed onto the sample holder of the NSCRIPTOR™ (NanoInk, Inc., Chicago, Ill.). A commercial $Si_3N_4$ probe (NanoInk, Inc.) was aligned to the inkwell and contacted with the polymer precursor mixture 1. In step b, after a given dwell time, the tip was withdrawn from contact with mixture 1 and the precursor-coated tip transferred to an oven at 60° C. for 2 hours (step c) until the precursor has polymerized and forms a ink-ready sheath on the tip. FIG. 45 shows optical microscopy images that illustrate this process of fabricating a PDMS-coated DPN stamp tip using inkwells. Image A is taken just before alignment of the probe to a precursor-filled microwell. The microfluidic channels that distribute are clearly visible. Image B shows the tip in contact with the polymeric precursor. Note the change of color of the cantilever, which indicates that it is bent, and evidence of a meniscus between the well and the tip.

Figure 46:
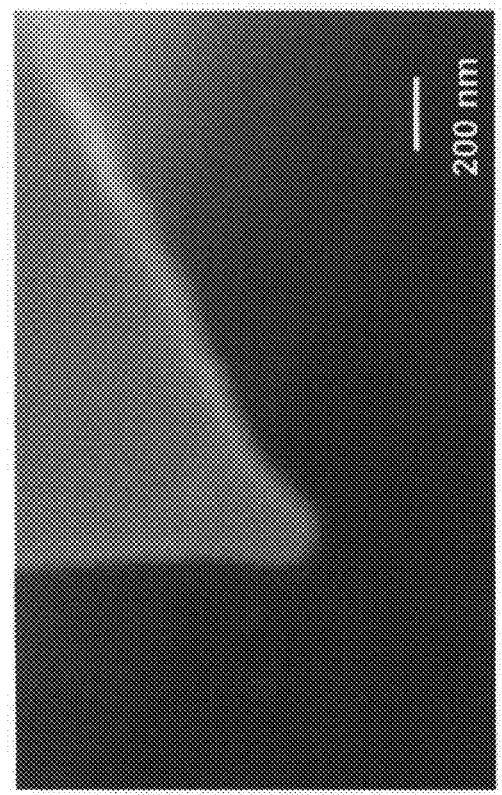
FIG. 46. Typical scanning electron microscopy (SEM) image of the apex of a PDMS-coated DPN stamp tip.

The controlled retraction of the AFM cantilever dipped in a PDMS precursor solution in a microwell of an inkwell chip can generate a sharp polydimethylsiloxane (PDMS) tip rather than a dull blob, as may be the case when prepared manually. A typical SEM image of the fabricated PDMS-coated DPN stamp tip (FIG. 46) shows that the tip radius is about 80 nm. The tip apex radius is somewhat larger than that of a commercial microcast $SiN_x$ probe, because of the PDMS overcoat, but is still very reasonable. The fabricated DPN stamp tip was tested by imaging a gold substrate. Imaging of a gold substrate showed signs of tip convolution indicating that the tip of the PDMS-coated probe, used for AFM imaging and also during DPN printing, corresponds to the observed apex of the coated PDMS tip.

Working Example 19

Comparison of Bare and PDMS-Coated DPN Tips

In a first experiment, a PDMS-coated silicon nitride tip and a "bare" silicon nitride tip (without any polymer coating) were coated with mercaptohexadecanoic acid (MHA) using exactly the same method (dipping into an MHA-acetonitrile solution followed by blowing with a stream of nitrogen to remove excess solvent). Both tips were then used for gold patterning to verify that they were correctly prepared. The MHA-coated PDMS tip was then left in contact with the substrate for 24 hours while scanning repeatedly the same area. After 24 h of continuous use, the MHA-coated PDMS DPN stamp tip still had MHA "ink" and could generate nanopatterns. In contrast, the MHA-coated bare tip can only write for several hours (normally 2-3 to 5-6 hours) after coating.

Figure 47:
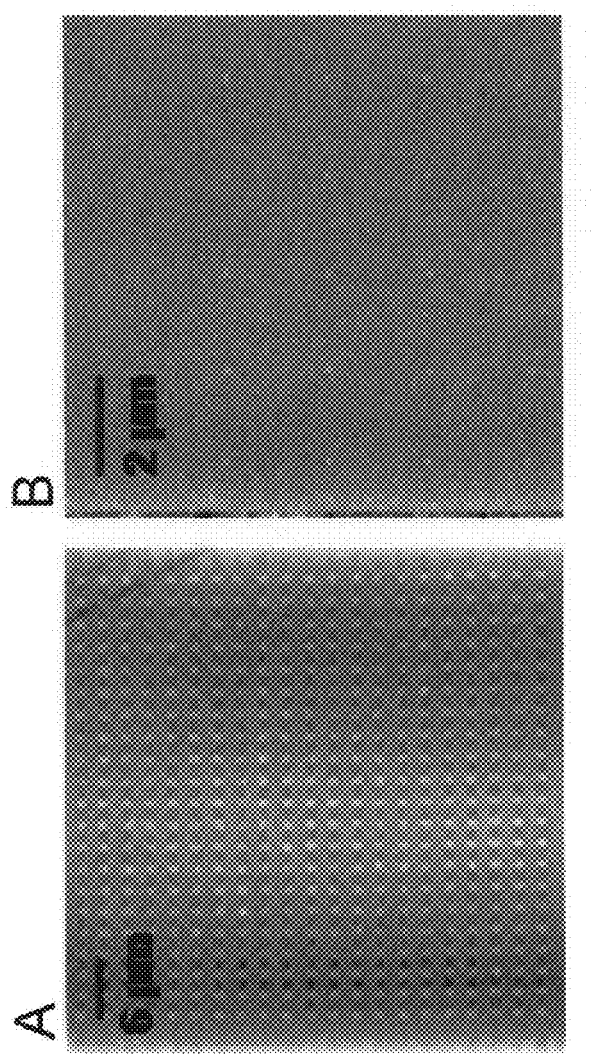
FIG. 47. Comparison of the ink retention and patterning abilities of PDMS-coated and bare silicon nitride tips. Images A and B are topographic maps of arrays of mercaptohexadecanoic acid dots on gold generated with a MHA-coated DPN stamp tip and a MHA-coated polymer-free $Si_3N_4$ tip, respectively.

In a second experiment, two dot arrays (40×40 μm with a 2 μm pitch between dots) were generated on gold with an MHA-dipped PDMS-coated tip (dried for 1-2 hours to completely evaporate the adsorbed solvent) and a MHA-dipped $Si_3N_4$ tip, respectively, in otherwise identical experimental conditions. The tip holding time was 1 second. Then a clean uncoated silicon nitride tip was used to image the generated patterns, as shown in FIG. 47. Images A and B are topographic maps of dot arrays generated with a MHA-coated DPN stamp tip (left) and MHA-coated $Si_3N_4$ tip (right), respectively. The MHA coverage (ratio of the MHA pattern area to total area) was 12.56% in the left image and 0.28% on the right image, respectively.

These results are evidence that (1) polymer-coated tips have a longer usable lifetime than bare tips, and (2) the rate of diffusion of ink to the substrate is higher with polymer-coated tips than it is with bare tips. In turn, that points out that the polymer-coated "stamp" tip can adsorb and transfer much more "ink" than a bare tip.

What is claimed is:

1. A method of direct-write nanolithography comprising:
    transporting an ink from a polymer-coated nanoscopic tip to a substrate to form a structure on the substrate, wherein the ink comprises solvent and the structure comprises internal hollows from direct transfer of the solvent to the substrate, wherein polymer adheres to the tip and is not transported to the substrate, and wherein the polymer is a hydrophobic elastomeric polymer having a glass transition temperature of about 25° C. or less.

2. The method according to claim 1, wherein the tip is a scanning microscopic tip.

3. The method according to claim 1, wherein the tip is a scanning probe microscopic tip, and wherein the tip is part of a probe with a reflective backing.

4. The method of claim 1, wherein the tip is an atomic force microscope tip.

5. The method of claim 1, wherein the polymer is a siloxane polymer.

6. The method of claim 1, wherein the polymer increases loading of the ink on the tip.

7. The method according to claim 1, wherein the ink chemisorbs to the substrate.

8. The method according to claim 1, wherein the ink comprises at least one metal.

9. The method according to claim 1, wherein the ink comprises at least one metal precursor.

10. The method according to claim 1, wherein the ink comprises nanoparticles.

11. The method of claim 1, wherein the ink comprises a biomolecule.

12. The method of claim 11, wherein the ink comprises a peptide.

13. The method of claim 11, wherein the ink comprises a protein.

14. The method of claim 11, wherein the ink comprises a nucleic acid.

15. A method of improving direct-write nanolithographic printing of ink from a nanoscopic tip to form a structure having internal hollows on a substrate, wherein the method comprises a step of modifying the nanoscopic tip with a polymeric agent, wherein the polymeric agent is a hydrophobic elastomeric polymer having a glass transition temperature of about 25° C. or less, and wherein the polymeric agent adheres to the tip and is not printed to the substrate.

16. The method of claim 15, wherein the tip is a scanning probe microscopic tip.

17. The method of claim 15, wherein the tip is part of a probe with a reflective backing.

18. The method of claim 15, wherein the tip is an atomic force microscopic tip.

19. The method of claim 15, wherein the tip is an atomic force microscope tip, wherein the tip is a non-hollow tip, and wherein the polymeric agent is a siloxane polymer.

20. The method of claim 15, wherein the polymeric agent increases loading of the ink on the tip.

21. The method of claim 15, wherein the tip is a scanning microscope tip, wherein the polymeric agent is hydrophobic elastomer which coats the tip, and wherein the polymeric agent increases loading of the ink on the tip.

22. The method of claim 15, wherein the polymeric agent increases porosity of the tip or enhances surface area of the tip.

23. A method of transferring material to a substrate to form a structure, comprising:
    providing a substrate;
    providing an elastomeric-coated nanoscopic tip having a material to be transferred to the substrate coated thereon and having a reflective layer arranged on a back side of the tip; wherein the elastomeric tip comprises a crosslinked elastomeric polymer having a glass transition temperature of about 25° C. or less;
    bringing the elastomeric tip into sufficient proximity to the substrate to transfer the material from the tip to the substrate;
    transferring material to the substrate to form the structure, wherein the structure comprises internal hollows, wherein the crosslinked elastomeric polymer is not transferred to the substrate.

* * * * *